United States Patent
Tadayon et al.

(10) Patent No.: US 8,450,603 B2
(45) Date of Patent: May 28, 2013

(54) SOLAR CELL CONCENTRATOR

(75) Inventors: Saied Tadayon, Potomac, MD (US);
Peyman Sana, Frisco, TX (US)

(73) Assignee: BTPatent LLC, Potomac, MD (US)

( * ) Notice: Subject to any disclaimer, the term of this patent is extended or adjusted under 35 U.S.C. 154(b) by 304 days.

(21) Appl. No.: 12/856,690

(22) Filed: Aug. 16, 2010

(65) Prior Publication Data

US 2012/0037205 A1    Feb. 16, 2012

(51) Int. Cl.
*H01L 31/00*    (2006.01)
*H01L 31/042*   (2006.01)

(52) U.S. Cl.
USPC ........... 136/259; 136/246; 136/251; 126/573; 126/646; 126/652; 126/680

(58) Field of Classification Search
USPC .................. 136/259, 246; 126/573, 646, 652, 126/680
See application file for complete search history.

(56) References Cited

U.S. PATENT DOCUMENTS

| | | | | |
|---|---|---|---|---|
| 6,087,579 A | * | 7/2000 | Muskatevc | 136/251 |
| 6,958,868 B1 | * | 10/2005 | Pender | 359/742 |
| 7,572,973 B2 | * | 8/2009 | Weaver et al. | 136/201 |
| 2003/0075167 A1 | * | 4/2003 | Minano Dominguez et al. | 126/680 |
| 2008/0047605 A1 | * | 2/2008 | Benitez et al. | 136/259 |
| 2008/0135087 A1 | * | 6/2008 | Anikara | 136/246 |
| 2008/0271784 A1 | * | 11/2008 | Duston et al. | 136/259 |
| 2009/0044861 A1 | * | 2/2009 | Debije et al. | 136/259 |
| 2009/0250094 A1 | * | 10/2009 | Robison et al. | 136/246 |
| 2009/0283134 A1 | * | 11/2009 | Hines | 136/246 |
| 2009/0314329 A1 | * | 12/2009 | Saha | 136/246 |
| 2010/0018570 A1 | * | 1/2010 | Cashion et al. | 136/246 |
| 2010/0139749 A1 | * | 6/2010 | Mapel | 136/255 |
| 2010/0206379 A1 | * | 8/2010 | Littau et al. | 136/259 |
| 2010/0263723 A1 | * | 10/2010 | Allen et al. | 136/259 |
| 2011/0226299 A1 | * | 9/2011 | Makansi | 136/203 |

* cited by examiner

*Primary Examiner* — Jonathan Johnson
*Assistant Examiner* — Bethany Lambright
(74) *Attorney, Agent, or Firm* — Bijan Tadayon; Saied Tadayon

(57) ABSTRACT

In this presentation, we have shown new methods, devices, and systems, to concentrate the light for the solar cells, using refractive index variations, light funnels, liquid crystals, and other methods and materials. We have shown various methods for enhancing the solar cell efficiency. We have given many variations for each application.

18 Claims, 47 Drawing Sheets

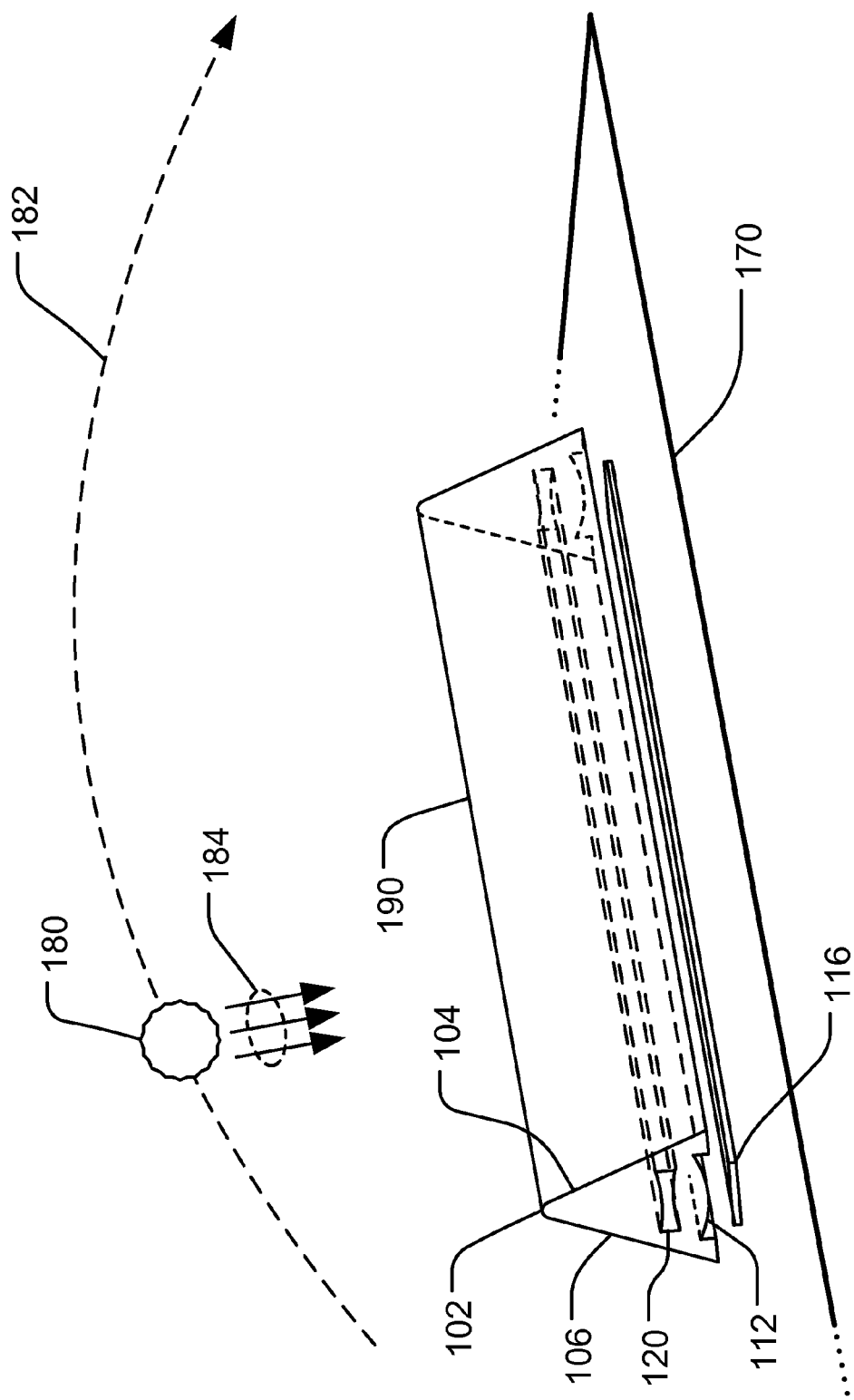

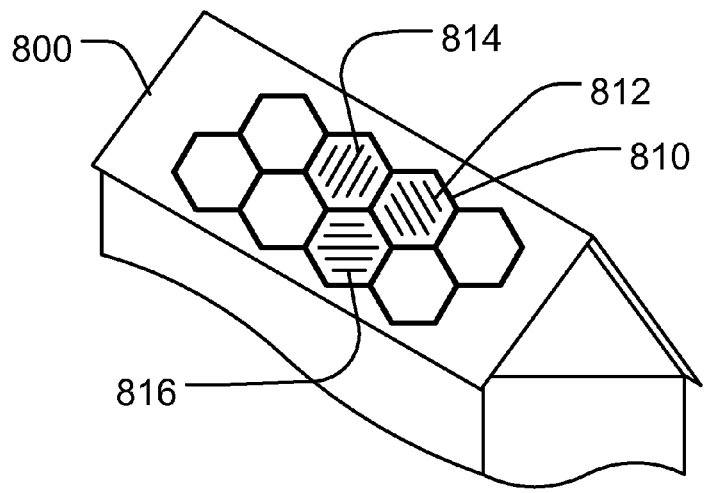
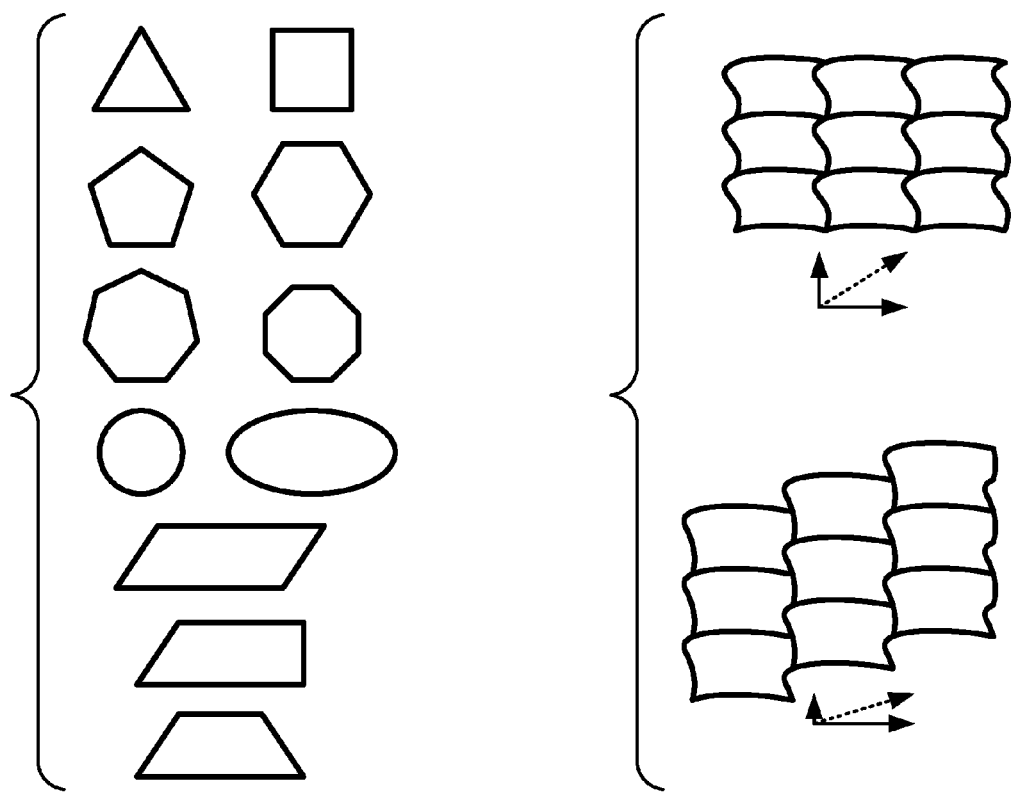
FIG 8(a)
FIG 8(b)
FIG 8(c)

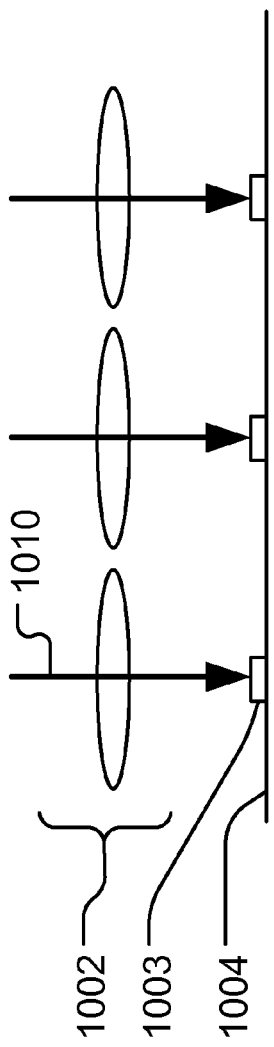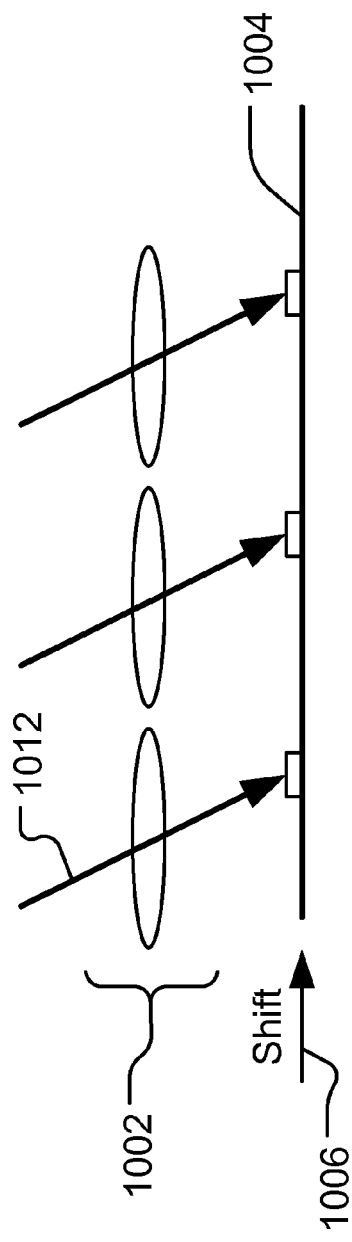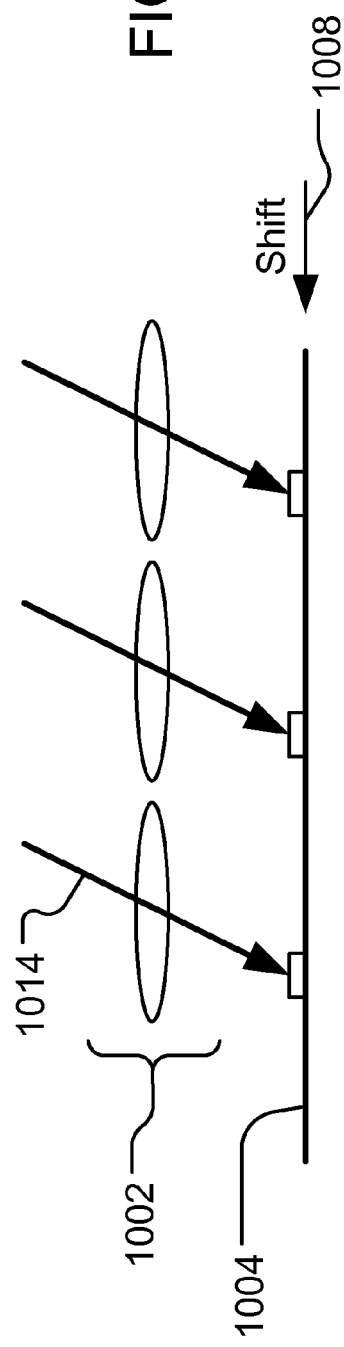

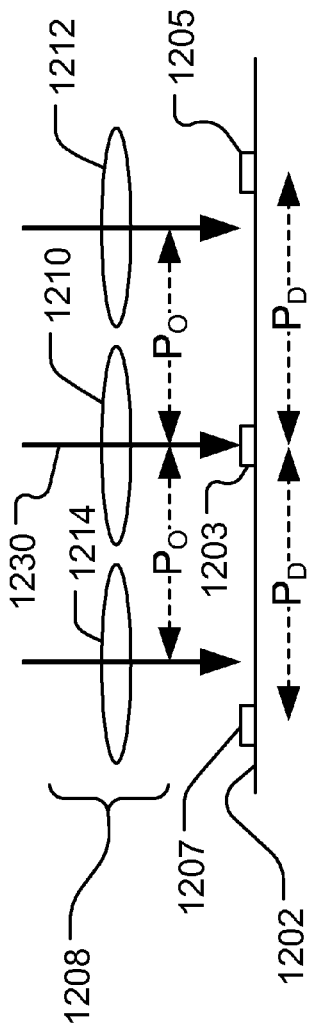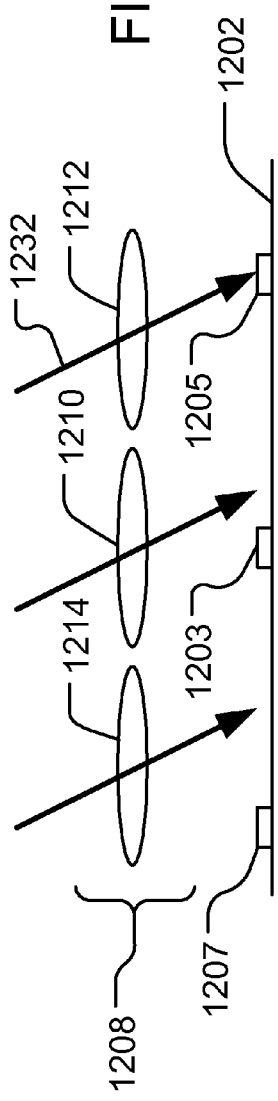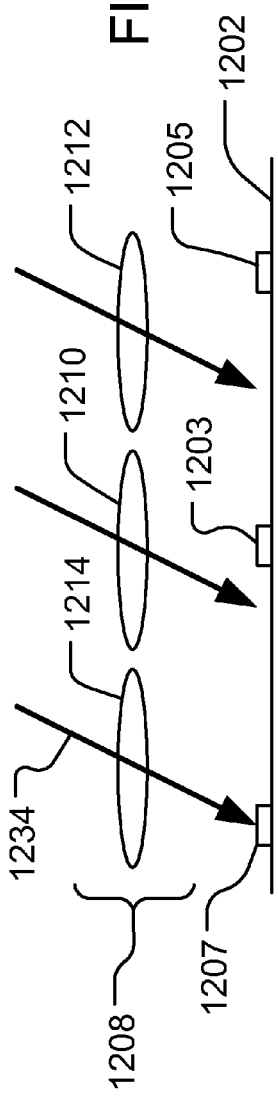

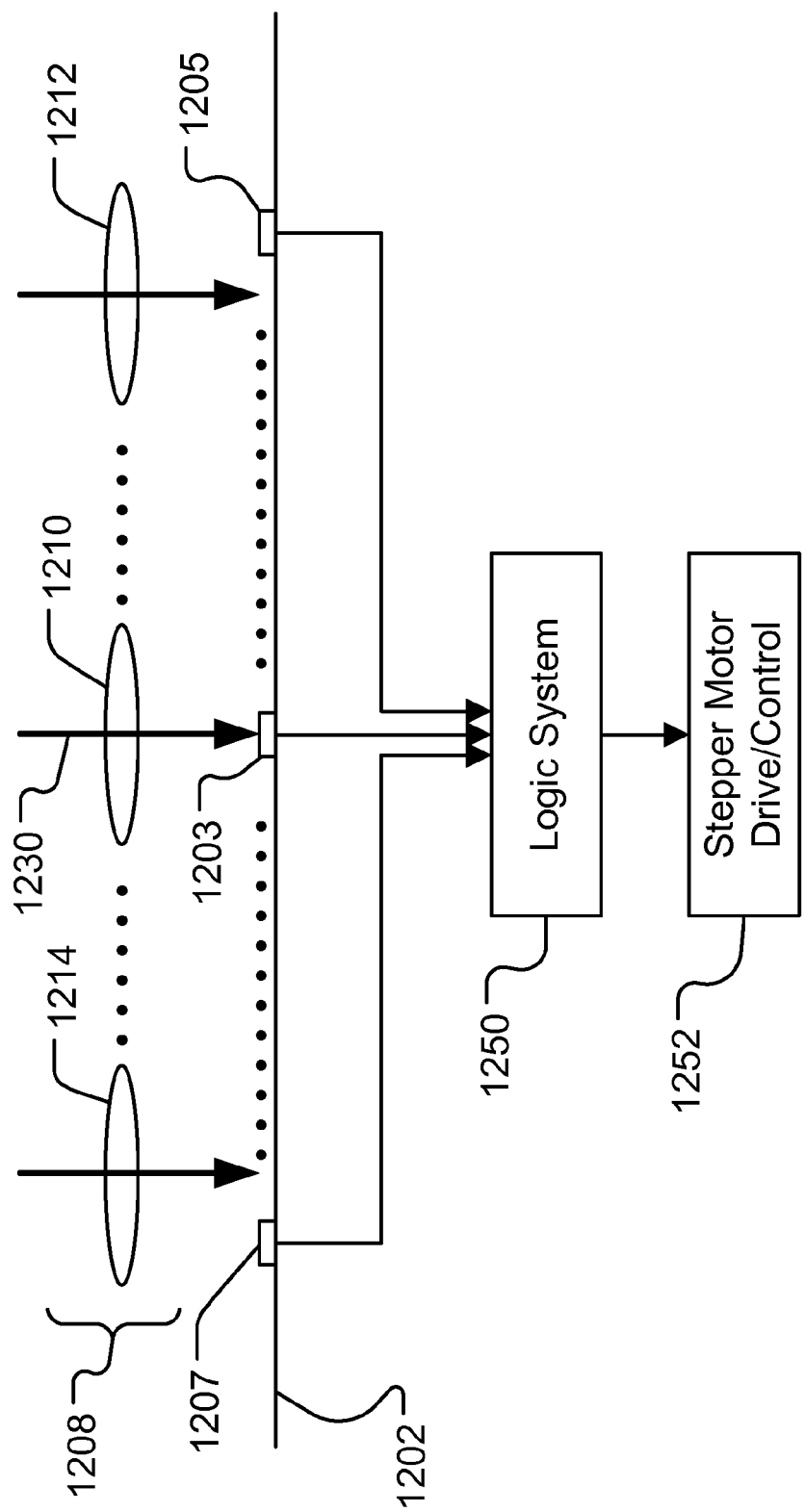

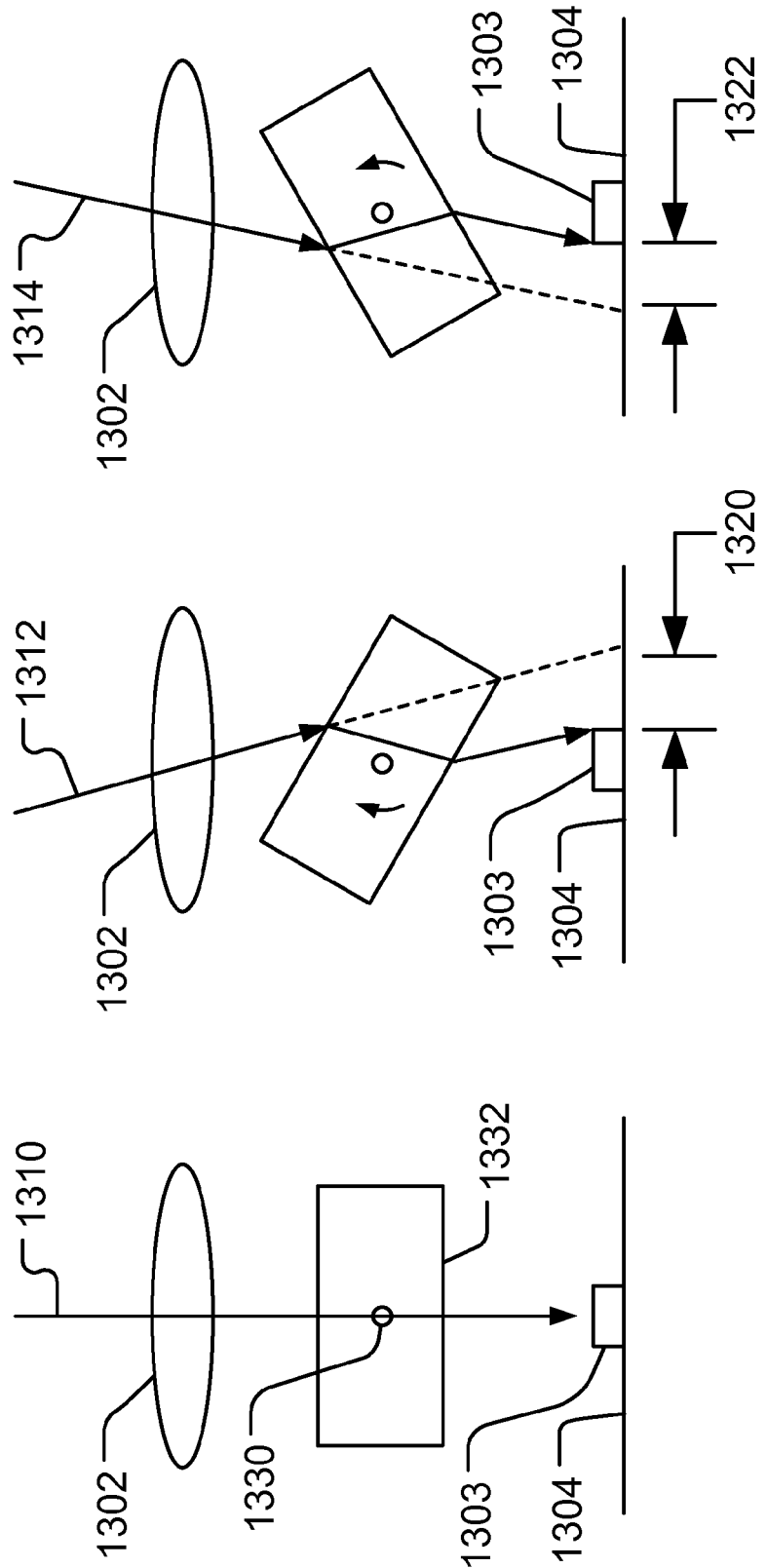

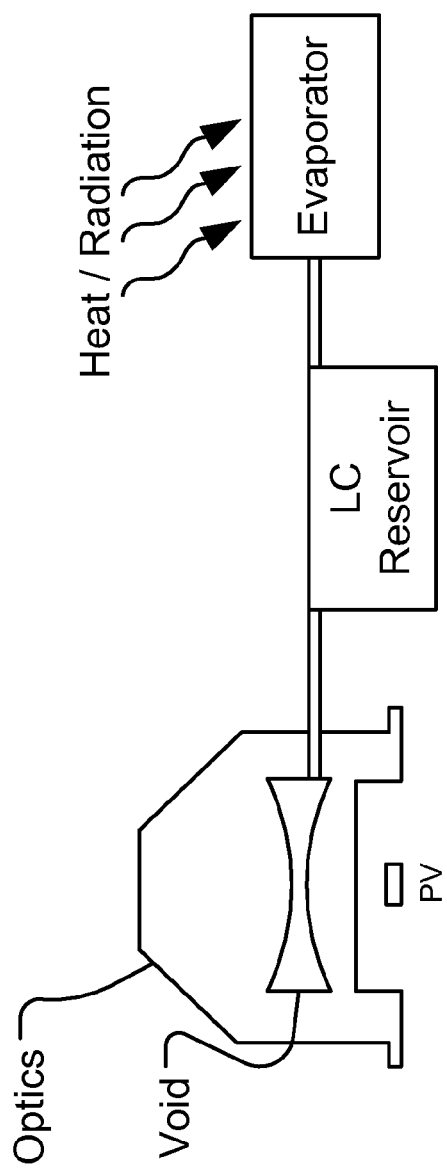
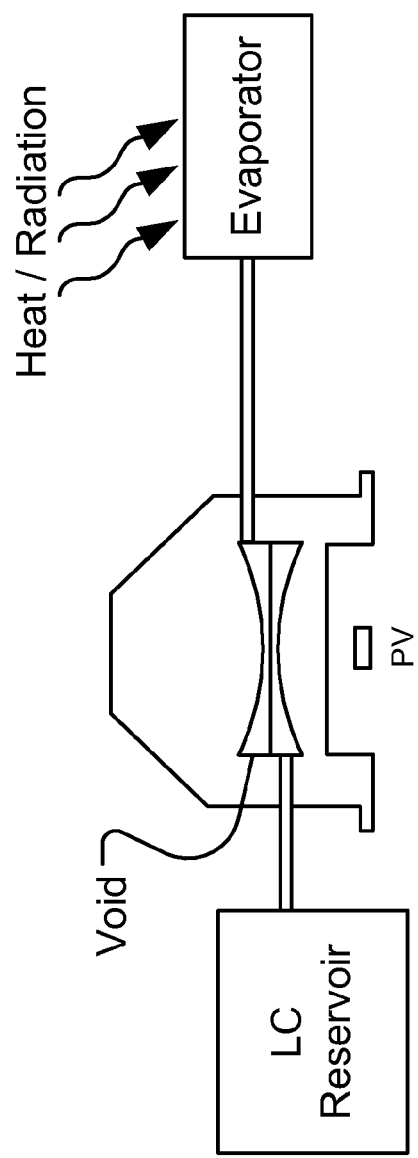
FIG 30(a)
FIG 30(b)

SOLAR CELL CONCENTRATOR

BACKGROUND

Some of the prior art are: U.S. Pat. Nos. 4,892,593, 4,723,535, 4,461,278, 5,255,666, 5,505,789, 5,977,478, 6,124,980, 7,664,350, 4,799,748, 4,332,974, 7,563,725 (Solyndra Corp), 7,373,041, 7,239,463, 7,299,632, appl. 20080223443, U.S. Pat. No. 6,525,264, King et al (titled "Bandgap engineering in high-efficiency multijunction concentrator cells", by Spectrolab Inc. and NREL, at International Conf. on Solar Concentrators, 1-5 May 2005, Scottsdale, Ariz.).

In this disclosure, we have taught new methods and devices and systems to concentrate the rays for the solar cells.

SUMMARY

In this disclosure, we have taught new methods and devices and systems to concentrate the light for the solar cells, using refractive index variations, light funnels, liquid crystals, and other materials. We have shown various methods for enhancing the solar cell efficiency. We have optimized various parameters for energy conversion.

BRIEF DESCRIPTION OF THE DRAWINGS

FIG. 8 *a-c* shows patterns or shapes of frames or PV planes.
FIG. 10*a-c* shows movement compensation and analysis.
FIG. 12*a-e* shows movement examination and compensation.
FIG. 13*a-c* shows transmission through slab.
FIG. 30 shows LC reservoir setup.

DETAILED DESCRIPTION OF THE EMBODIMENTS

Figure 32A:
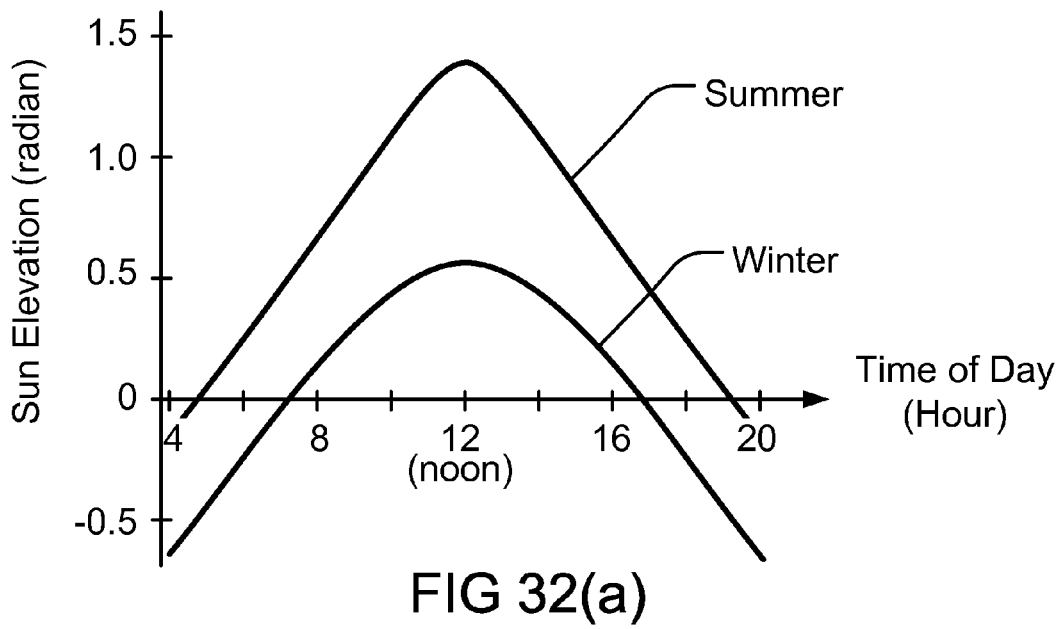
FIGS. 32 (*a*) and (*b*) show a general figure of the position of the Sun during the day, and for different seasons, in the sky.
FIG. 32*c* shows the change in elevation of Sun (in Arizona) during the day.
Figure 32B:
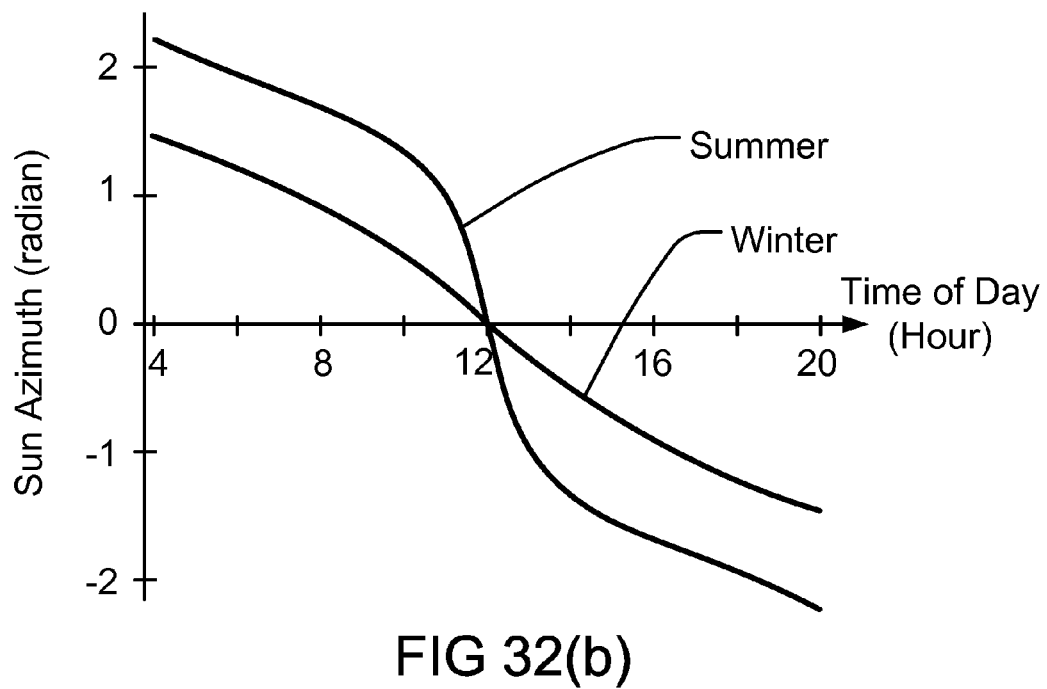

The FIGS. 32 (*a*) and (*b*) show a general figure of the position of the Sun during the day, and for different seasons, in the sky. This is a typical (approximate) curve, as an example, for Sun's elevation and azimuth for latitude of 34 degrees, of Arizona, USA.

Figure 32C:
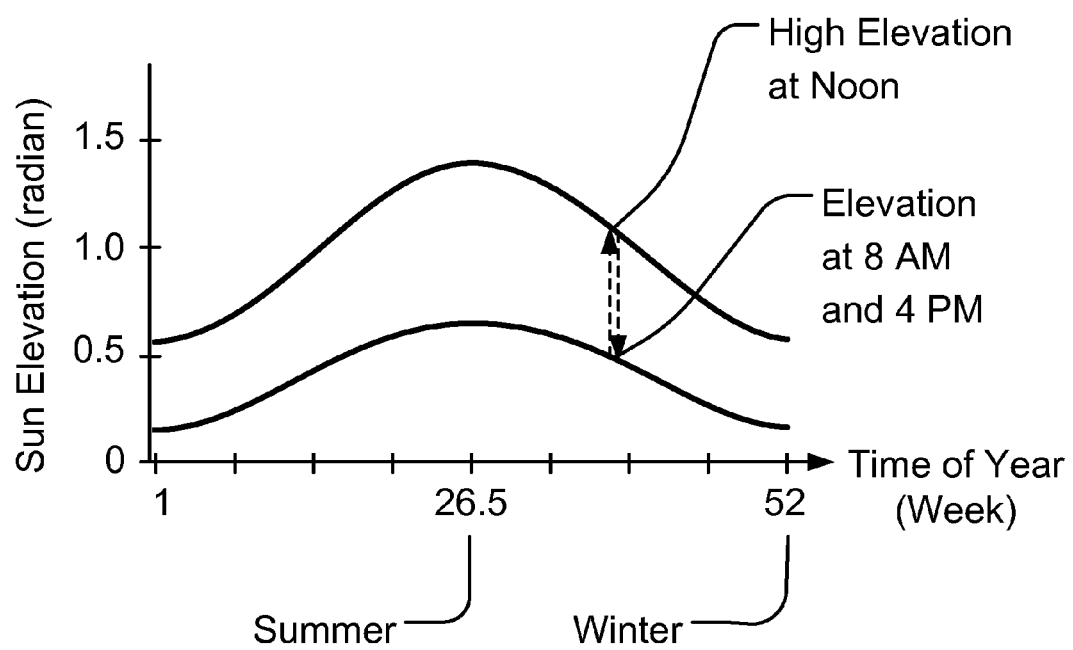

FIG. 32*c* shows the change in elevation of Sun (in Arizona) during the day from plus or minus 4 hours around noon time (in radian). The x-axis represents each week in the year. Each vertical bar shows the change in elevation of Sun from 8 AM to 4 PM. The lowest point of each bar represents the early morning, as well as the late afternoon positions, while the high point of the bar represents the noon elevation of the Sun. As shown, during the Summer, the noon position is the highest, but the variation in elevation during that day is also the largest. Also, the mid of each bar varies during the year, hence, the weekly/monthly/seasonal adjustments.

Figure 33:
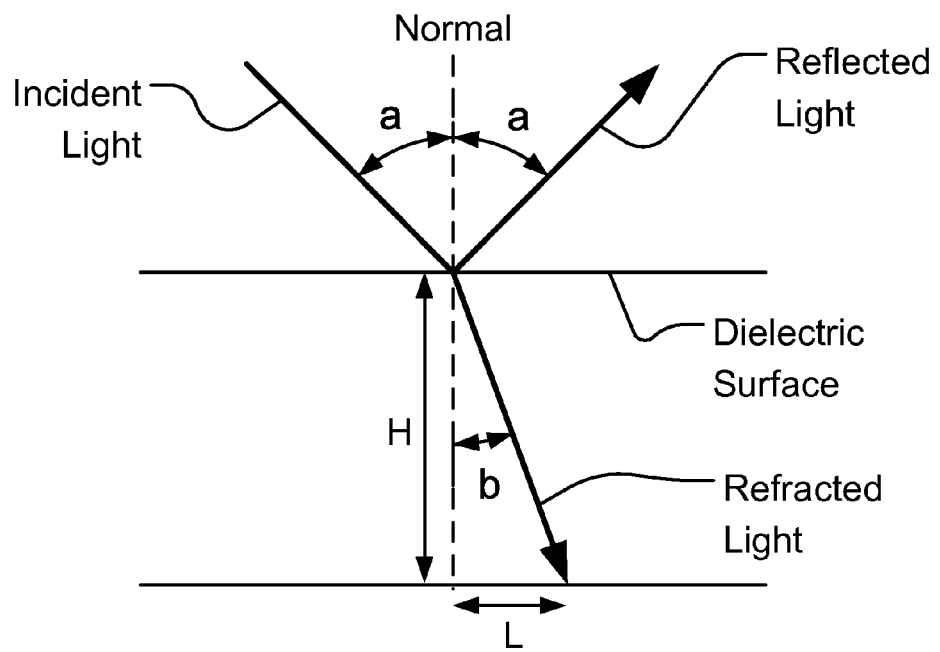
FIG. 33 shows general relationship between incident light and refracted light.

For a lot of materials (liquid, gas, solid, or gel material, for example), when temperature changes, n (index of refraction) changes, as a function of temperature (e.g. 0.06 percent per degree C., for a Liquid Crystal). For some, the change in n, called (D(n)), or delta (n), is relatively very large. Thus, in one embodiment, using those material, as the temperature changes, the light is refracted at a different angle, covering different parts of the solar panels or PV cells/devices/rows of devices, according to Snell's Law $((\sin(a)/\sin(b))=n)$, where a is the angle for the incident ray, and b is the angle for the refracted ray, with respect to the normal plane, as shown in FIG. 33.

So, we will have: for the original temperature:

$$(\sin(a)/\sin(b_{old}))=n_{old},$$

and for the new temperature, assuming that n has been increased, in this case, as an example:

$$(\sin(a)/\sin(b_{new}))=n_{new},$$

with the assumption of:

$$n_{new} > n_{old}$$

Then, we will have:

$$(\sin(a)/\sin(b_{new}))>(\sin(a)/\sin(b_{old}))$$

Or:

$$\sin(b_{old})>\sin(b_{new})$$

Or, comparing the angles:

$$b_{old}>b_{new}$$

So, for the new temperature, we will have a smaller angle for the refracted ray, from the normal plane. This means that the distance from the center (L) is smaller for the new temperature:

$$L_{old}>L_{new}$$

Thus, the illuminated devices (by refracted ray) are closer to the center (normal plane) for the new temperature (as compared to the original (old) temperature). The ratio of the ($L_{old}/L_{new}$) is the ratio of the values of the tangent of the two angles (having the same H, as shown in the FIG. 33), to the first order of approximation:

$$(L_{old}/L_{new}) = (\tan(b_{old})/\tan(b_{new}))$$

Thus, one can obtain $b_{old}$ and $b_{new}$, plus $L_{old}$ and $L_{new}$, from the relationships above. The lateral movement of the refracted rays, in the 2 situations, or D(L), or delta(L), which is the distance between 2 rows of devices, for adjustment or optimization (efficiency of solar cells), will be:

$$D(L) = L_{old} - L_{new}$$

Of course, the higher the value of D(n), the higher value for D(L). For the same angle, the higher the value of H, the higher the value of D(L). Thus, the further the distance of the optics from the devices' planes, the higher the value of D(L).

In one embodiment, as the day passes, from early morning (e.g. 8 am) toward the afternoon (e.g. 3 pm), the average temperature usually rises, for the same day, moving the refracted ray in one direction, due to D(n), compared to the starting point, at early in the morning (e.g. 8 am), covering different parts of the solar panels or PV cells/devices/rows of devices. However, in addition, at the same time, the incident ray also moves from near horizontal direction in early morning, then toward the normal direction around noon, and then go back toward the near horizontal direction in late afternoon, in the other direction. Furthermore, the effect of different seasons has another movement/trend on the incident ray, as shown in 32 (*a*) and (*b*).

Figure 34:
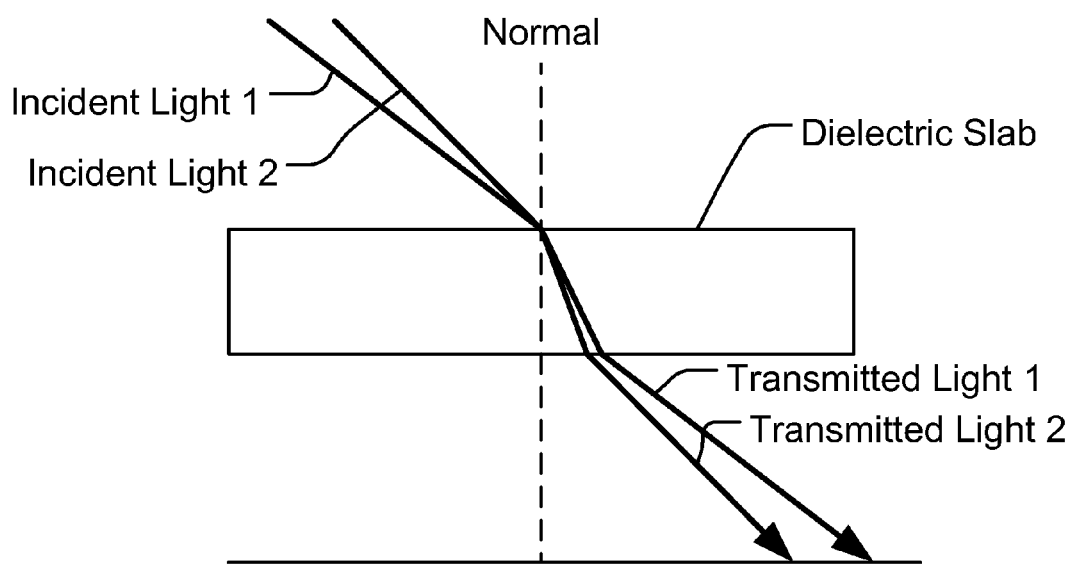
FIG. 34 shows the refracted light for 2 times of the day.

FIG. 34 also shows typical transmission for 2 incident lights, at 2 different angles, corresponding to 2 different times of the day.

Using D(L) value, due to D(n), one can adjust or optimize the refracted ray position on PV (Photovoltaics) plane/devices, for all three factors mentioned above, to compensate for one or more of these factors: (1) temperature rise and changes during the day, (2) incident angle changes during the day, and (3) incident angle changes during the season/year.

Using D(L), one can move the refracted ray slightly, to adjust the beam on the same device, for one embodiment. In another embodiment, for a larger D(L), or for a smaller distance between devices or rows of solar cells, one can move the refracted ray to focus the beam on the neighboring device or row. Thus, in the last situation, D(L) is equal to or substantially equal to the row spacings/distances/gaps, or equal to the multiple of row spacings.

In one embodiment, one can use arrays of devices/cells/PV in different rows under the optical plane (e.g. lens assembly or concentrators). For early morning, the Sun light is focused on the row on the side, and for noon, the Sun light is focused on the row in the middle. This way, without any mechanical movements and setup, the Sun light is effectively tracked, using different rows of devices under the optical assembly, for which at a given time, during the day, the focus of light is shifted gradually, but more-or-less, it is focused on some narrow row of devices, at any given time. (FIG. 34)

Of course, for adjustment for incident angle changes during the day and adjustment for incident angle changes during the season/year, one has to align the devices/rows of devices accordingly, in that specific direction, to compensate and adjust for that change. So, for example, the panels for these 2 adjustments have different orientations on the roofs, as an example.

Here are some of the typical values for n for various materials: the index of refraction for air is about 1, for glass in the range of about 1.52-1.65, for a lot of gases about 1, for ice about 1.31, for ethyl alcohol 1.362, for olive oil about 1.46, for cinnamon oil about 1.601, and for water about 1.33 (at 20 C temperature). Thus, one can inject or pump (or slide in new layer) of different liquid or gas or solid or mixture in the layers positioned between (or as) optics layer (or on an extra layer(s) or plane(s) or container(s) or sheet(s) of material, before or after the optics layer, in which the incident ray shines on and passes through), at different times of the day or season, to cause D(n) for that period of time, to cause the corresponding D(L) on the refracted ray, per formulation mentioned above, to adjust, compensate, focus on, or optimize the performance of the solar cells.

The methods mentioned here act as a solar tracker without any mechanical parts or minimal mechanical parts, which is usually a source of large maintenance cost for the whole system, or down time for the repair schedules.

Note that for some materials, n is dependent on the wavelength. For example, the value of n for fused quartz, with respect to air, at standard temperature and pressure (around typical room temperature and pressure) is changing from 1.453 for 800 nm wavelength of incident light, to more than about 1.480 for about 300 nm incident light.

Thus, for a light coming with a large spectrum of the wavelengths, including visible or invisible light sources, it gets refracted at different angles, due to D(n) mentioned above, splitting the beam in different wavelength components, focusing each component at different parts of the PV planes, depending on D(L), mentioned above.

Since each semiconductor has a different bandgap, matching a different wavelength of light or electromagnetic radiation (visible or invisible spectrum), for optimum absorption and solar cell efficiency. The devices produced with different semiconductors can be stacked together on top of each other during the epitaxial growth by molecular beam epitaxy (MBE), MOCVD, or other CVD or (semiconductor) growth methods, or alternatively, mechanically sliced or etched back or removed from the substrate, by known prior art methods in the market, to physically put on top of each other, as a vertical stack, to get the corresponding wavelength for the appropriate bandgap, for higher efficiency of the solar cell performance, for the split beam mentioned above, as an example.

Alternatively, the rows of the cell devices or PVs have different devices with different bandgaps, close to each other, as slices of rows mounted on a common substrate (after separate growth and device processing for each device-type, with different bandgap semiconductor materials). Then, D(n) causes D(L), for the movement of the refracted ray to a new row or device, with different bandgaps, for better performance or optimum efficiency for the solar cells, producing more energy per given light source and condition.

Any change in D(n) or D(L), due to polarization, if any, can also be treated the same way with the same formulas mentioned above, for the optimization of the solar cells performance.

The values of D(n) or D(L) can be cumulative, due to different effects and causes, resulting in a larger D(n) or D(L), at the end, as a total (but not necessarily as a linear total, or scalar sum).

In one embodiment, the changes in voltage applied across a material or plane or container positioned at the (or instead of) optics plane, e.g. above the device planes, through which the incident light shines and passes, can also cause D(n) in that material, causing D(L).

In general, in one embodiment, one can use any material or liquid crystal (LC), whose n can be changed with voltage (as is known in the prior art), electric field (e.g. contactless), pulse, magnetic field, or current, to adjust/concentrate/optimize/focus the ray tracing from the Sun, on a specific device, stripes of PV, or panels of PV (i.e. using D(n) in that material, causing D(L) or shift in the ray direction and illumination position).

An LC or different LCs or materials having a variable n (an n value as a function of temperature, voltage, electric field, or other parameters) can be inserted in a cavity or void(s), in the optical plane or piece, to cause variation in n or optical properties, for focusing and redirection of rays, for the solar cells' efficiency/improvement.

Figure 16:
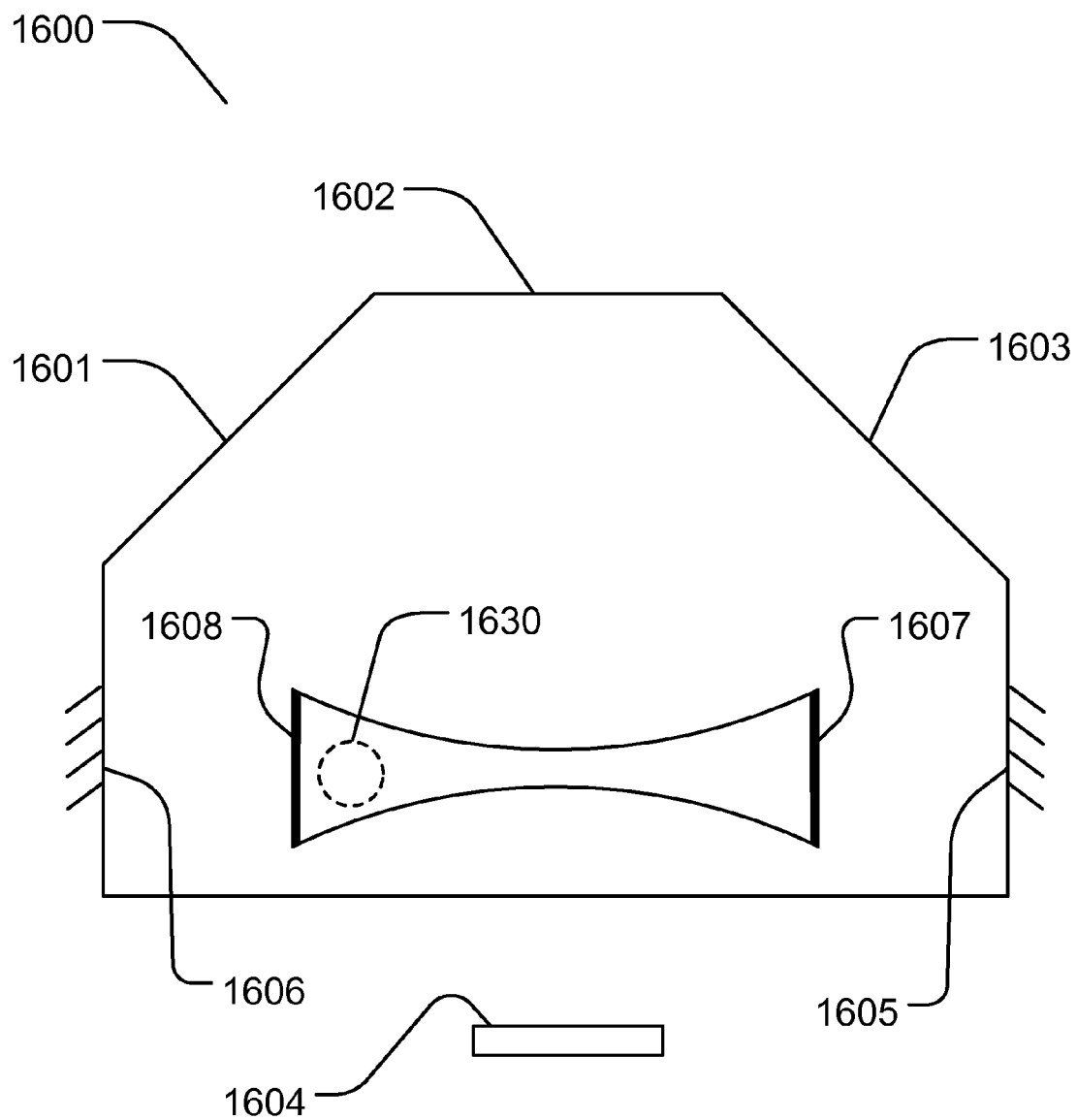
FIG. 16 shows cross section of a strand.
Figure 17:
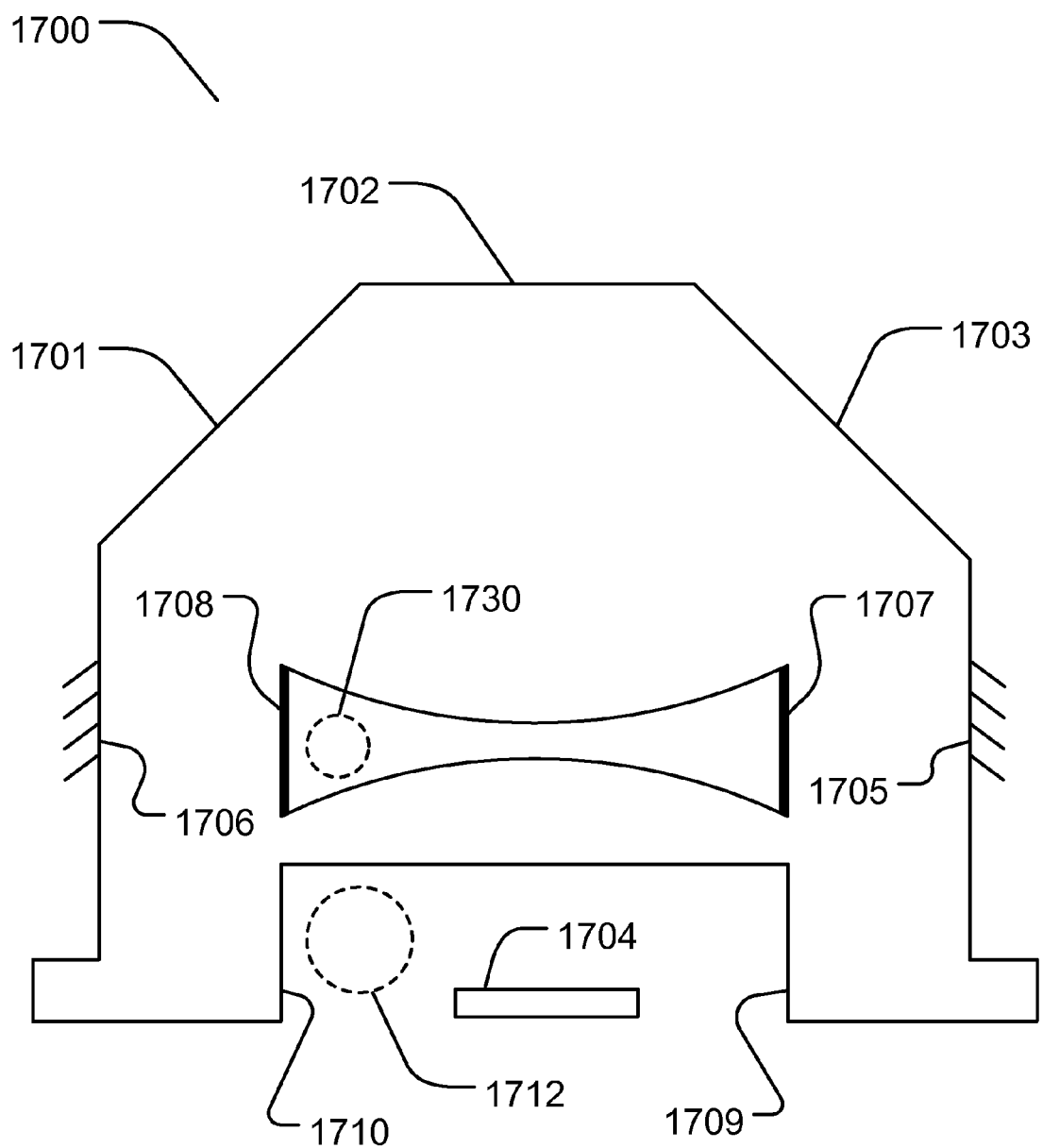
FIG. 17 shows cross section of a strand.
Figure 18:
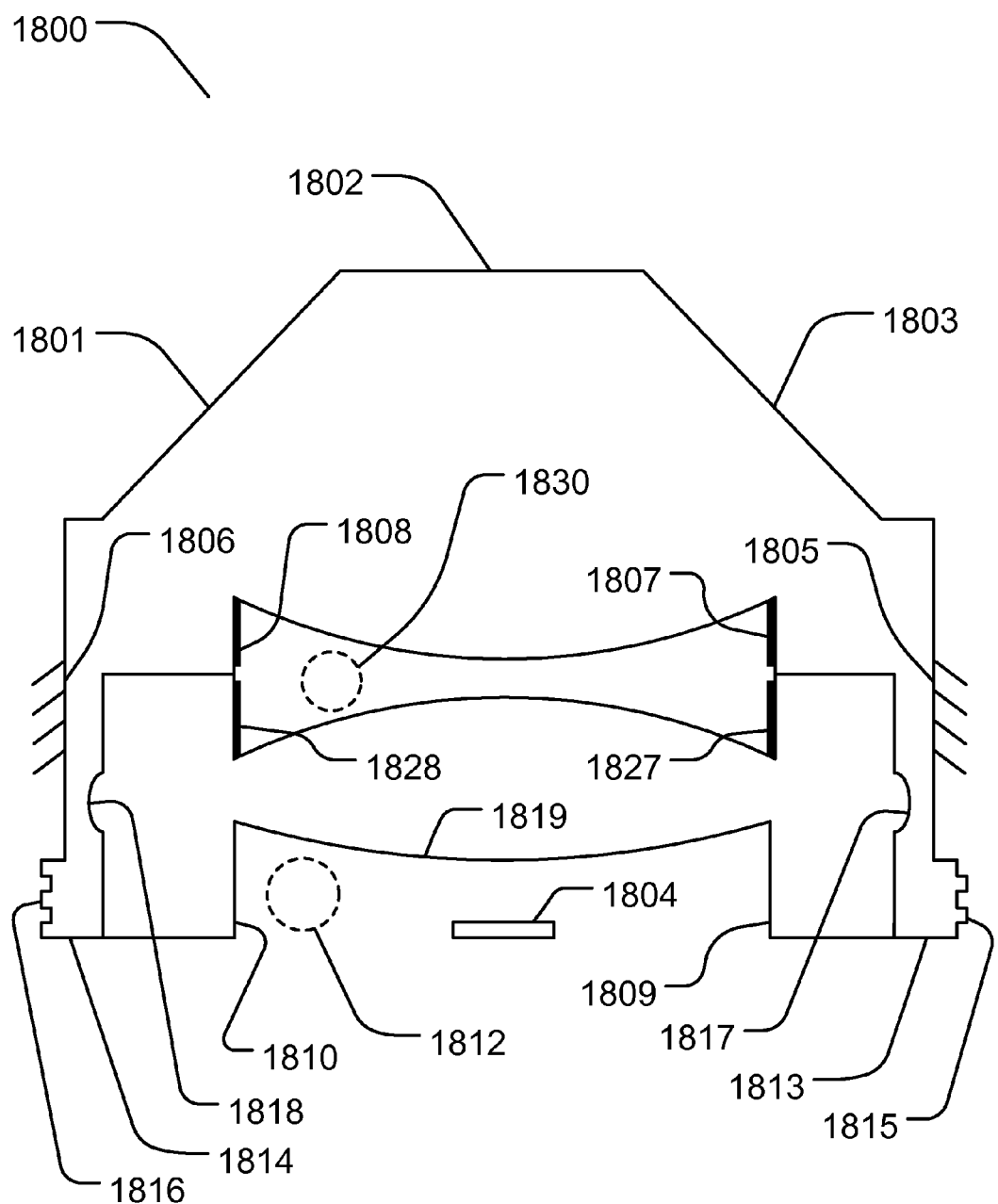
FIG. 18 shows cross section of a strand.

In one embodiment, the material can be pumped in/out from the container or sheet or layer (e.g. for gas or liquid material), or slide in or out (e.g. for solid material) by chain or pulley or railing or other similar methods, to cause major change in n. For example, a transparent container holding a liquid (which can be pumped in/out) acts as an optics plane or optical lens, for our focusing on devices underneath purposes. In this case, D(n) is quite large for the 2 cases: flat transparent/glass (for example) planar container (1) with the liquid and (2) without the liquid. (FIGS. 16-18)

These changes, mentioned above, cause the Sun rays divert. This acts alone (as one embodiment) or in combination with a mechanical solar tracker (as one embodiment), to track the Sun.

In one embodiment, the mechanical solar tracker has a feedback and controller that monitors the voltage, current, and power from each device or panel, or uses the databases or formulas for position of Sun, or weather forecasts on real time for the amount of light or diffused light due to clouds, to compensate whatever needed, in addition to D(n) or D(L), mentioned above, to maximize and optimize the performance of the panels.

In one embodiment, the step motor, moving at different speeds during the day, for the optimum panel position, with respect to the Sun. In one embodiment, it is easier and cheaper to move the optics, rather than solar cell panels. However, in general, we can move solar cell panels, optics panels, or both, with respect to each other. The movement can be angular or in 2-dimension translational directions. The PV panel or small PV subpanels can move individually, collectively, or in concert together (using a chain, rod, rail, cable, Venetian blind structure, window curtain structure, band, belt, lever, or similar mechanisms).

In one embodiment, the optics panel or small optics subpanels can move individually, collectively, or in concert together (e.g. for the individual or collective optimum panel position, with respect to the Sun). Slight adjustment needed for change of season (e.g. every few weeks), or just use the average of the positions as our fixed setting for the whole year. The motor movement/adjustment can be done uniformly, non-uniformly, periodically, continuously, step-wise, at-one-step, or at a random time (with an example shown in FIG. 11). Tracking the Sun can be done based on/using a software, a table, Sun position data, formula, experimentally in real-time using feedback/controller for adjustment, based on sensors, measured voltage, measured energy, or measured current, from the PV panels or portions of panels, to optimize and track/adjust, accordingly.

In one embodiment, we can use a prism to split the wavelengths, and put a "spaghetti structure" (or strand (of any shape or cross section, e.g. curved, straight, or twisted) or lens or optical piece or optical plane) (as shown in the figures/embodiments of this invention) with different material under each wavelength split, as the optical plane or lens, above the device plane/rows/solar cells. In one embodiment, we can use a prism to rotate or move horizontally, to adjust for the time of day or season. The different PV material with different bandgaps ($E_g$) can be mechanically stacked vertically (on top of each other, with substrate removed), or grown epitaxially in vertical fashion (e.g. pseudomorphic), or lined up horizontally (e.g. diced up/cut as stripes parallel to each other, or grown and etch back a layer using a semiconductor processing, to expose 2 or more different materials, or cover up one material in favor of/instead of another one).

Figure 11:
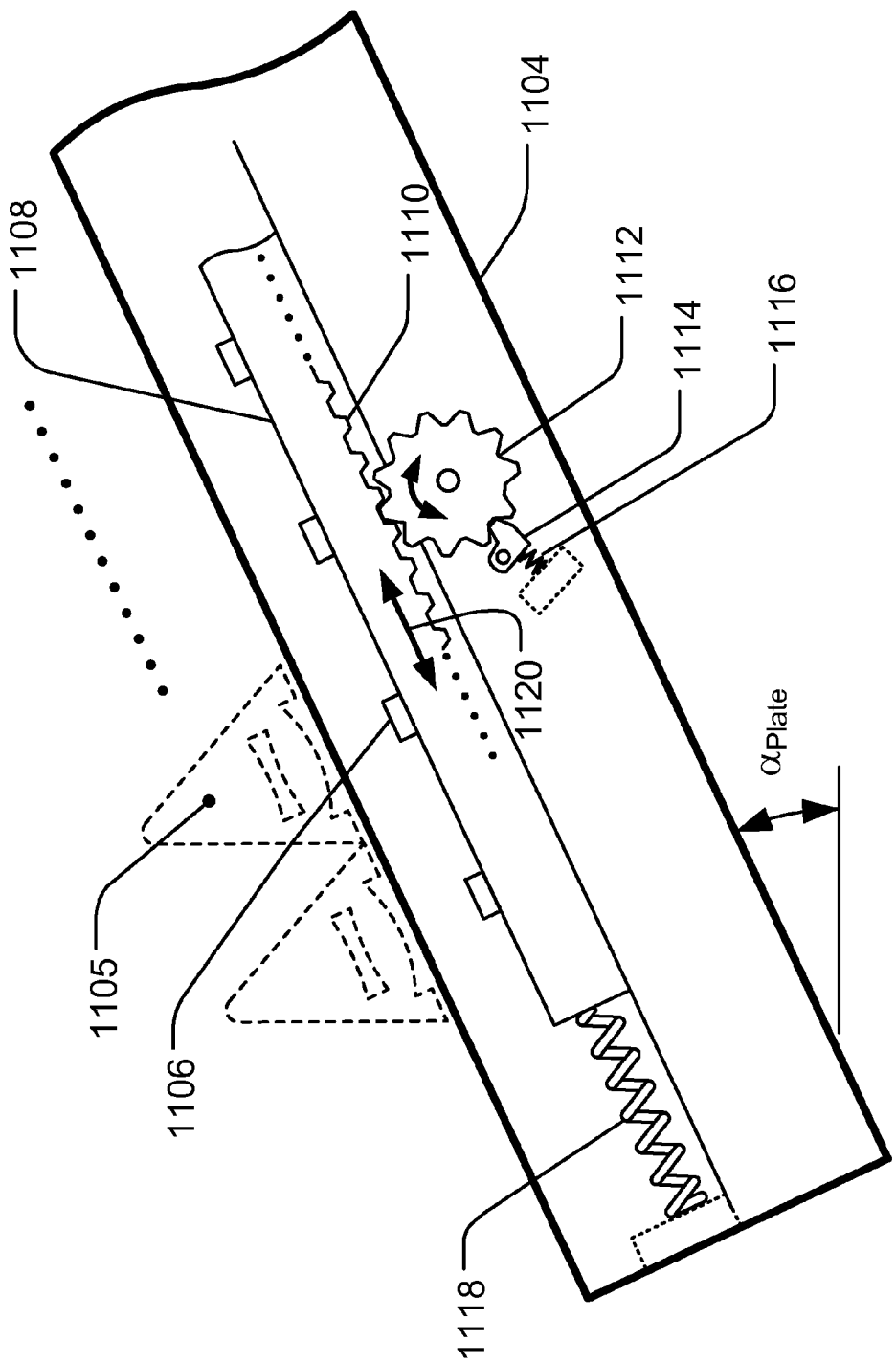
FIG. 11 shows movement mechanisms.

In one embodiment, we can use a series of spaghettis adjusted the tilt using a bar, rail, string, or chain, held on both sides, but moved on one or both ends of spaghettis. (FIG. 11)

In one embodiment, the whole frame for spaghettis or PV panels can move, relative to others. In addition, a negative-feedback control can stop, start, or adjust the movements, based on the current or voltage measured from the cells. (FIG. 12e)

In one embodiment, there is a flexible PV plane or piecewise PV planes, wrapped around of a cylinder or circular or curved surface or base, as a jacket, e.g. around a spaghetti or cylindrical object (or rows of objects), held together with a screw or Velcro or glue or any other attachment means. The substrate for this purpose is (e.g.) elastic material, which is bent easily, and can be molded in factory.

In one embodiment, the whole structure (e.g. parallel rows of spaghettis or cylindrical objects, or any other structure mentioned in this disclosure) can be parallel to the roof, or tilted at an angle (stationary, or dynamically-adjustable, manually (e.g. periodically), or automatically, e.g. by a controller with (e.g.) a small motor and a gear).

In one embodiment, to adjust the position and angles/tilts for the whole structure, or set those values and parameters initially or dynamically/periodically, the "noon" or "mid-day" position for the whole structure (the position in which the whole structure is optimized for the whole day, or for specific time of the day, e.g. for about noon time or mid-day period) is not symmetric (i.e. has an offset), with respect to (e.g.) the house or roof/main structure (that is based on or attached to), because it should (in average) compensate (e.g.) for the elevation, roof angle/pitch, roof direction, and geographical location of the house, to optimize for the whole structure (of PV panels), for solar cell/device performance or output/power/energy, during the day.

In one embodiment, for the roof of a house or building, the PV stripes and color shingles or tiles/stripes are positioned in parallel, and from far, it looks like an average color of the both components (for the whole roof), as the customized color/look/appearance for the roof of the house.

Figure 20:
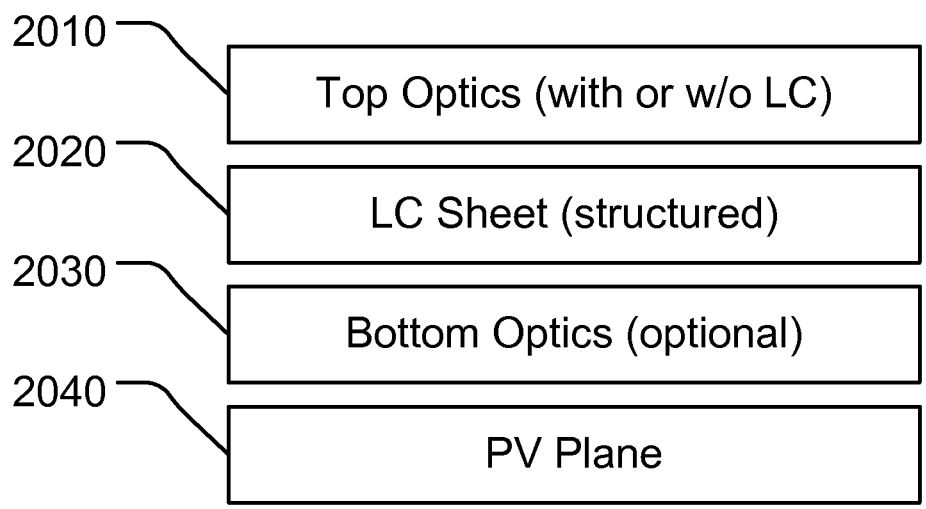
FIG. 20 shows general optical setup.

In one embodiment, one can use a Fresnel lens, or combination of them, e.g. with a planar structure, for the optical plane or optical lens, as shown in FIG. 20. For example, Fresnel lens can be in the shape of circular or parallel lines or saw tooth structure.

In one embodiment, as shown in FIGS. 16-18, inside the cavity for the lens, concentrator, or spaghetti (if any), one can put: air, other gasses, fluid, liquid, mixtures, glass, compounds, water, plastic, liquid crystal, and other material with variable optical characteristics (e.g. n), using applied voltage, electric field (e.g. contactless), pulse, magnetic field, or current, to adjust/concentrate the ray tracing from the Sun, on a specific device, stripes of PV, or panels of PV. The material in the cavity can also be removed, e.g. by a pump, as another embodiment.

Figure 21:
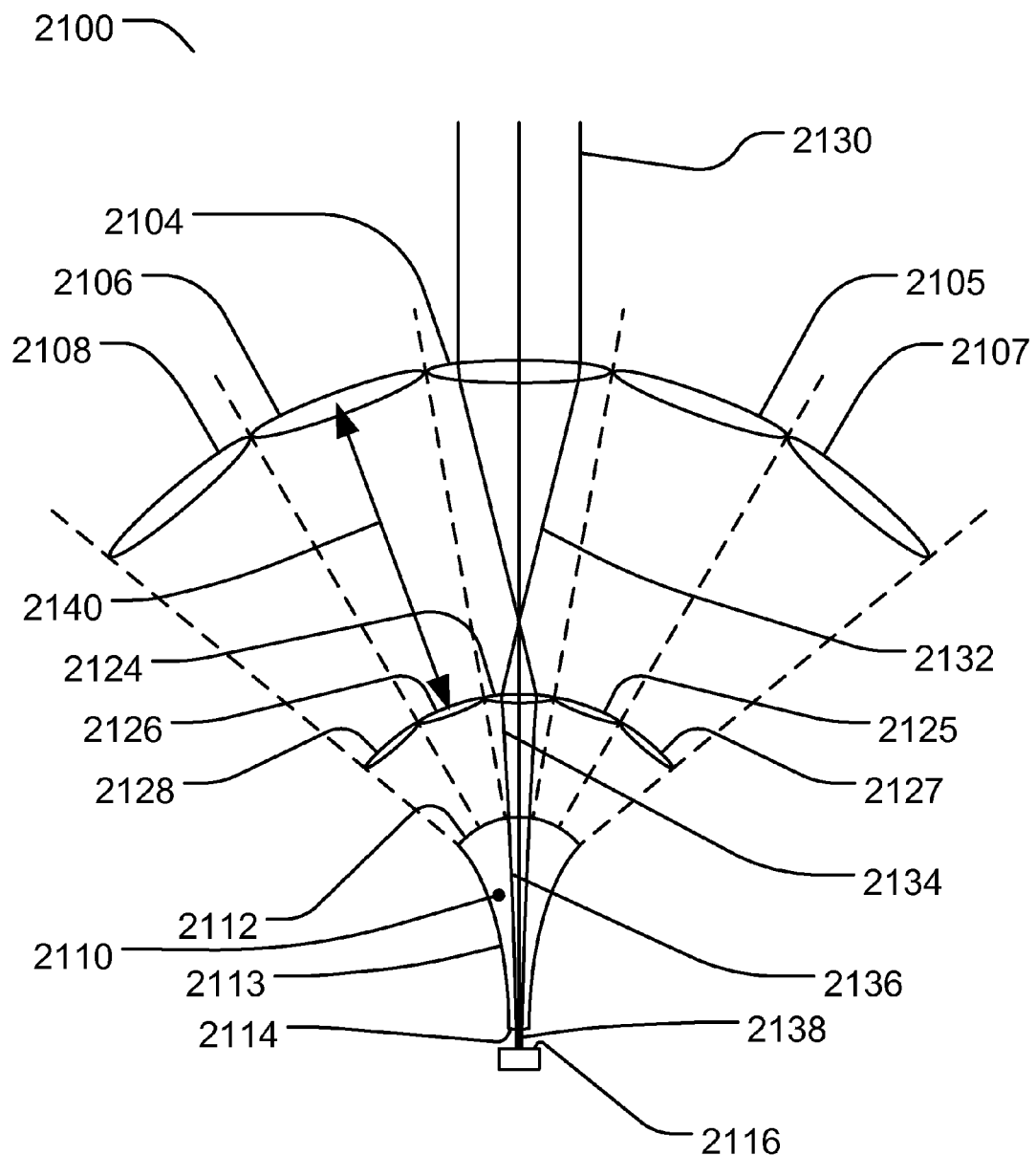
FIG. 21 shows funnel structure.

In one embodiment, one uses a funnel structure with variable n value, e.g. for graded or variable material or density, or using different material blocks or optical lenses, at the optical plane or as a optical lens, for light to focus on or be guided as a funnel in a smaller area (FIG. 21). In one embodiment, using the graded material (with graded or variable n value), one can spatially focus the light in a funnel structure on a small region (for higher efficiency) on the solar cells.

In one embodiment, we have a transparent hollow cylinder or other shapes (positioned at our optical plane, above the solar cells, for focusing or redirecting rays), as a holder or container, which can rolled and rotated, on a plane, using chain, railing, gear, or other methods, by a motor. The cylinder contains a lot (or a few) (small) geometrical shapes or pieces, which act as small lenses or diffraction pieces or small optical pieces. After each rotation with a specific angle, from the original starting angle, the cylinder is positioned in a different angle, and the small lenses are moved around by gravity inside the cylinder, in a predetermined way, positioned in a new specific configuration, which has a one-to-one predictable correspondence with the angle of rotation of the cylinder. The new configuration now has a different optical length or effective n (weighted average of all small lenses, made up one or more materials), due to the fact that at that new angle, the rays enter the cylinder and go through small lenses in different configurations and order and angle (due to the rearranged small lenses or optical pieces), making it a new refraction or reflection result, altogether. Since the behavior of the cylinder and small lenses are predictable in this way, based on the angle of rotation of the cylinder, e.g. 15 degrees, the behavior of the refracted light is also predictable, as a function of the angle of rotation for the cylinder. Thus, one can control the light redirection or focusing, or effective n, based on the cylinder's rotation/angle, using the gravity as the rearranging factor for the small lenses.

In one embodiment, one can use fiber optic cables (simplex or duplex) (single-mode or multi-mode) to bring the light in focus or bend the light to specific direction for PV devices/panels. In one embodiment, one can use ribbon furcation tube, furcation tube, or duplex furcation tube for different wavelengths, depending on the bandgap or bandgaps of the PV devices/panels, with different devices or bandgaps stacked in parallel on the surface, or stacked in series (on top of each other). In one embodiment, one can use multimode couplers, wavelength division multiplexers, fan-outs, or splitters, to redirect or split portions of light to different regions and focus on different PV devices/panels.

Note that for the thick lenses, or refraction at spherical surfaces, the formulation is given by many textbooks, for example, the one by Sears Zemansky, college physics textbook, page 567, 4$^{th}$ edition, as:

$$(n_1/s_1)+(n_2/s_2)=((n_1-n_2)/R_0)$$

referring to chapter 39-7 of that book, for explanation, notations, and discussions.

Figure 31:
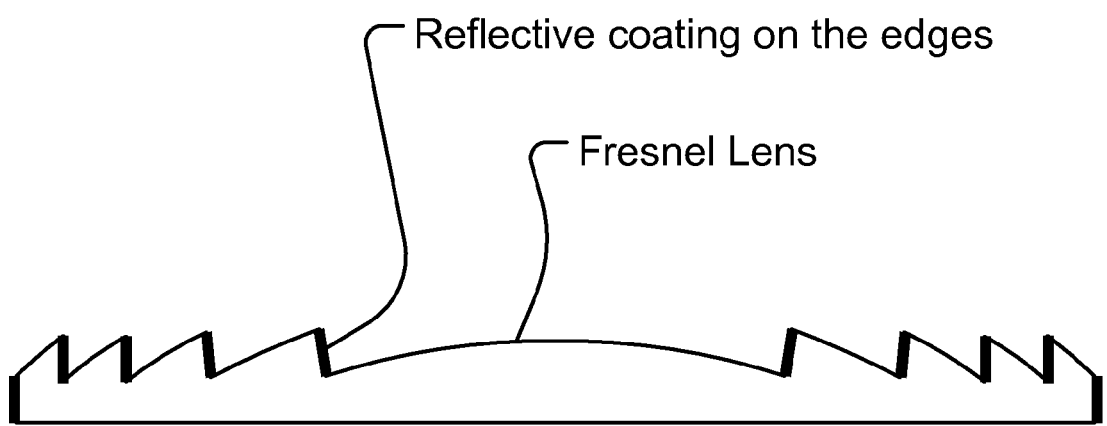
FIG. 31 shows a specialized form of Fresnel lens.

In one embodiment, one can use Fresnel lenses with "Shark-teeth" structure (or looks like saw tooth array). The Sun light coming from near-horizontal angle, for late afternoon and early morning, goes through the edges of these teeth structure and bends down toward the solar cells, located under the Fresnel lens, parallel to the plane of the lens, as a method of focusing the light on PV devices/plane/panels. It can also have a reflective coating on some edges, as shown in FIG. 31, for better confinement of the rays.

Figure 1A:
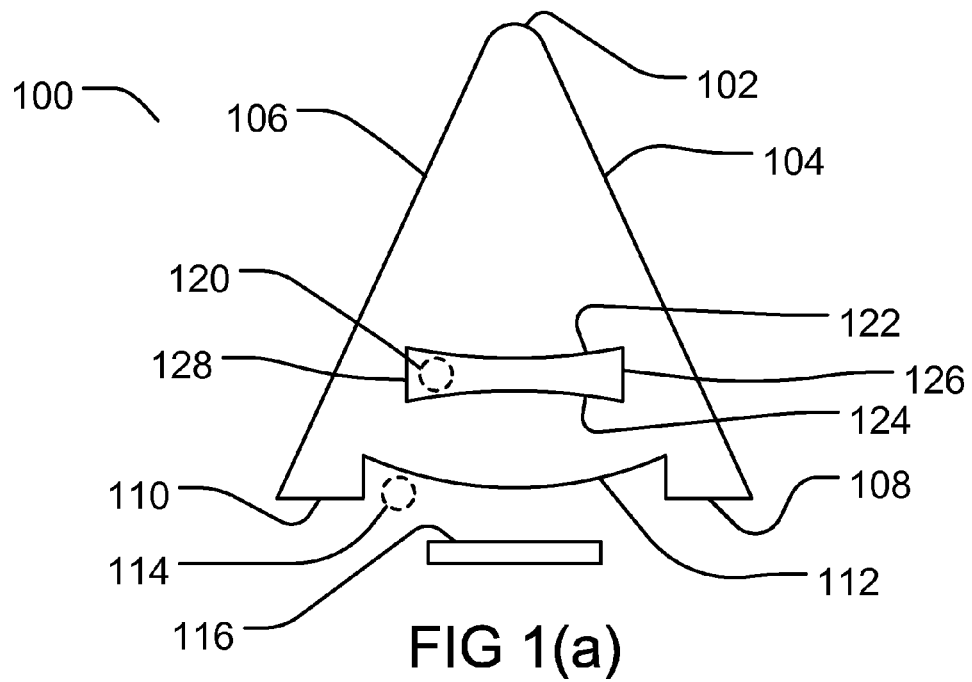
FIG. 1 *a-c* shows cross section and length view of a strand.
Figure 1B:
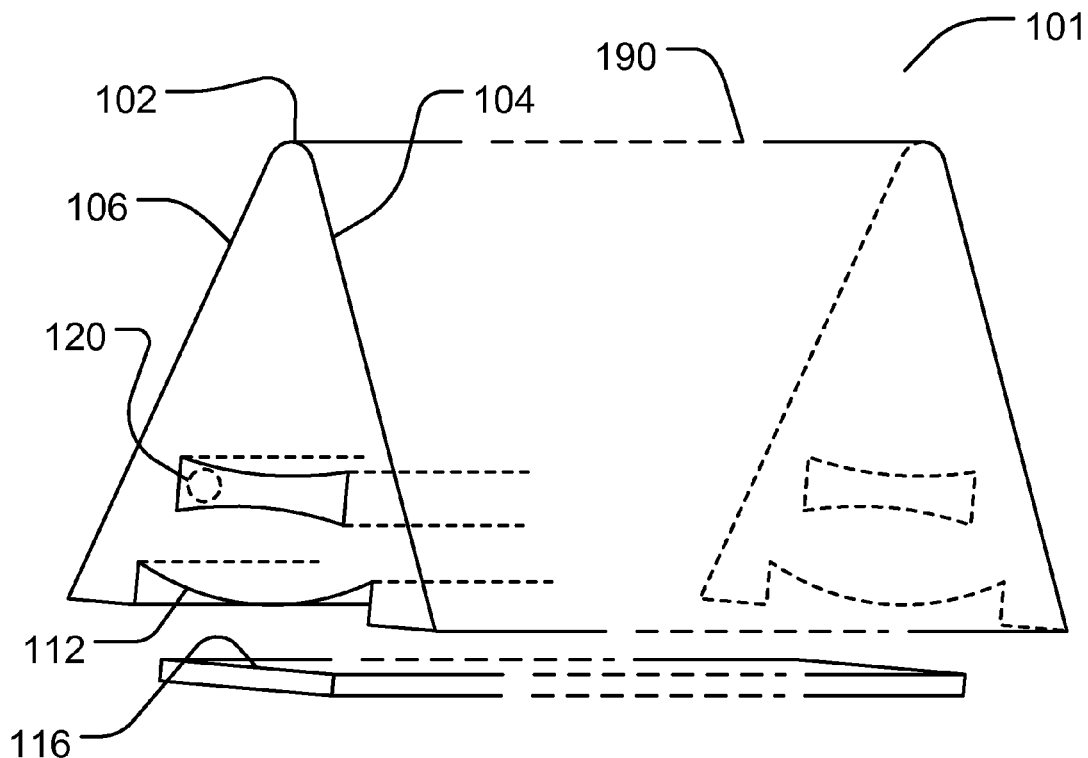

FIG. 1 shows an embodiment of the invention, with the following components:
- 100: Cross section of an embodiment of the invention
- 102: Dome shape tip
- 104 and 106: The side surfaces of the optics
- 108, 110: The supporting bases of the optics
- 112: the concentrator at the base of the optics, formed in a cavity (114) at the base of the optics between the optics supports (108 and 114).
- 116: PV placed below the concentrator
- 120: A void within the optics. In one embodiment, this void can be filled up with liquid or gas or solid, such as powder, air, LC (liquid crystal), mixture, solution, or other material with different n than the material used in optics (around it). In one embodiment, this void can be filled up/pumped out with a pump (from the either sides of the strands, through some elongated openings throughout the strand, as shown in FIG. 1(b), at the 2 ends), to change optical property, e.g. n, to cause D(n) and D(L), for bending the light rays passing through, to focus on the devices underneath, depending on the season (s) and time of day (d), as a function of those parameters: F(s, d). That is, one solves for the appropriate adjustment or compensation based on the following equation: (D(L)=F(s, d)), or alternatively: (D(n)=F(s, d)). In general, F is also dependent on other parameters, as mentioned in the other parts of this invention, and those can be included in the equation above. In one embodiment, the 2 ends (as shown in FIG. 1(b)) are connected to 2 electrodes, to apply voltage, current, or electric field, across the material in the void, e.g. putting different voltage on the LC material, to change n depending on the season (s) and time of day (d), for adjustment or refocusing the light rays. In one embodiment, this void can be filled up permanently, with the different material, stationary, at the beginning of setting up the structure on the roof (e.g.), with no flow in/out. In one embodiment, this provides an additional light refraction. In another embodiment, this void can be eliminated (i.e. no void at all, with the solid optics throughout, with the same material).
- 122, 124: the top and bottom sides of the void within the optics
- 126, 128: the sides of the void within the optics. In one embodiment, these can be coated by a reflecting material (mirror like).
- 101: Perspective view of Spaghetti structure or strand structure or cord structure, which generally can be with different (any) cross sections and different (any) shapes, such as circular, flat-top, flat-bottom, trapezoid, or other shapes.
- 190: Elongation of optics structure (strand or Spaghetti), as well as PV Note that FIG. 1(a) is the cross section/front view of the strand, for the optics (or lens, or optical plane), with cavity 114 and void 120, on top of sample, device, solar cells, arrays, PVs, PV plane, or PV panels (as designated by 116, for FIGS. 1 (a) and (b)). FIG. 1(b) shows the other view of the setup, on the elongated view of the strand, to show that the cavity or void runs (hollow (i.e. with air) or filled with a different material (e.g. encapsulated or capped at its two ends)) along that side of the strand, from one end of strand to the other end.

FIG. 1 (c) shows an embodiment of the invention, with the following components, for the view of the elongation of "spaghetti" or strand:
- 170: Roof or mounting surface. This could be flat or inclined.
- 180: Sun at the sky
- 182: Path of the sun on sky during a day
- 184: Sun rays reaching/incident on the optics, changing their incident angle during the day, and during seasons (extremes: winter to summer).

The stands can be part of the roof, or separate; as a single strand, or on a frame, as an array; as stationary/fixed, or as adjustable/moveable (using lift, pulley, chain, lever, rod, cable, rails, or other methods, to move or tilt the panels or arrays, with respect to the roof or Sun). The strand(s) or array/rows of strands in FIG. 1 (c) are laid along side on the roof, substantially parallel to the path of the Sun during the day, to catch most of the Sun rays/energy, efficiently, by the solar cell arrays underneath.

Figure 2:
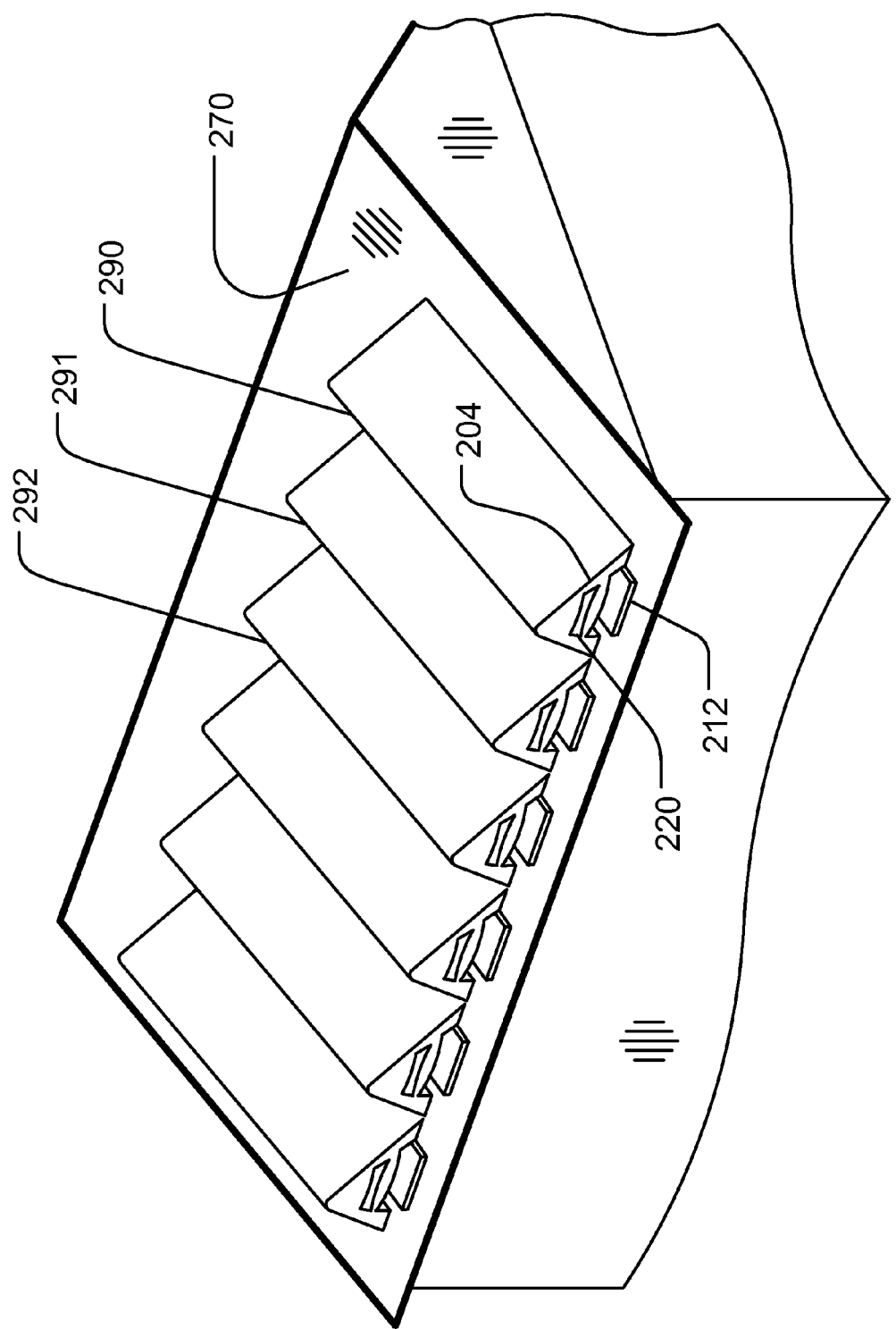
FIG. 2 shows array of strands.

FIG. 2 shows an embodiment of the invention, with the following components, for the view of the elongation of "spaghetti" or strand, on a roof of a building (shown not-to-scale, with strands enlarged drastically, for clarity) (using e.g. some of the strands in FIG. 1):
- 290, 291, 292: array of solar cell strands
- 212: PV
- 220: Concentrating void (or can be used as LC holding container, or holding other materials)
- 204: an example of light catching optical surface on the solar cell
- 270: inclined roof/surface (example)

Figure 3A:
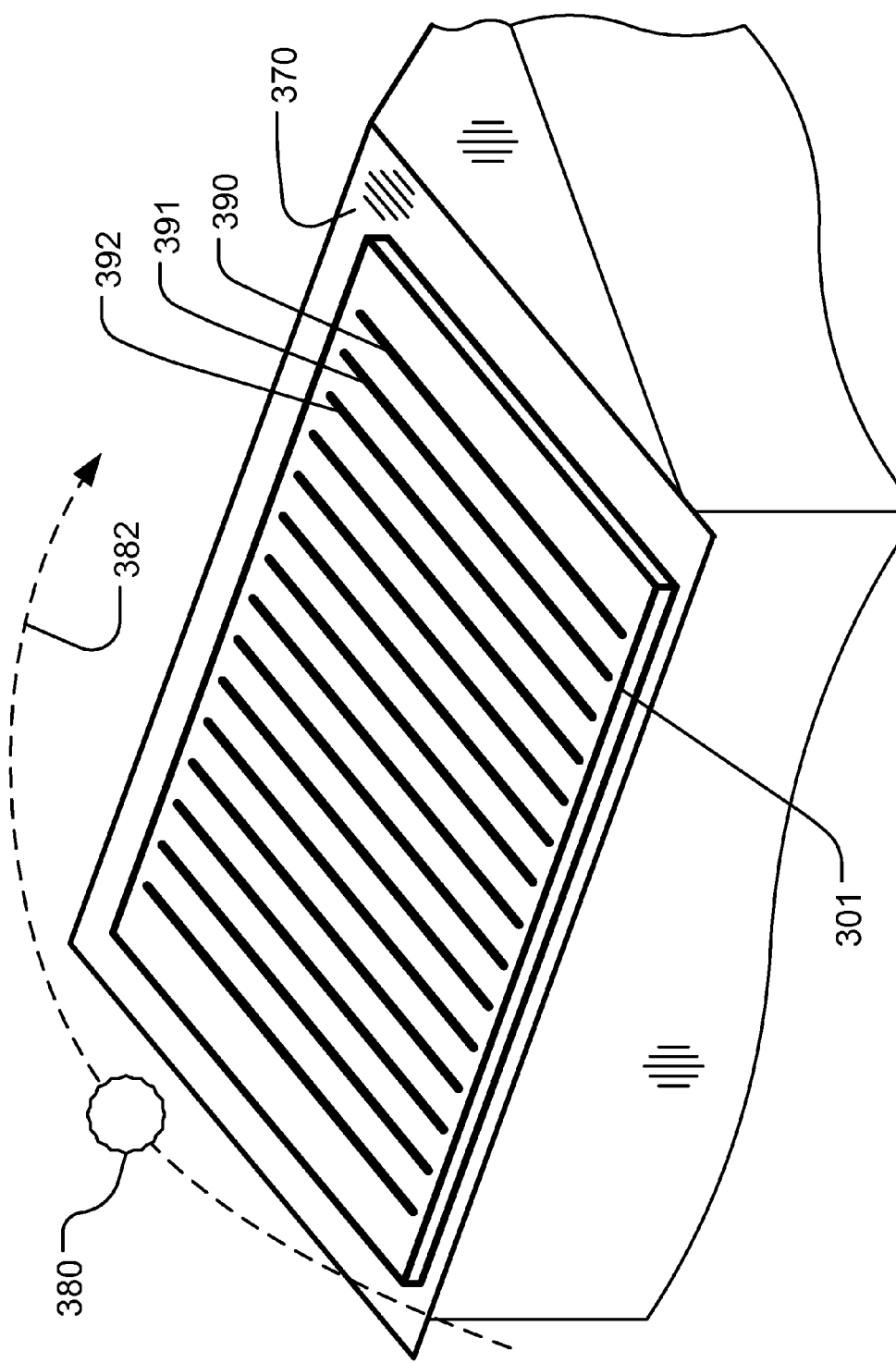
FIG. 3*a-b* shows array of strands.

FIG. 3a shows an embodiment of the invention, with the following components, for the view of the elongation of "spaghetti" or strand, on a roof of a building:
- 390, 391, 392: array of solar cell strands
- 370: inclined roof (example)
- 301: Frame holding the array of solar cells used for mounting on the supporting surface (e.g., roof)
- 380: Sun
- 382: Sun path in sky during a day, which can be in any orientation with respect to the installed panels. In one embodiment, the Sun path and the strands are substantially parallel.

Figure 3B:
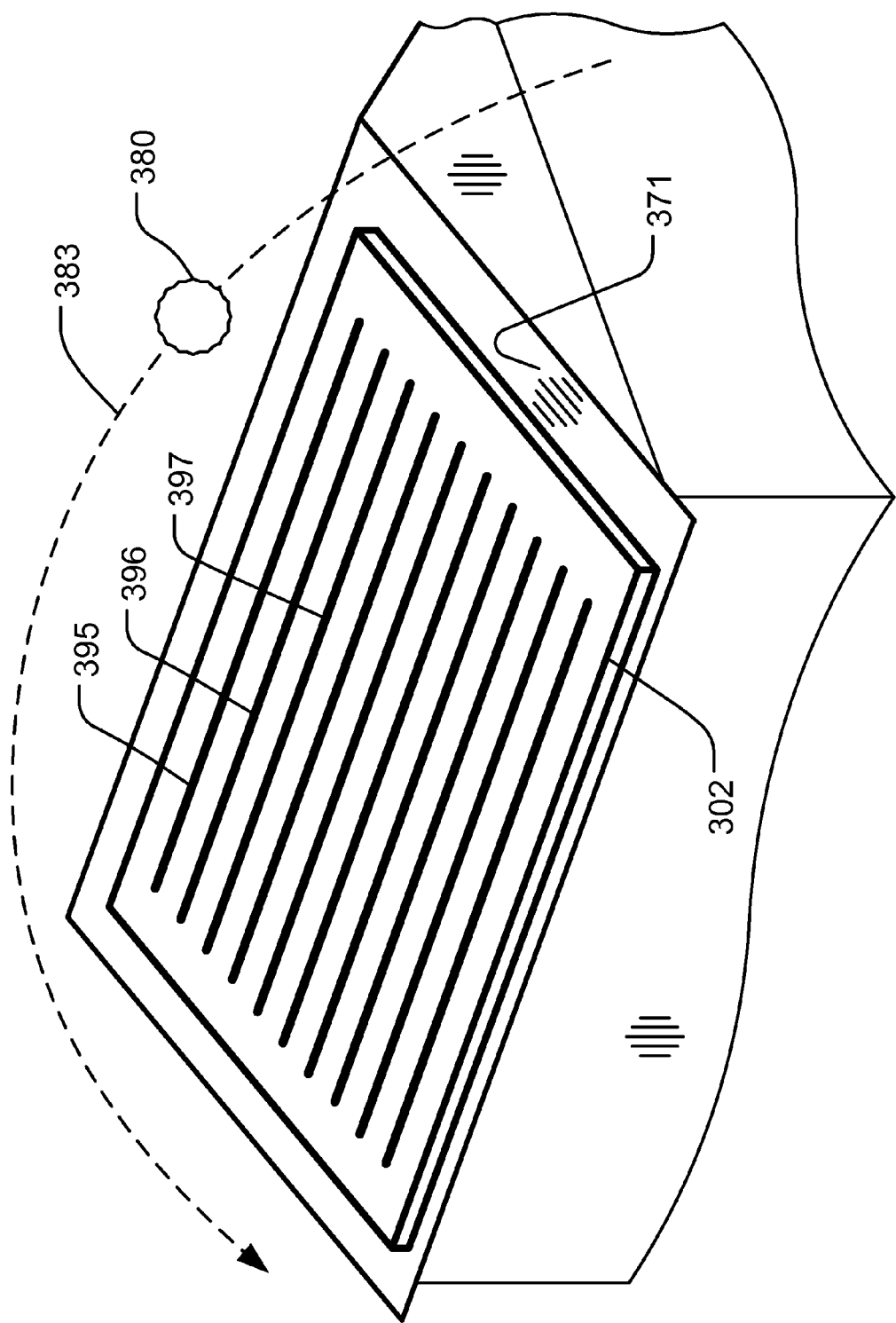

FIG. 3b shows an embodiment of the invention, with the following components, for the view of the elongation of "spaghetti" or strand, on a roof of a building:
- 395, 396, 397: array of solar cell strands
- 371: inclined roof (example)
- 302: Frame holding the array of solar cells used for mounting on the supporting surface (e.g., roof)
- 380: Sun
- 383: Sun path in sky during a day, which can be in any orientation with respect to the installed panels. In one embodiment, the Sun path and the strands are substantially parallel, as shown in FIG. 3b.

Figure 4A:
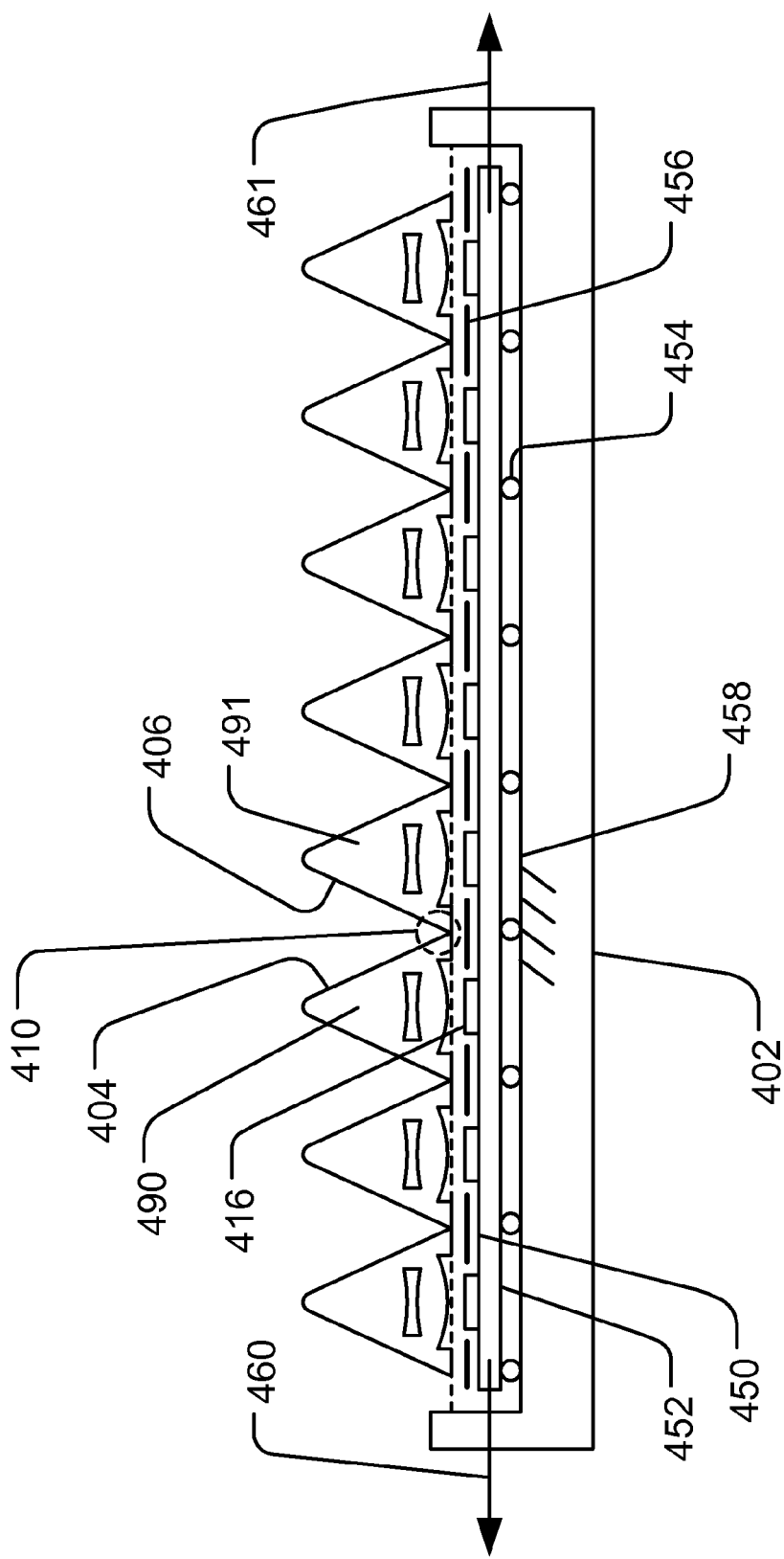
FIG. 4*a-b* shows array of strands.

FIG. 4a shows an embodiment of the invention, with the following components or descriptions, for the view of the cross section/front view of strands (array of strands), on a roof of a building (e.g.):
- 490, 491: two neighboring strands
- 406, 404: two facing sides from two strands
- 410: Tongue & groove or fused—examples of attachment for strand array
- 402: Frame holding the array of solar cells, used for mounting on the supporting surface (e.g. roof)
- 416: PV, also could be light sensitive at the bottom, i.e. solar cells attached on both sides of a substrate, to get any reflected lights coming back, for maximum capture of the light ray's energy.
- 452: PV cell supporting plane
- 454: Track roller: it could be rail or gear mechanism or other methods.
- 450: Color surface or transparent material
- 456: Overlaid material (e.g., color or textured paper): removable, customizable, patternable, stackable
- 458: (multi) color surface/material or mirror/reflecting surface (e.g., Al)
- 460, 461: relative movement of the PV plane and top optics, for adjusting for the location of Sun in the sky and the incident light angle.

Of course, some of the choices above are paired together. For example, for an option of having a light reflected to the other side of the substrate/solar cell panel, one has to have a transparent plane/material above, for that wavelength, to be able to pass through, in the first place.

Figure 4B:
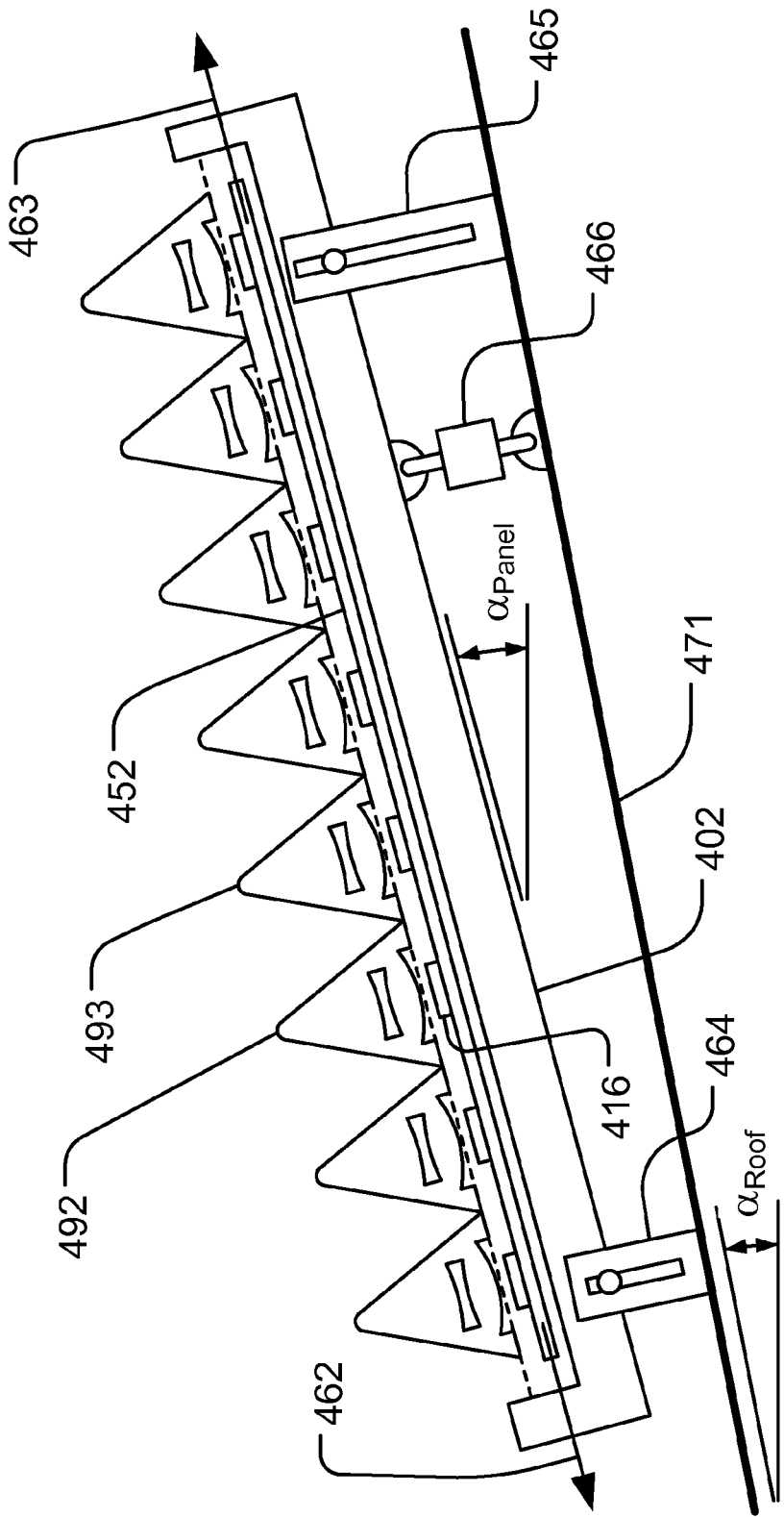

FIG. 4b shows an embodiment of the invention, with the following components or descriptions, for the view of the cross section/front view of strands (array of strands), on a roof of a building (e.g.):
- 492, 493: two neighboring strands (e.g. similar to the figures described elsewhere in this disclosure)
- 471: Roof surface
- 402: Frame, holding the array of solar cells, used for mounting on the supporting surface (e.g., roof)
- 416: PV
- 452: PV cell supporting plane
- 462, 463: relative movement of the PV plane and top optics, for adjusting for the location of Sun in the sky and the incident light angle. This could use variety of mechanisms (e.g., gravity or friction, control system mechanism, feedback, chain/pulley, cable, gear, or similar methods).
- 464, 465: adjustable mounting support for mounting the frame
- 466: step motor for adjusting the angle of panel with respect to the roof inclination (e.g., for daily, weekly, monthly, seasonal adjustments), e.g. adjusting twice a day. It may be calibrated at the installation, so the range would cover the extreme seasons (winter and spring, e.g.).
- e.g.: 464 support may allow pivoting, while 465 may act as guide rail, to adjust the angle of panel, with respect to the angle of the roof, as shown in the figure.

Figure 5A:
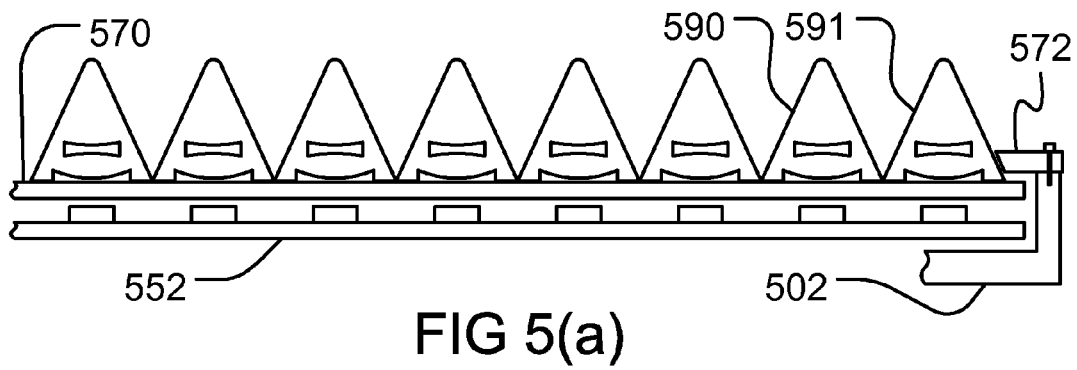
FIG. 5 *a-c* shows array of cross section of strands.
Figure 5B:
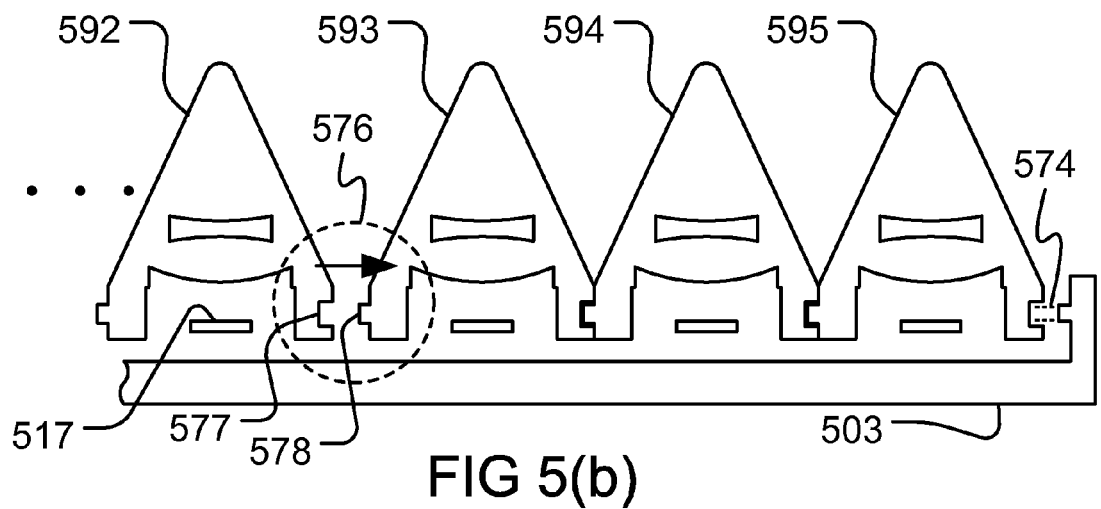
Figure 5C:
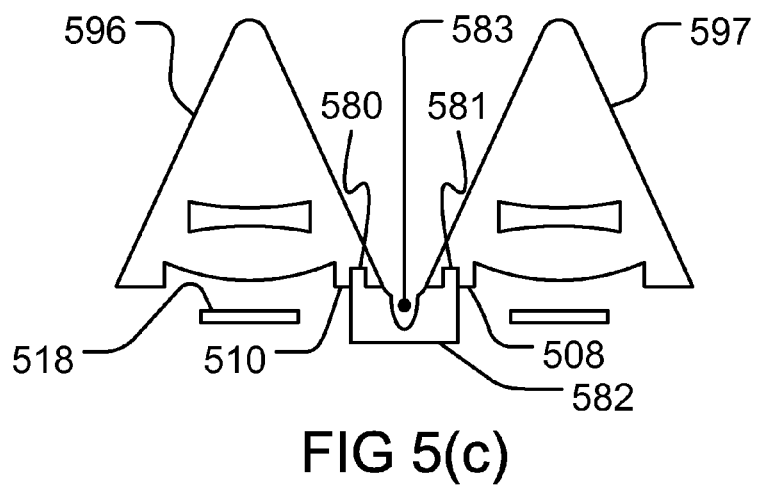

FIG. 5a-c describes an embodiment of the invention, with the following components or descriptions, for the view of the cross section/front view of strands (array of strands), on a roof of a building (e.g.), with each of the 3 FIGS. 5a-c describing a different embodiments for the setup and attachment of the strands/array, as described below (Examples of how things are clamped down, or the structure for those):
- FIG. 5(a): Fused or pressured array using a side clamp to tighten up (or leak-proof it).
- 590, 591: strands
- 591: strand next to the clamp (572), which attaches to the frame (502) in this example. (It could also attach to the optical support which can move with respect to the frame and PV).
- 570: transparent layer (e.g., glass cover/base) to prevent weather damage to PV and electrical/mechanical components.
- 516: PV
- 552: PV support plane
- FIG. 5(b): strands, connected via tongue and groove together.
- 503: frame with tongue or groove side (574) for attachment
- 592, 593: examples of tongue (578) and groove (577) attaching (576)
- 593, 594, 595: already attached via tongue and groove
- 517: PV
- FIG. 5c: Attached independently to holders. Provides space to let rain water drain in some configurations.
- 596, 597: neighboring strands
- 582: connection base with drain path (583)

580, 581: tongue and groove (or notch/dimple) to connect/snap strands to the connection base

518: PV

Figure 6A:
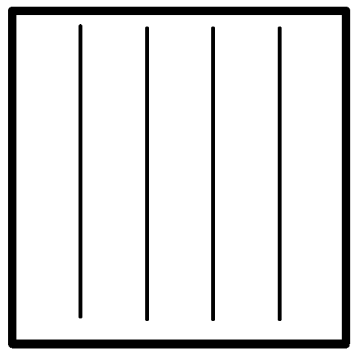
FIG. 6 *a-e* shows patterns of strands.
Figure 6B:
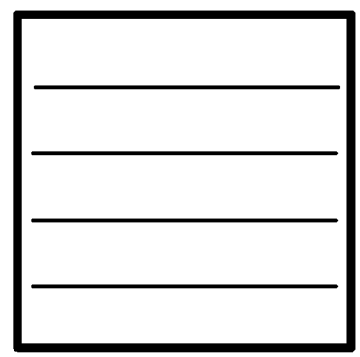
Figure 6C:
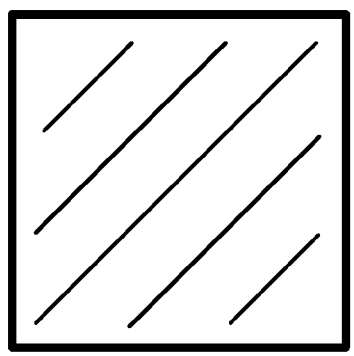
Figure 6D:
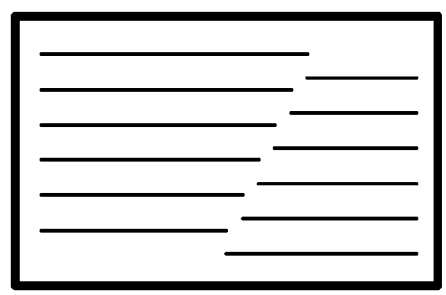
Figure 6E:
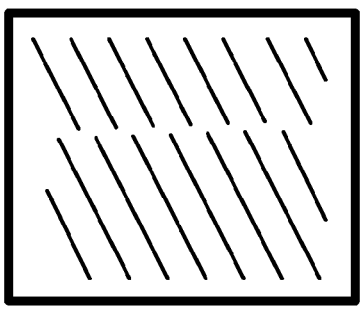

FIGS. 6*a-e* show embodiments of the invention, for the view of the elongation of "spaghetti" or strand, on a roof of a building, with different orientations, with respect to the roof, and roof edge, e.g. horizontal, vertical, diagonal, or staggered/split (such as FIG. 6*d* or 6*e*).

FIG. 16 shows an embodiment of the invention, with the following components or descriptions, for the view of the cross section/front view of "spaghetti" or strand, on a roof of a building (e.g.):

- 1600: an embodiment comprising (e.g. prism like) optics with multiple surfaces
- 1601, 1602, 1603: top refracting surfaces of the optics for gathering Sun rays
- 1630: internal void structure, to cause ray concentration, or for filling with a fluid to change n.
- 1604: PV cell, element, or devices (or rows and arrays of them)
- 1605, 1606: Use mirror or reflector at the edges of prism, e.g. by evaporation of metal or other material, for reflection
- 1607, 1608: Use reflective coating sides of the void.

Note that surfaces 1601-1603 can be curved, as well, for another embodiment. Void 1630 does not exist, for another embodiment (i.e. filled up with the same material as the rest of the optical plane or lens).

The surfaces 1606 and 1608 (e.g.) generally prevent the rays escape the area, and reflect them back to focus on the device, for most part.

FIG. 17 shows an embodiment of the invention, with the following components or descriptions, for the view of the cross section/front view of "spaghetti" or strand, on a roof of a building (e.g.):

- 1700: an embodiment comprising (e.g., prism like) optics with multiple surfaces
- 1701, 1702, 1703: top refracting surfaces of the optics for gathering Sun rays
- 1730: internal void structure to cause ray concentration, or also for filling with a fluid to change n
- 1704: PV cell, element
- 1705, 1706: Use mirror or reflector at the edges of prism
- 1707, 1708: Use reflective coating sides of the void
- 1709, 1710: base support (e.g. extension of the optics)
- 1712: void/space created between the support bases, which is also used to house the PV.

FIG. 18 shows an embodiment of the invention, with the following components or descriptions, for the view of the cross section/front view of "spaghetti" or strand, on a roof of a building (e.g.):

- 1800: an embodiment comprising multiple optics pieces that when assembled create the void, for further concentration of light and/or containment of LC (e.g.). This optical piece comprises a top-piece and a bottom-piece, stacked on each other, to produce the void 1830, in between.
- 1801, 1802, 1803: top refracting surfaces of the optics for gathering Sun rays
- 1830: internal void structure to cause ray concentration, or for filling with a fluid to change n
- 1804: PV cell, element
- 1805, 1806: Use mirror or reflector at the edges of prism
- 1807, 1808: Use reflective coating sides of the void, and/or electrodes, to manipulate n for LC in the void, based on the applied voltage across the LC material in the void. The electrodes can be connected to the outside, e.g. power supply or source, (e.g.) through the wires or metal pieces mounted between the top-piece and the bottom-piece, at some intervals, along the length of the strands. (Another embodiment for the connection of the electrodes was explained above.)
- 1809, 1810: base support (e.g., extension of the optics)
- 1812: void/space created between the support bases (which is also used to house the PV)
- 1813, 1814: the extension of top optical piece to connect the cover to the lower piece (e.g., at the sides). These could support the optics, or the lower piece can support the optics.
- 1817, 1818: example of dimple/groove mechanism to snap the optical pieces together, as a module, for initial setup.
- 1815, 1816: example of tongue and groove for connecting the arrays/rows of strands together (neighboring strands)
- 1819: Curved bottom surface of optics, to further concentrate the rays onto the PV. (This could also be flat, but with Fresnel type structures/lens, to refract the rays.)

Note that a strand can be un-symmetric shape, in another embodiment, with respect to the middle of the void, e.g. to compensate for the orientation of the roof or panels, with respect to the Sun.

Figure 19A:
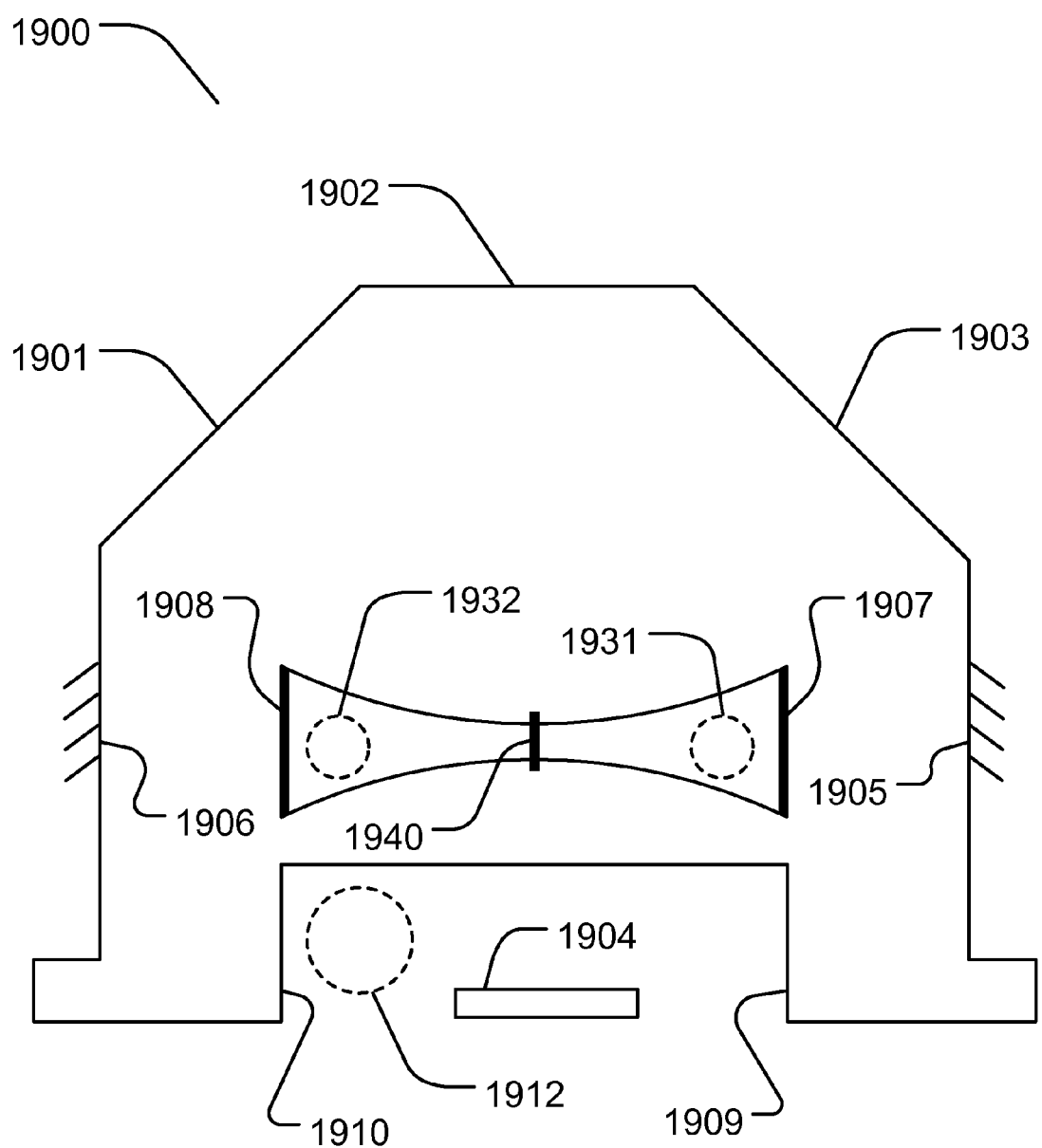
FIG. 19*a-b* shows cross section of a strand.

FIG. 19*a* shows an embodiment of the invention, with the following components or descriptions, for the view of the cross section/front view of "spaghetti" or strand, on a roof of a building (e.g.):

- 1900: an embodiment comprising (e.g. prism like) optics with multiple surfaces and voids
- 1901, 1902, 1903: top refracting surfaces of the optics for gathering Sun rays
- 1931, 1932: internal void structures to cause ray concentration. Also, for filling with a fluid to change n. Multiple void structures used here, to change n separately, within each void, to increase flexibility and produce un-symmetric n value for the optical piece, for different time of the day, in which the rays are not symmetric, with respect to the optical piece (or lens or concentrator), to compensate for that, for better focusing rays on the devices.
- 1904: PV cell, element
- 1905, 1906: Use mirror or reflector at the edges of prism
- 1907, 1908: Electrodes for changing n for LC, within the void, from the sides. Also, may be reflective coating, for keeping the rays confined in the small central area, for focusing better on the devices.
- 1909, 1910: base support (e.g., extension of the optics)
- 1912: void/space, created between the support bases. (also, used to house the PV)
- 1940: electrode, for voltage application, for changing n, e.g. for 2 different LC materials, each placed in one void, causing differential n values, between the 2 voids. (See the discussions above, for the application of this un-symmetric n values.) Here, item 1940 acts as a separator for a chamber, to make 2 chambers, out of the original/larger void. This example has two independent voltage difference controllers, one for each chamber/void. In another embodiment, one can leave one of the voids empty (of LC material) (i.e. full of air), to cause the differential in n values for the 2 chambers/void spaces, as an alternative, depending on the time of the day and/or year/seasons. In another embodiment, one can have a reflector for light here. In another embodiment, one can have a valve here, for opening between the 2 chambers.

Figure 19B:
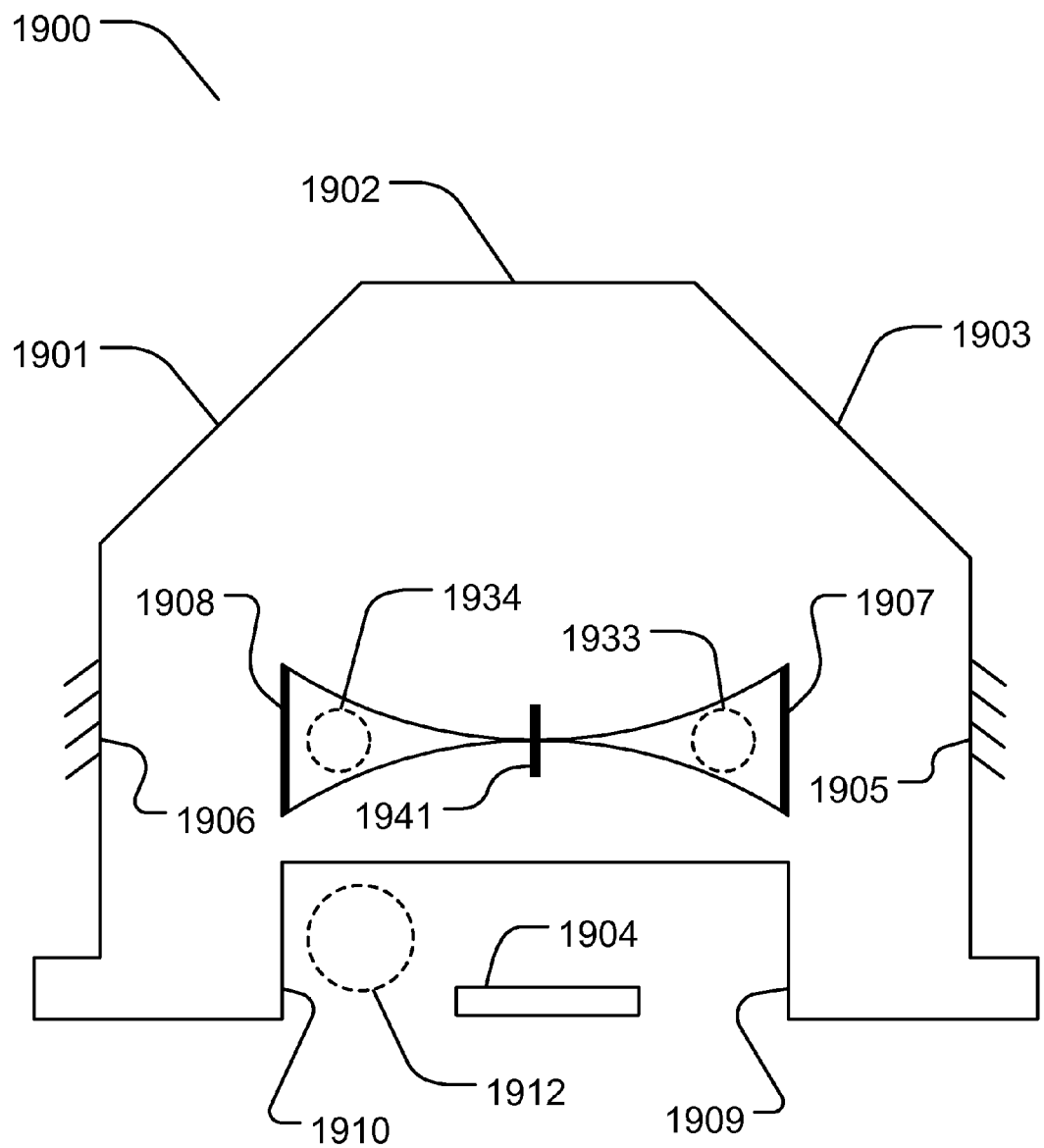

FIG. 19b shows an embodiment of the invention, with the following components or descriptions, for the view of the cross section/front view of "spaghetti" or strand, on a roof of a building (e.g.):

- 1900: an embodiment comprising (e.g., prism like) optics with multiple surfaces and voids
- 1901, 1902, 1903: top refracting surfaces of the optics for gathering Sun rays
- 1933, 1934: internal void structures to cause ray concentration. Also, for filling with a fluid to change n. Multiple void structures used to change the index separately within each void.
- 1904: PV cell, element
- 1905, 1906: Use mirror or reflector at the edges of prism
- 1907, 1908: Electrodes for changing n for LC within the void from the sides. Also, may be reflective coating.
- 1909, 1910: base support (e.g., extension of the optics)
- 1912: void/space created between the support bases, which is also used to house the PV.
- 1941: electrode for changing n for LC (e.g.), at both voids. (see above.) This example has two independent voltage difference controls. The 2 voids here are physically separated, by design/shape of the optics.

FIG. 21 shows an embodiment of the invention, with the following components or descriptions:

- 2100: Cross section of an embodiment of the invention
- 2104, 2105, 2106, 2107, 2108: Primary lenses that gather sun light (2130) from various directions. They are arranged on a curved surface, such as a circle.
- 2124, 2125, 2126, 2127, 2128: Secondary lenses that further direct the sun light (2132) gathered by the primary lenses. They are arranged in curved surface such as a circle. The circular surfaces of the primary and secondary lenses may have the same center.

In one embodiment, the lenses in secondary set correspond one to one to the lenses in the primary set (e.g., 2124 corresponds to 2104, and 2128 corresponds to 2108).

A light-guide (2110) (or light funnel, or condenser, e.g. using variable-n or graded-index n material, to guide the light toward inside) further directs the lights (2134) passed through the secondary lenses from its top surface (2112) and further guides them (2136) to its bottom surface (2114) and transmit the light (2138) onto the surface of PV (2116). The top surface of the light guide (2112) may be curved, to better capture the incident lights from various directions. The bottom surface of the light guide (2114) may be curved to further focus the light onto the PV (2116).

PV (2116) can be a solar cell, or it can be the entrance to a system of light gathering and focusing system.

In one embodiment, the distance (2140) (e.g., a radial distance) between the primary and secondary lenses is arranged to be approximately the sum of the focal lengths of the primary and secondary lenses. In such an embodiment, the parallel lights (2130) from sun come to about focus (2132) at the primary lens's (e.g., 2104) focal point. Being at close proximity of the focal point of the secondary lens (e.g., 2124), the light rays are refracted to near parallel (2134) by the secondary lens (2124) onto the light guide (2110) top surface (2112).

The outside side surface (2113) of the light guide may be coated by a reflecting material to help keep the light confined within the light guide and prevent it from escaping from its sides.

A notch filter is optional for all lenses. Another lens (e.g. microlens) can be placed at the location 2114, if needed, to focus for smaller devices. This acts as a non-mechanical self-tracking system (for Sun).

Figure 22A:
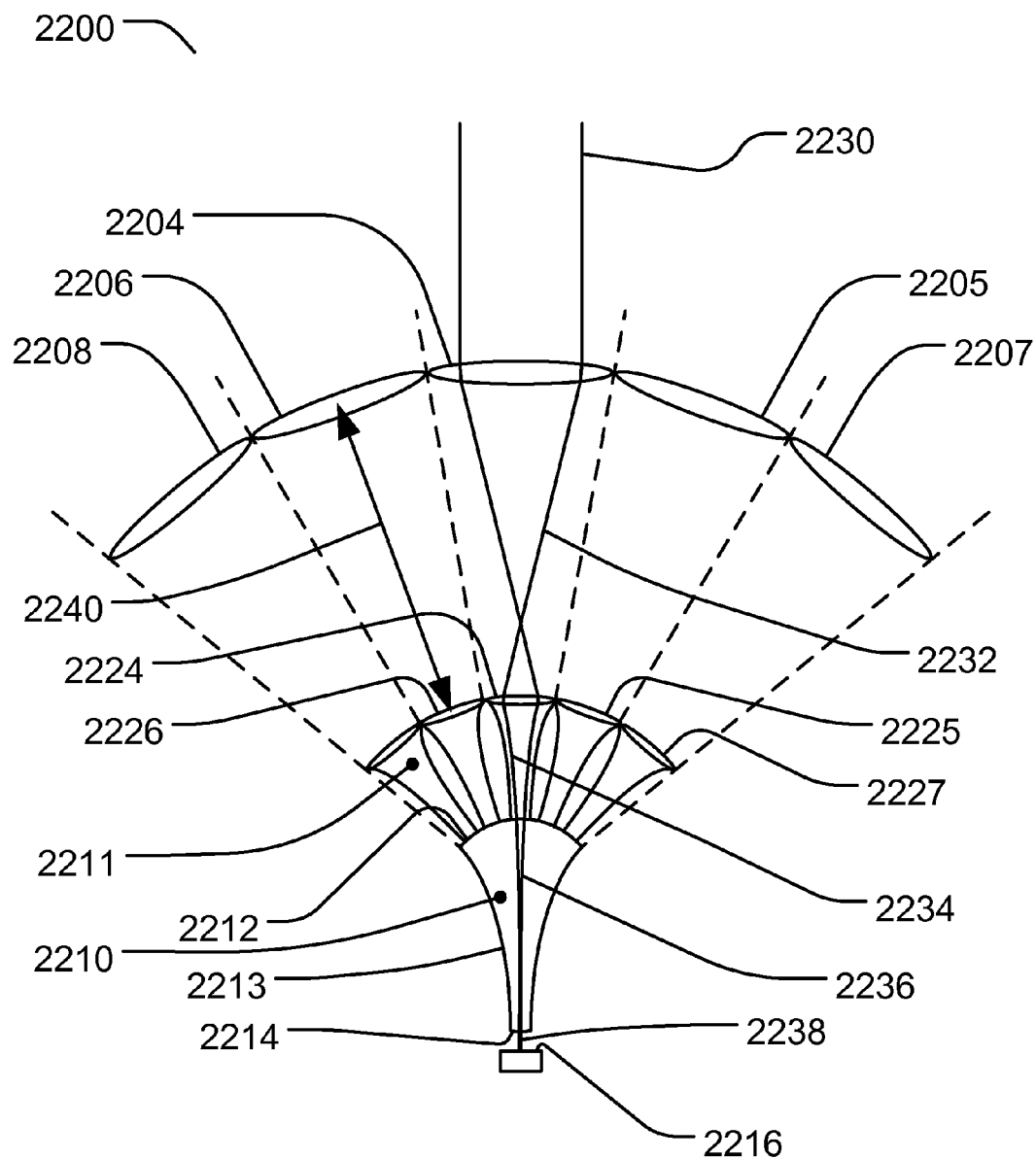
FIG. 22*a-b* shows funnel structure.

FIG. 22a shows an embodiment of the invention, with the following components or descriptions:

- 2200: Cross section of an embodiment of the invention
- 2204, 2205, 2206, 2207, 2208: Primary lenses that gather sun light (2230) from various direction. They are arranged on a curved surface such as a circle.
- 2224, 2225, 2226, 2227, 2228: Secondary lenses that further direct the sun light (2232) gathered by the primary lenses. They are arranged in curved surface such as a circle. The circular surfaces of the primary and secondary lenses may have the same center, for some embodiments.

In one embodiment, the lenses in secondary set correspond one to one to the lenses in the primary set (e.g., 2224 corresponds to 2204, and 2228 corresponds to 2208). Each of these secondary lenses is placed at the entrance of a light guide (2211). These light guides joined to the main light-guide (2210).

The light-guide (2210) further directs the lights (2234) passed through the secondary lenses from its top surface (2212) and further guides them (2236) to its bottom surface (2214) and transmit the light (2238) onto the surface of PV (2216). The top surface of the light guide (2212) may be curved to better capture the incident lights from various directions. The bottom surface of the light guide (2214) may be curved to further focus the light onto the PV (2216).

PV (2116) can be a solar cell or it can be the entrance to a system of light gathering and focusing system.

In one embodiment, the distance (2240) (e.g., a radial distance) between the primary and secondary lenses is arranged to be approximately the sum of the focal lengths of the primary and secondary lenses. In such an embodiment, the parallel lights (2230) from sun come to about focus (2232) at the primary lens's (e.g., 2204) focal point. Being at close proximity of the focal point of the secondary lens (e.g., 2224), the light rays are refracted converging rays (2236) by the secondary lens (2224) onto the light guide (2210) top surface (2212).

The outside side surface (2213) of the light guides may be coated by a reflecting material to help keep the light confined within the light guide and prevent it from escaping from its sides.

Figure 22B:
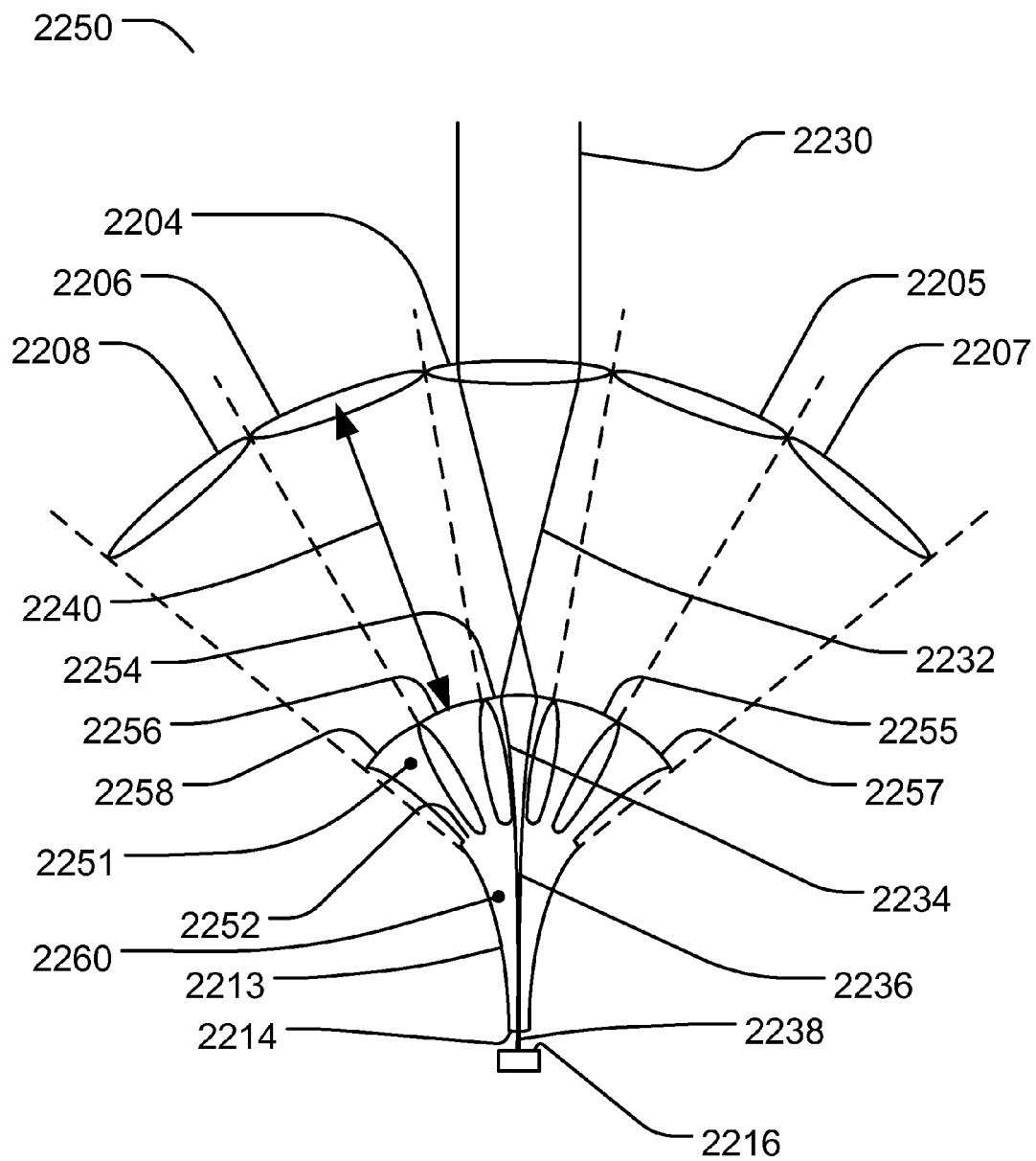

FIG. 22b shows an embodiment of the invention, with the following components or descriptions:

- 2250: Cross section of an embodiment of the invention
- 2204, 2205, 2206, 2207, 2208: Primary lenses that gather sun light (2230) from various directions. They are arranged on a curved surface, such as a circle.
- 2254, 2255, 2256, 2257, 2258: Integrated secondary lenses with light guide stem, that further direct the sun light (2232) gathered by the primary lenses. They are arranged in curved surface such as a circle. The circular surfaces of the primary and secondary lenses may have the same center, as an example.

In one embodiment, the integrated lenses in the secondary set correspond one to one to the lenses in the primary set (e.g., 2224 corresponds to 2254, and 2228 corresponds to 2258). Each of these secondary integrated lenses is at the entrance of a light guide (2251). These light guides are integrated into the main light-guide (2260).

The light-guide (2260) further directs the lights (2234) passed through the secondary lenses from its top surface (2212) and further guides them (2236) to its bottom surface (2214) and transmit the light (2238) onto the surface of PV (2216). The bottom surface of the light guide (2214) may be curved to further focus the light onto the PV (2216).

PV (2116) can be a solar cell, or it can be the entrance to a system of light gathering and focusing system.

In one embodiment, the distance (2240) (e.g., a radial distance) between the primary and the secondary integrated lenses is arranged to be approximately the sum of the focal lengths of the primary and secondary lenses. In such an embodiment, the parallel lights (2230) from sun come to about focus (2232) at the primary lens's (e.g., 2204) focal point. Being at close proximity of the focal point of the secondary integrated lens (e.g., 2224), the light rays are refracted converging rays (2236) by the secondary integrated lens (2254) onto the light guide (2260).

The outside side surface (2213) of the light guides may be coated by a reflecting material to help keep the light confined within the light guide and prevent it from escaping from its sides.

Figure 23A:
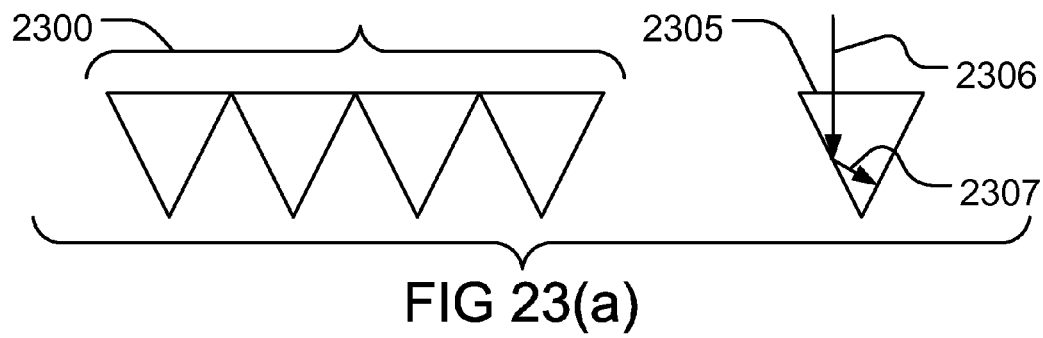
FIG. 23*a-c* shows side and top views of the matrix of optical devices or lenses.
Figure 23B:
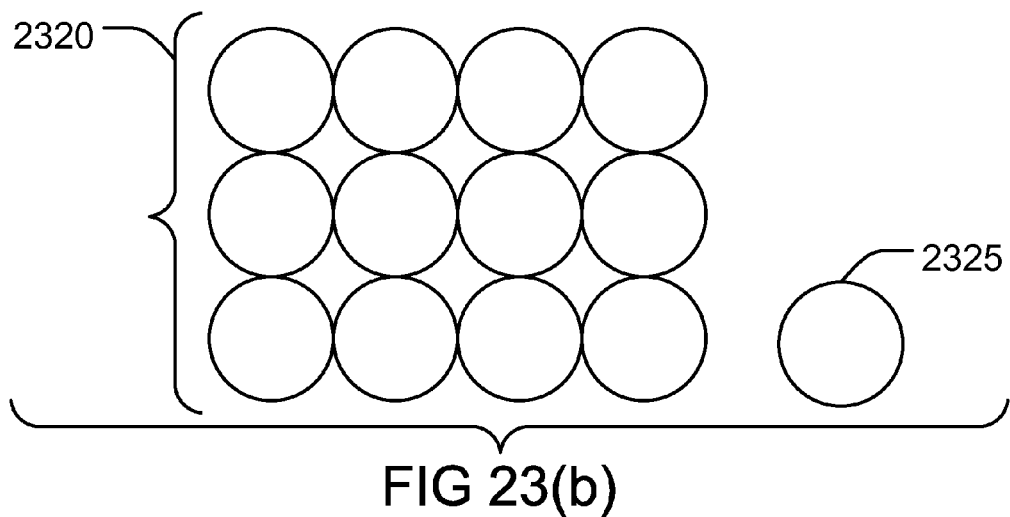
Figure 23C:
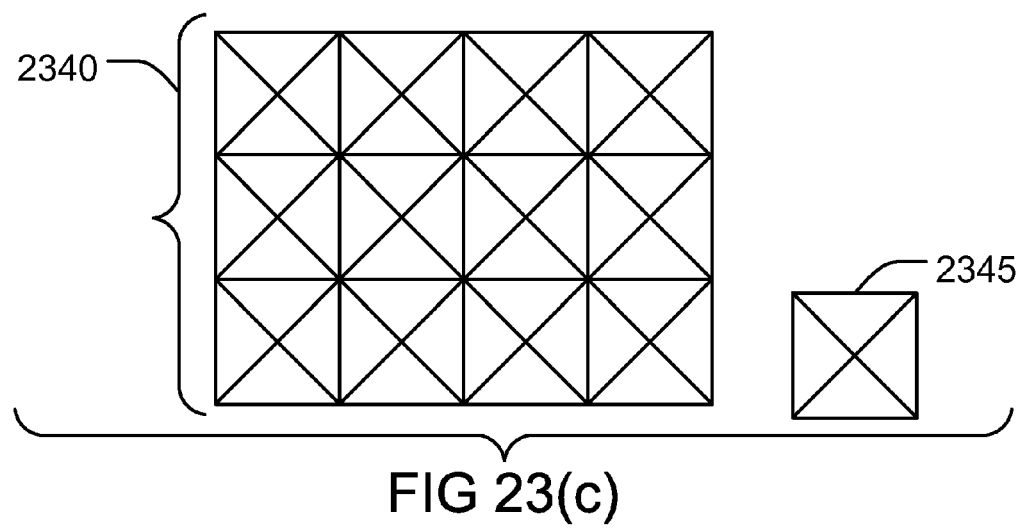

FIG. 23a-c show embodiments of the invention, with the following components or descriptions:

2300: Cross section of an embodiment of the invention. This cross section shows the following:
a side view of a matrix of individual PV cells (2305) arranged in a way to minimize the gap between PV cells (2305). This cross section (2305) can be a cross section of a PV cell in the shape of inverted cone (2325) or inverted pyramid (2345).

2320: Top view of one embodiment with a cross section shown in 2300 (diameter of 2R), as inverted cone 2340: Top view of another embodiment with a cross section shown in 2300, as inverted pyramid By adding a third dimension (depth) to a conventional flat PV cell, for example changing a circle to an inverted cone or a square to an inverted pyramid, the absorption of the energy of the incident light (2306) can be increased due to light trapping which happens when the unabsorbed portion of the incident light is reflected (2307) to another area of the PV cell. The closely packed structure has a better and higher efficiency for collection of the light.

Figure 24A:
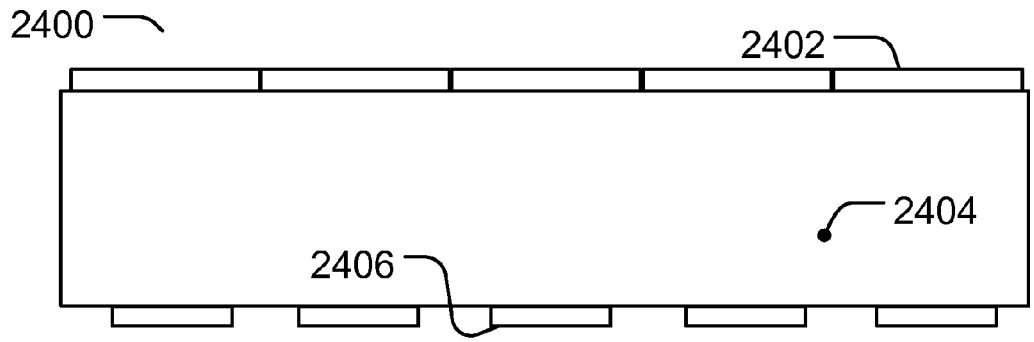
FIG. 24*a-c* shows side and top views of the matrix of optical devices or lenses.
Figure 24B:
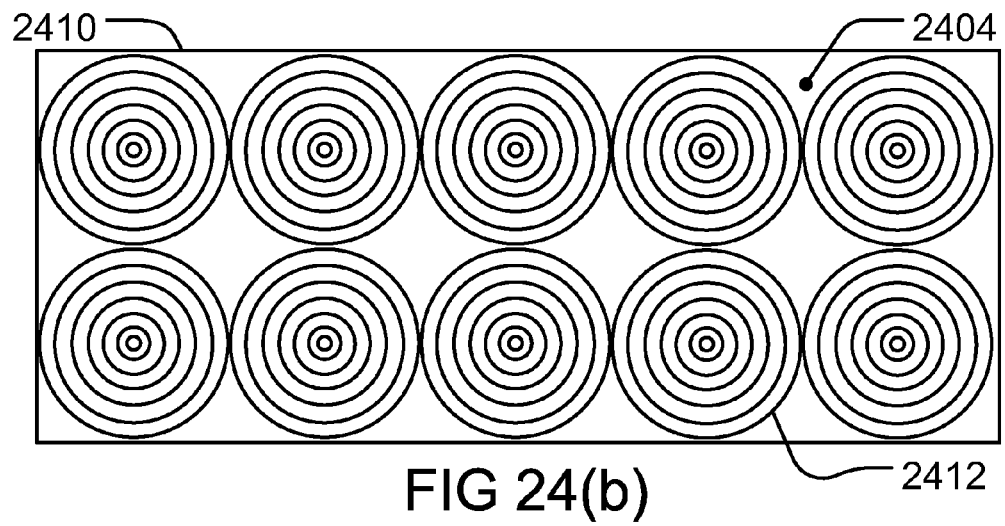
Figure 24C:
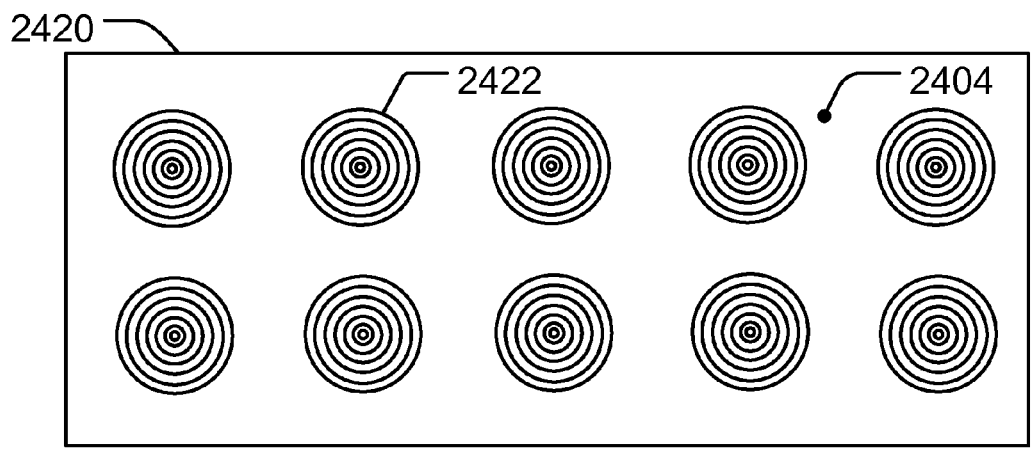

FIG. 24a-c show embodiments of the invention, with the following components or descriptions:

2400: Cross section of an embodiment of the invention. This cross section shows:
a side view of an optical system with three components: A) a matrix of individual primary lenses (2402) arranged in a configuration to maximize the overall collection and concentration of the sunlight in accordance with PV system design. B) a matrix of individual secondary lenses (2406) arranged in a way to maximize the overall collection and concentration of the sunlight in accordance with PV system design. C) a transparent medium (2404) with very low light absorption property, with its thickness can be calculated based on the overall optical design. In one embodiment, the thickness of medium (2404) is arranged to be approximately the sum of the focal lengths of the primary and secondary lenses.

(2410): Top view of an embodiment of the invention. A matrix of individual primary lenses (2412) arranged in a predetermined configuration. The medium (2404) can act as a mechanical support for keeping the primary lenses in place.

(2420): Bottom view of an embodiment of the invention. A matrix of individual secondary lenses (2422) arranged in a predetermined configuration set to further concentrate the light that is concentrated from the primary lenses onto the secondary lenses. The medium (2404) can act as a mechanical support for keeping the secondary lenses in place.

Figure 24D:
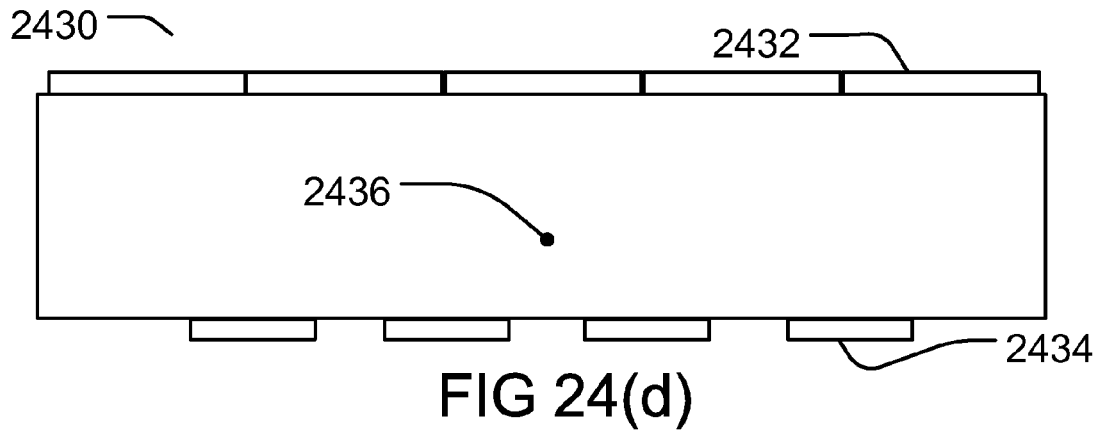
FIG. 24*d-f* shows side and top views of the matrix of optical devices or lenses.
Figure 24E:
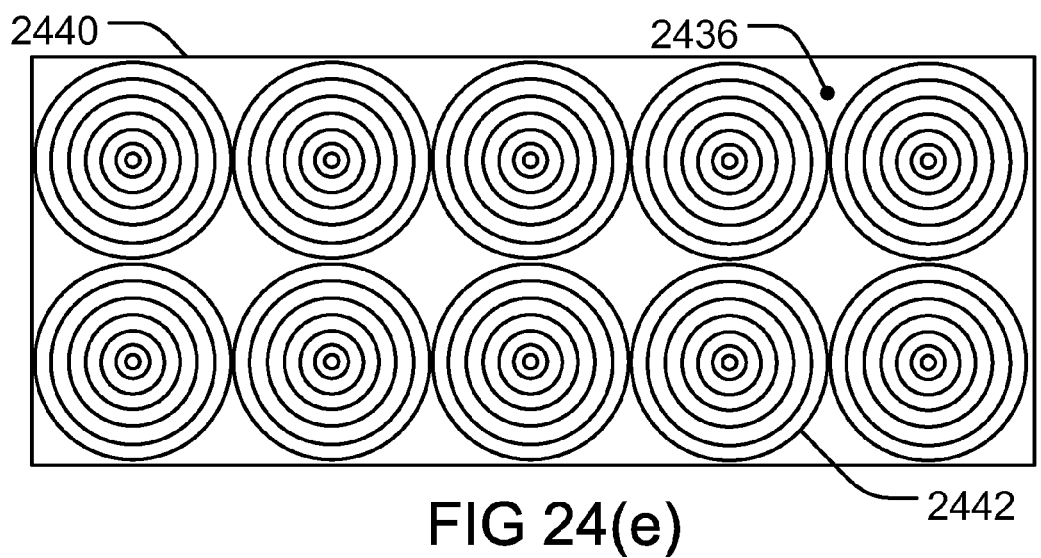
Figure 24F:
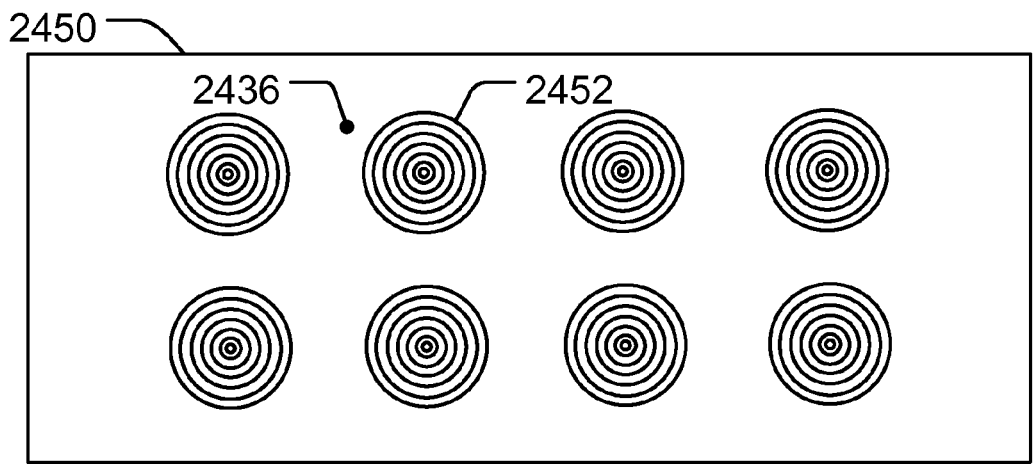

FIG. 24d-f show embodiments of the invention, with the following components or descriptions:

2430: Cross section of an embodiment of the invention. This cross section shows:
a side view of an optical system with three components: A. a matrix of individual primary lenses (2432) arranged in a configuration to maximize the overall collection and concentration of the sunlight in accordance with PV system design, B. a matrix of individual secondary lenses (2434) arranged in a way to maximize the overall collection and concentration of the sunlight in accordance with PV system design, C. a transparent medium (2436) with very low light absorption property, its thickness can be calculated based on the overall optical design. In one embodiment the thickness of medium (2436) is arranged to be approximately the sum of the focal lengths of the primary and secondary lenses.

(2440): Top view of an embodiment of the invention. A matrix of individual primary lenses (2442) arranged in a predetermined configuration. The medium (2436) can act as a mechanical support for keeping the primary lenses in place.

(2450): Bottom view of an embodiment of the invention. A matrix of individual secondary lenses (2452) arranged in a predetermined configuration set to collect and concentrate the light that falls between the primary lenses. These secondary lenses will also capture the light that diffuses away from the primary lenses as it passes towards the secondary lenses. The medium (2436) can act as a mechanical support for keeping the secondary lenses in place. Note that configurations of 24a and 24d are different, in the relative positions of the secondary lenses (2452), as shown in the figures.

Figure 24G:
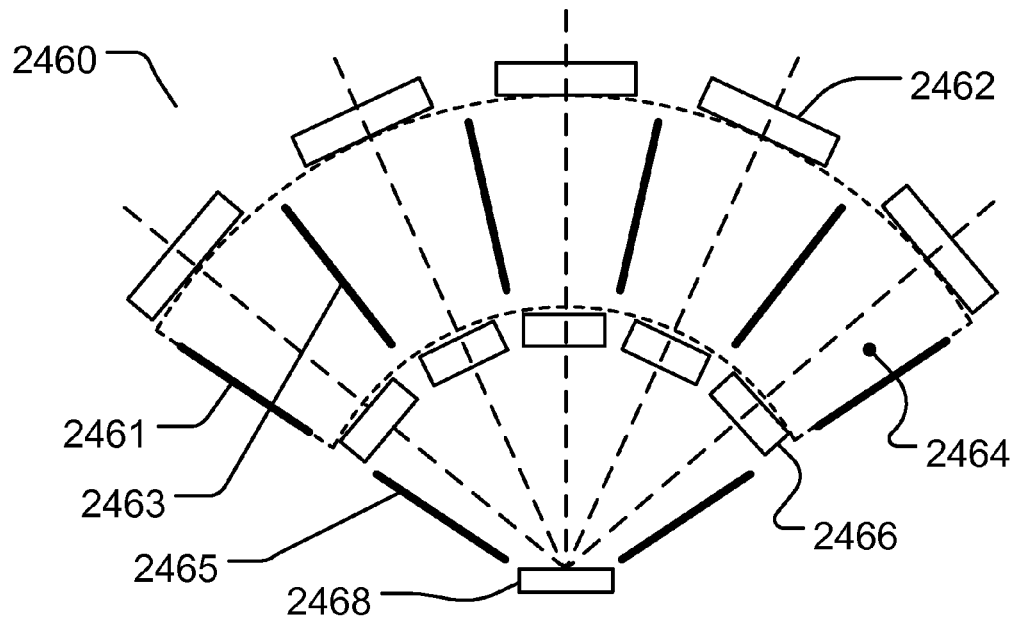
FIG. 24*g-h* shows assembly of optical devices or lenses.
Figure 24H:
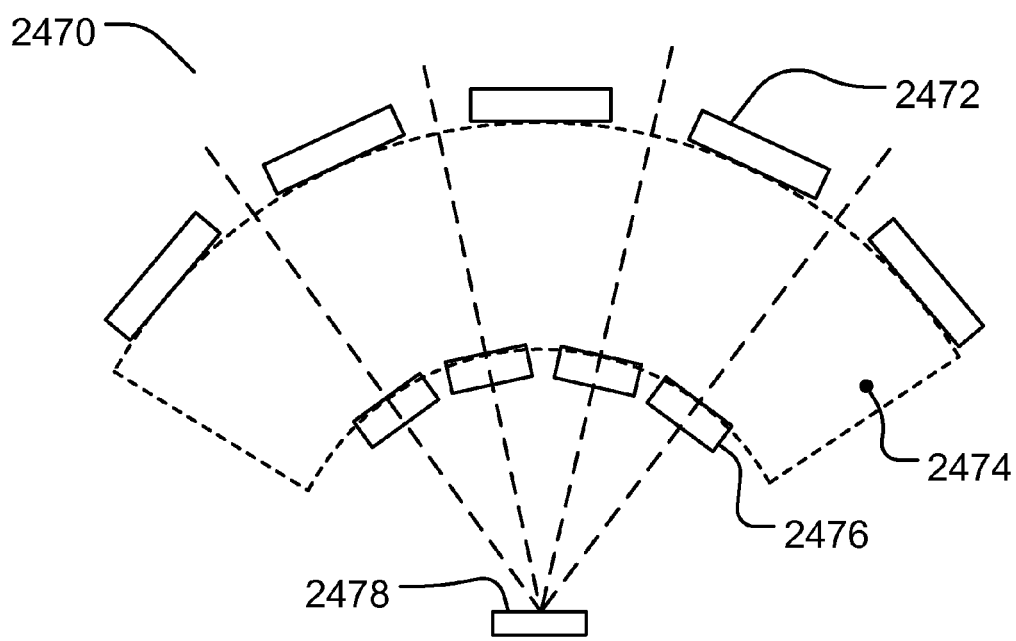

FIGS. 24g-h show embodiments of the invention, with the following components or descriptions:

2460: Cross section of an embodiment of the invention. This cross section shows:
a side view of the optical system shown in FIG. 24(a), in an application as an integral part of a PV concentrator system. Primary lenses (such as 2462) gather sun light from various directions. In this embodiment, they are arranged on a curved surface such as a circle. Secondary lenses (such as 2466) further direct the sun light gathered by the primary lenses. In this embodiment, the secondary lenses follow the same curved surface as the primary lenses, because they are affixed on the medium (2464, e.g. elastic or rigid; bent or straight; hollow or solid; transparent or translucent material). In this embodiment, the lenses in the secondary set correspond one to one to the lenses in the primary set. The light passed through secondary lenses is focused onto the surface of PV (2468).

2470: Cross section of an embodiment of the invention. This cross section shows:
a side view of the optical system shown in FIG. 24(b) in an application as an integral part of a PV concentrator system. Primary lenses (such as 2472) gather sun light from various directions. In this embodiment, they are arranged on a curved surface such as a circle. Secondary lenses (such as 2476) further direct the sun light gathered by the primary lenses. In this embodiment, the secondary lenses follow the same curved surface as the primary lenses, because they are affixed on the medium (2474). In this embodiment, the lenses in the secondary set correspond one to one to the gap between the lenses in the primary set. The light passed through secondary lenses is focused onto the surface of PV (2478).

2461: reflective coating or mirror (between primary and secondary levels), to keep more light in

2463: double-coated mirror or reflector (between primary and secondary levels), to keep more light in

2465: reflective coating or mirror (between secondary level and PV or subsequent light guide before PV)

Figure 24I:
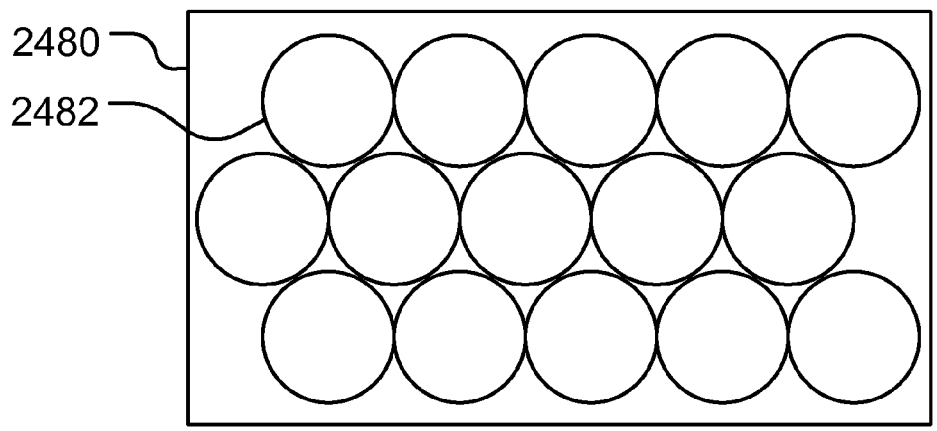
FIG. 24*i-k* shows top views of the matrix or rows of optical devices or lenses.
Figure 24J:
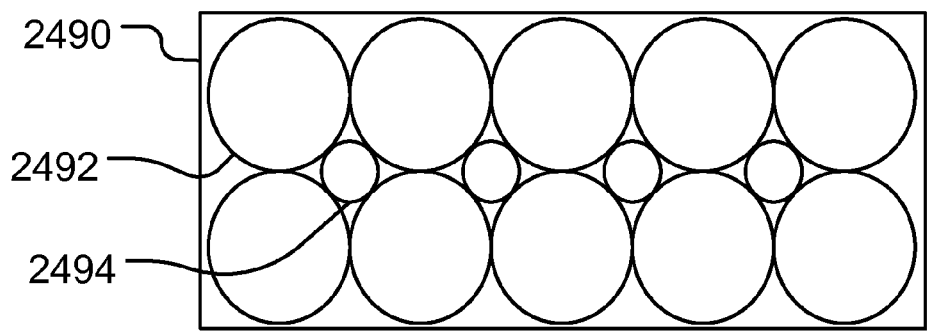
Figure 24K:
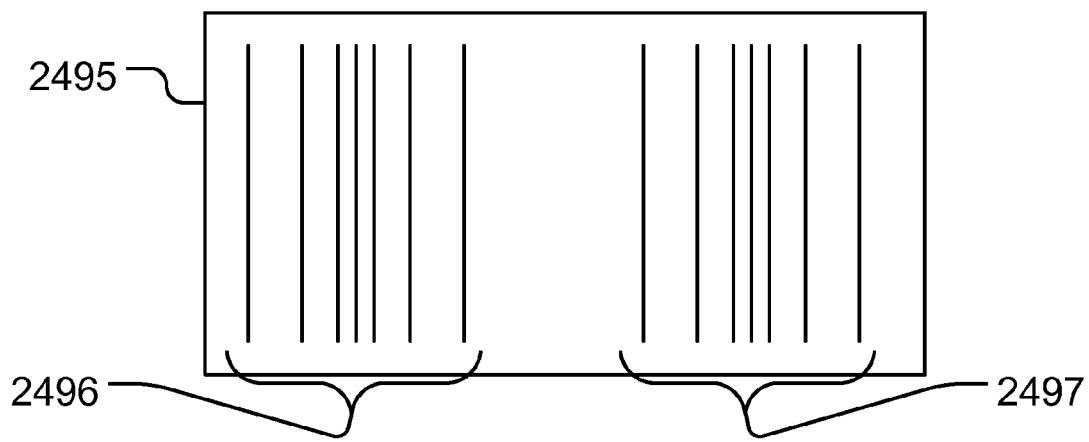

FIGS. 24*i-k* show embodiments of the invention, with the following components or descriptions:

2480: Top or bottom view of an embodiment of the invention. In this embodiment, all the lenses (primary or secondary) have same sizes (2482).

2490: Top or bottom view of an embodiment of the invention. In this embodiment, the lenses (primary or secondary) have different sizes (2492) and (2494) to achieve maximum packing density.

2495: Top or bottom view of an embodiment of the invention. In this embodiment, the lenses (primary or secondary) are elongated spaghetti or strand Fresnel lenses (2496, 2497).

Figure 25A:
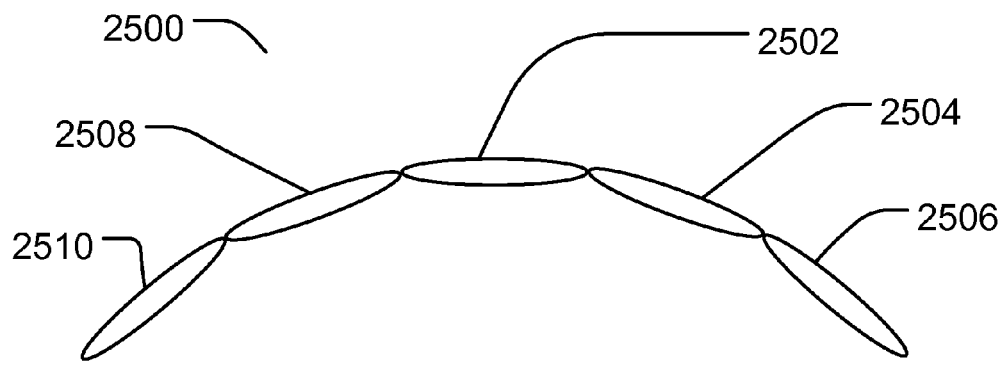
FIG. 25*a-b* shows side and top views of the matrix of optical devices or lenses.
Figure 25B:
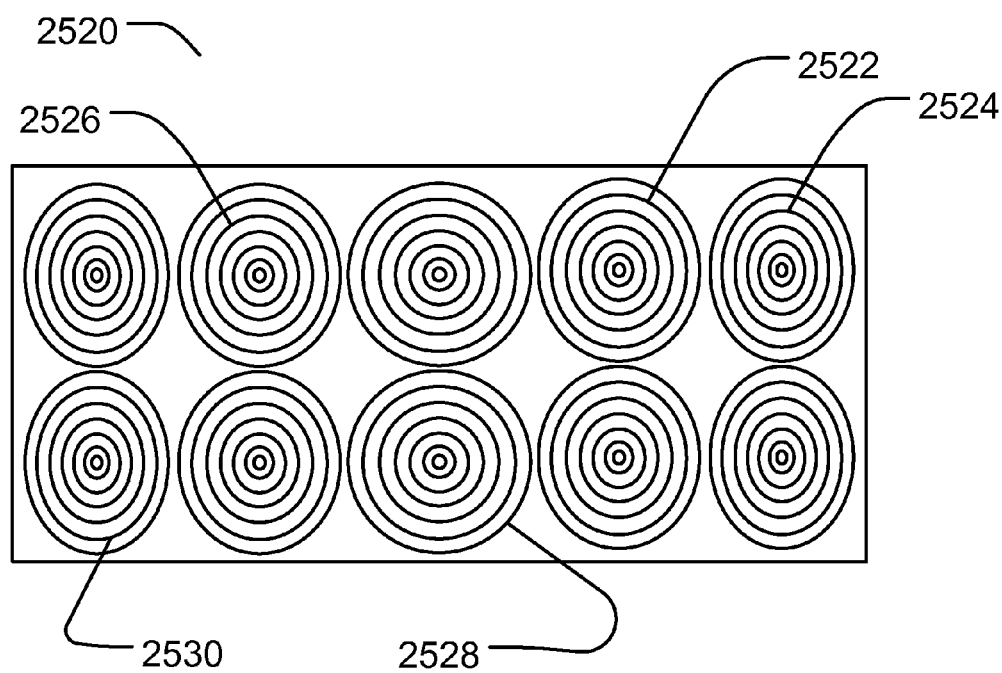

FIGS. 25*a-b* show embodiments of the invention, with the following components or descriptions:

2500: Cross section of an embodiment of the invention which shows a plurality of optical lenses (2502, 2504, 2506, 2508, and 2510) arranged according to needed requirement: the shape, area coverage, and packing density of the PV cells at the receiving end of the converged sunlight can dictate the shape, area coverage and packing density of these optical lenses. Optical lenses can be any physical system which can converge the incident light, such as plastic lens, glass lens, Fresnel lens or a combination of individual pyramids.

2520: Cross section of an embodiment of the invention which shows a plurality of optical lenses (2522, 2524, 2526, 2528, and 2530) arranged according to needed requirement: the shape, area coverage, and packing density of the PV cells at the receiving end of the converged sunlight can dictate the shape, area coverage and packing density of these optical lenses. Optical lenses can be any physical system which can converge the incident light, such as plastic lens, glass lens, Fresnel lens or a combination of individual pyramids.

Figure 27:
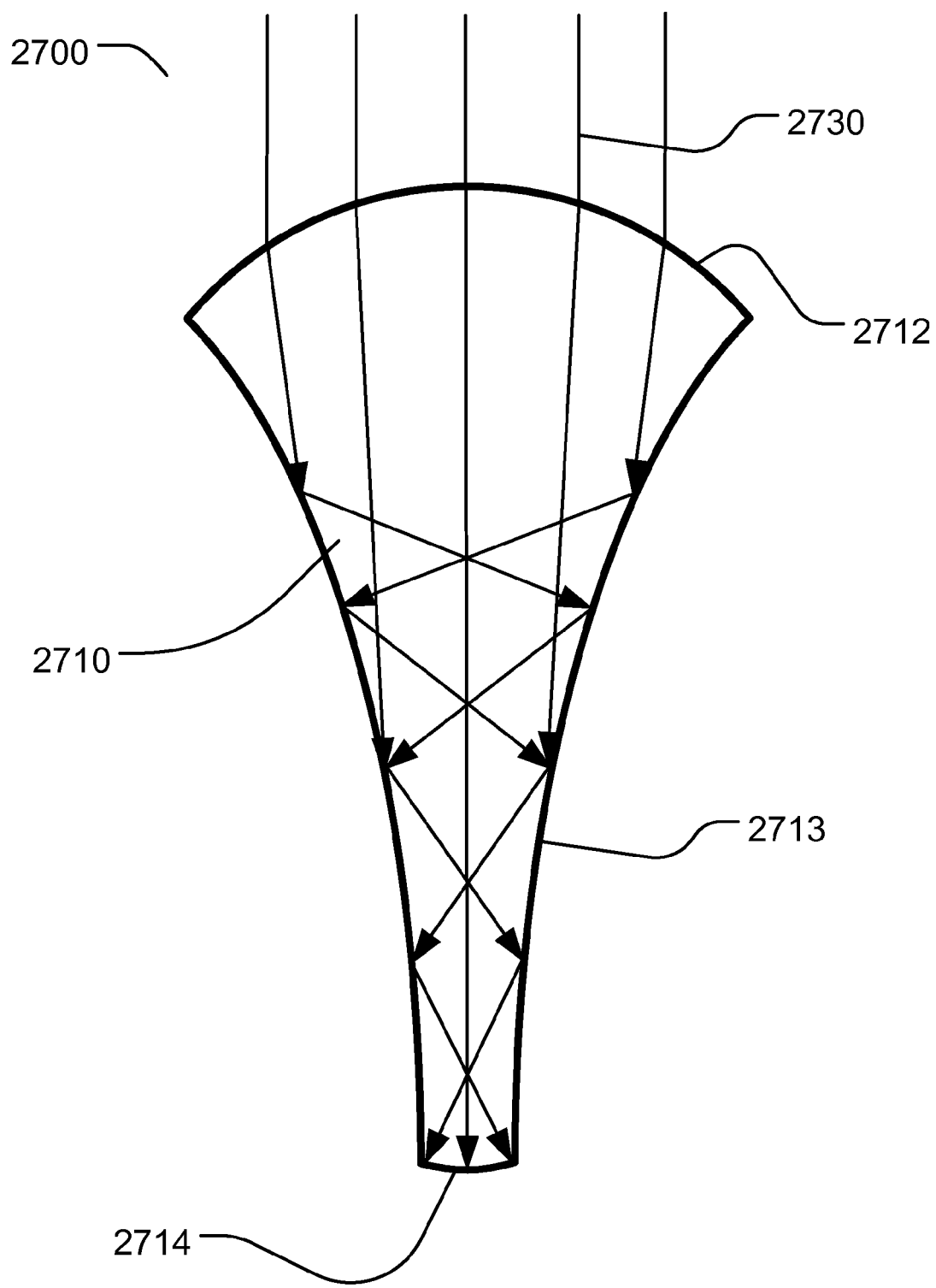
FIG. 27 shows funnel structure.

FIG. 27 show an embodiment of the invention, with the following components or descriptions:

2700: Cross section of an embodiment of the invention (light guide or condenser)

A light-guide (2710) directs the light (2730) passing through its top surface and guides it to its bottom surface. The top surface of the light guide (2712) may be curved to better capture the incident light from various directions. The bottom surface of the light guide (2714) may be curved to further focus the light.

The light-guide can be implemented by a plurality of hundreds of fiber optics elements. It can also be made using standard material or materials with varying refractive indices.

The outside side surface (2713) of the light guide may be coated with a reflecting material to help keep the light confined within the light guide and prevent it from escaping from the sides.

Figure 28:
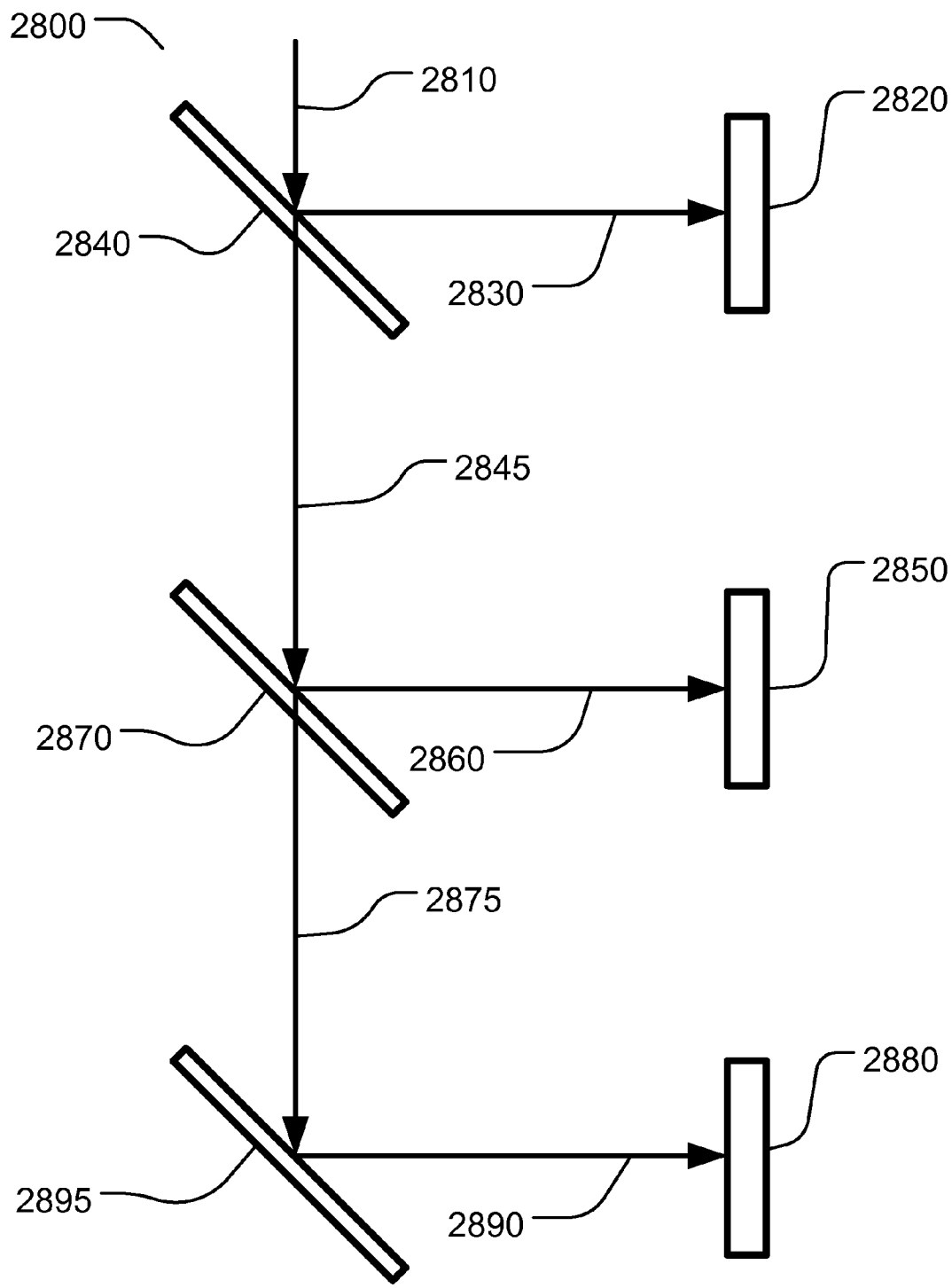
FIG. 28 shows splitting scheme.

FIG. 28 show an embodiment of the invention, with the following components or descriptions:

2800: A schematic diagram of an embodiment of the invention. Light (2810) coming into this system can be a concentrated sunlight exiting any of the optical systems which were shown in our other embodiments. The light (2810) can also be sunlight without any concentration. The light (2810) which consists of a wide spectrum of wavelengths, passes through filter/mirrors (2840), (2870), and (2895), consecutively.

Filter/Mirror (2840) is designed in a way that reflects wavelengths which constitute rays (2830). The rays (2830) hit the surface of the PV Cell (2820). The material of PV Cell (2820) and its design are in such a way that PV Cell (2820) efficiency is maximum for rays (2830), compared to the remaining wavelengths in sunlight, due to its bandgap of the device semiconductor matching the energy of the electromagnetic wave at that wavelength or frequency, for the proper/efficient absorption of the photon energy.

The non-reflected portion of the light (2810) exits the filter/mirror (2840) as rays (2845).

Filter/Mirror (2870) is designed in a way that reflects wavelengths which constitute rays (2860). The rays (2860) hit the surface of the PV Cell (2850). The material of PV Cell (2850) and its design are in such a way that PV Cell (2850) efficiency is maximum for rays (2860) compared to the remaining wavelengths in sunlight.

The non-reflected portion of the light (2845) exits the filter/mirror (2870) as rays (2875).

Filter/Mirror (2895) is designed in a way that reflects rays (2875) as rays (2890) towards PV Cell (2885). The rays (2890) hit the surface of the PV Cell (2885). The material of PV Cell (2885) and its design are in such a way that PV Cell (2885) efficiency is maximum for rays (2890) compared to the remaining wavelengths in sunlight, for higher relative efficiency of conversions for the solar cells with different materials and bandgaps.

In this invention, there is generally no limitation in the number of Filter/mirrors and PV cells (and their physical arrangement). What is shown in FIG. 28 is just one simple embodiment, for teaching the concept. (An alternative is to use a grating with several focal points (prism-like).)

Figure 7A:
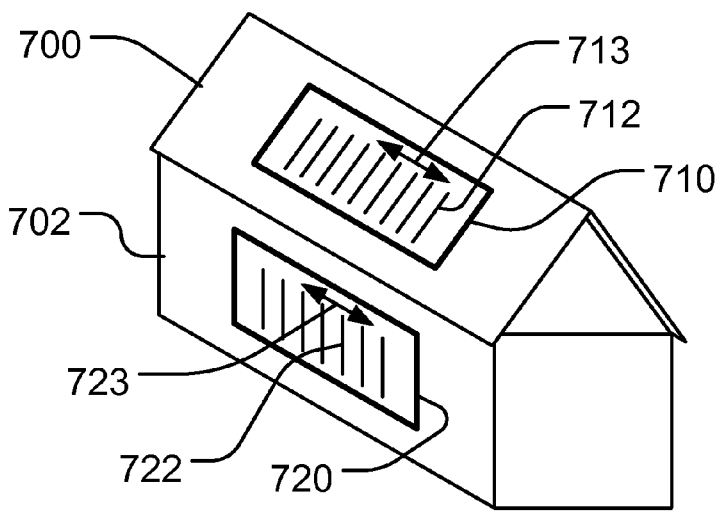
FIG. 7*a-c* shows patterns of strands.
Figure 7B:
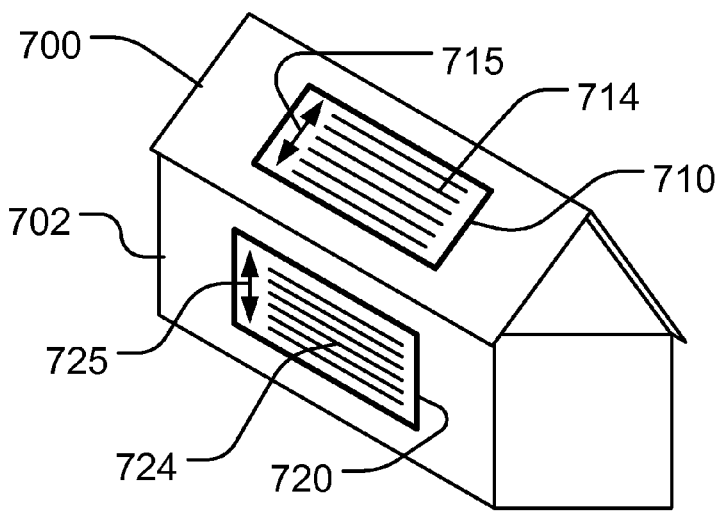
Figure 7C:
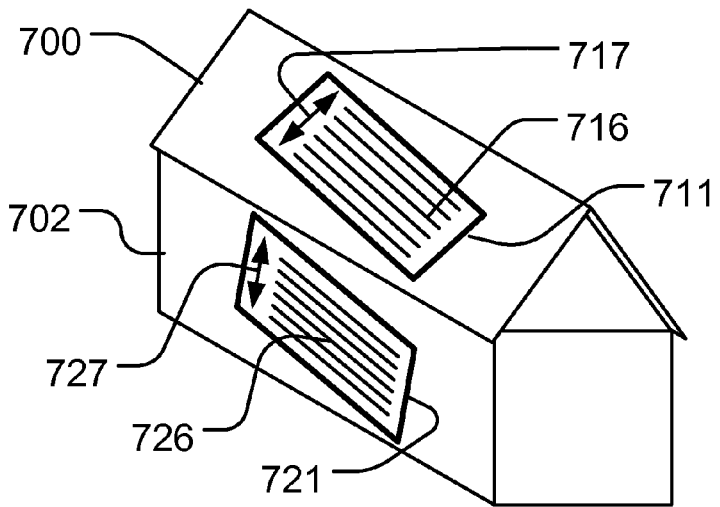

FIGS. 7*a-c* show embodiments of the invention, with the following components or descriptions. These figures show sliding between PV and optics (e.g., one stationary with respect to the frame), for wall, roof, inclined mounting, or mounting in an angle:

700: Roof
702: Wall
710: Frame mounted on the roof
720: Frame mounted on the wall
711: Frame mounted with an angle on roof
721: Frame mounted with an angle on wall
712, 722, 714, 724, 716, 726: Spaghetti or strand
713, 723, 715, 725, 717, 727: Direction of relative movement.

FIGS. 8*a-c* show embodiments of the invention, with the following components or descriptions. FIG. 8*a* shows honeycomb design for roof cover. FIG. 8*b* shows other patterns or tiles for the roof/wall coverage, or mixture of patterns (e.g. different sizes and shapes, e.g. rectangular, square, or hexagon, e.g. with different aspect ratios). FIG. 8*c* shows different patterning schemes/tiling procedures/methods, e.g. different patterns made up of irregular shapes, as well as regular shapes.

800: Roof
810: Frame
812, 814, 816: spaghetti or strands, within each frame, may be running in various directions.

Figure 9A:
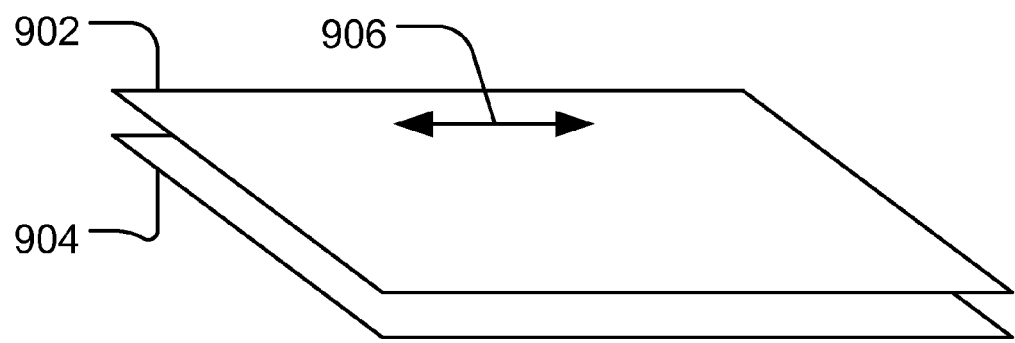
FIG. 9 *a-b* shows movement of planes with respect to each other.
Figure 9B:
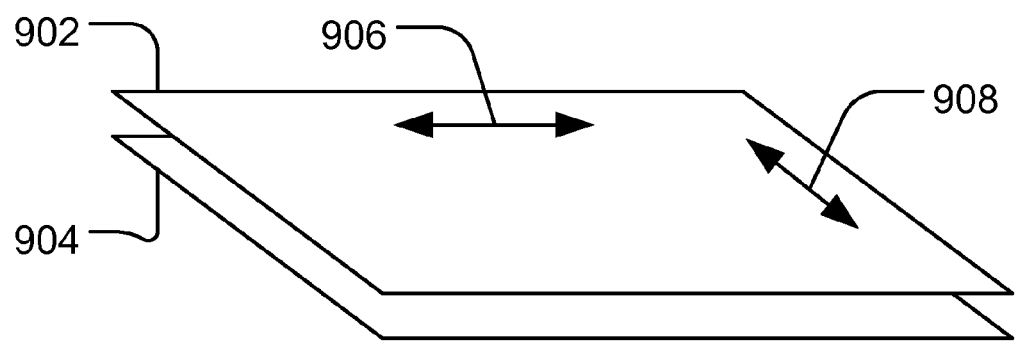

FIGS. 9a-b show embodiments of the invention, with the following components or descriptions. This shows relative lateral movement of the planes (e.g.) in two dimensions, for PV and optics planes, e.g., 0.5 inches of movement in 6 hrs (single axis translation). The movement is done for the purpose of tracking, focusing, or compensation. In one embodiment, the original movement is slow, and shifting back to the starting point for next day is also slow. Note that the starting points for different days are slightly different, due to change of season. In another embodiment, the original movement is slow, and shifting back to the starting point for next day can be fast (for the cases that the compensation is only one way and one direction), or this can be done during the night, when there is no/little light absorption/usage for the solar cells. (An example is a two-axis translation for non-array (single strand) movement arrangement.)

902, 904: PV and optics planes
906, 908: relative lateral movement of the planes in two dimensions.

FIGS. 10a-c show embodiments of the invention, with the following components or descriptions. This is the PV plane's shift/movement, with respect to the (stationary) frame. It is a relative shift, and thus, it can be applied to any relative shift and movement, e.g. frame, PV plane, or optical plane.

1002: Optics (e.g., top optics)
1003: PV
1004: PV plane
1010, 1012, 1014: Sun rays incident on the optics, at various angles, during the day, for a given Sun path and relative direction to the strands.

Note that shifting the PV plane (1006, 1008) compensates for the incident angle in order to increase PV output.

In some embodiment, the major angle deviation in Sun path (azimuth angle) is compensated along the strand (e.g., when sun moves from east to west across the sky). (While the PV plane movement compensates for variation in inclination of Sun rays during the day.)

FIG. 11 shows an embodiment of the invention, with the following components or descriptions. This is a relative movement of PV plane with respect to others (e.g. with respect to optics plane or with respect to frame). So, it can be applied to any other movement and plane/frame, in general. The energy for this action can come from the PV itself, to get energy for sliding, or from a battery (chargeable via PV or grid), or use a change of temperature to wind a spring for moving (e.g.), or use gravity, e.g. alcohol evaporation/condensation, to convert to mechanical energy (e.g. a piston). The movement or speed of movement may be non-uniform with time, in one embodiment, using feedback and a controller. The adjustments are for seasonal (periodic) adjustments, and daily movement of Sun in the sky (translational adjustments).

Movement of PV plane (1120) is done by a step motor.
Optics (1105) attached to frame (1104), while PVs (1106) are positioned on (1108) PV support plane.
1110: railing on the PV support plane to support PV plane movement.
1112: Gear/step motor (or using string/cable/chain/or similar mechanism)
Example of locking mechanism for movement using a lock (1114) and spring (1116). (In one example, lock/release mechanism is accompanied with the winding/timing mechanism.)
1118 is a pre-loaded spring to support the lateral projection PV plane weight, to reduce wear and tear on the step motor, and reduce its power requirement. The loading may be done at the installation or factory, based on the plate angle and movement direction.
Preloaded force~(m g sin($a_{plate}$)), for the gravity forces on inclined surfaces (for spring), with ($a_{plate}$) as the angle of the inclined surface, m as the mass of the PV support plane (moving component), and g as the gravitational constant.

Figure 12A:
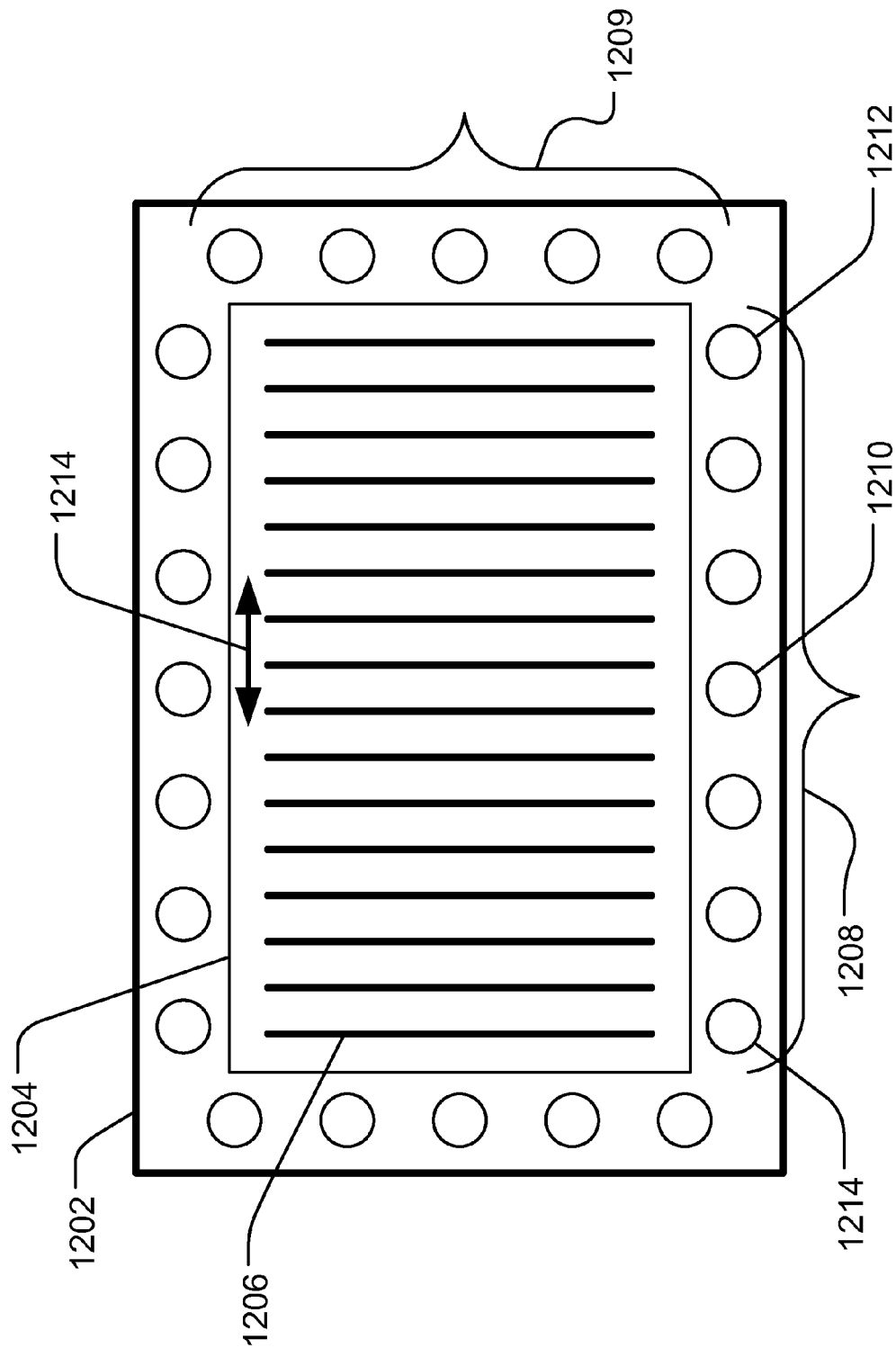

FIG. 12a shows an embodiment of the invention, with the following components or descriptions. It shows the top view:
1202: frame and/or optics fixture
1204: PV support plane (moveable), e.g., along 1214
1206: PV strands located on PV plane
1208 or 1209: Series of optical sensors (e.g., PV) located at the frame side (for example) or attached to the frame.
Example: 1210, 1212, 1214: form the middle and ends of the series.

The sensor is arranged to have a pre-determined misalignment of its PV to its optics, and the misalignment is varies across the series from positive to negative, with that of middle sensor having zero (no misalignment). The series act as Sun ray tracker, when the incident angle compensates for the misalignment, and a sensor in the series will be at its optimum output. The output of the sensors are fed into a comparator and subsequently fed into the step motor for adjusting the location of the PV plane, so that the PV strands will be at their optimum output. The middle sensor is calibrated to be in synch with the strands at the zero movement location. This zero location may be adjusted daily, weekly, monthly, or seasonally, as the sun angle range varies throughout the year, hence, the zero location adjustment.

The adjustments can be done using a conventional controller and feedback from detectors, as explained further in FIGS. 12b-d. FIG. 12b-d show embodiments of the invention, with the following components or descriptions. Using same numbers as before:
1208, 1212, 1210, 1214 for series of optical sensors
1202 Fixed location (e.g., frame)
1203, 1205, 1207 are the detectors (e.g., PV) for the corresponding optical sensors, 1210, 1212, 1214, but misaligned with respect to their optics. For example, the pitch (separation) of the optics for sensors ($P_O$) is less than the pitch for the detectors ($P_D$).

For rays incident at various angles (1230, 1232, 1234) (as in FIGS. 12b-d), the various detectors give maximum signal (1203 in 12b, 1205 in 12c, 1207 in 12d), as the incident rays at angles shift the convergence points from the center line, and the misalignment of a sensor's detector can compensate for shifting of the convergence region. Given the profile (e.g., the maximum) of the sensor outputs, the incident ray angle may be determined. This is the similar concept as Vernier Caliper device for accurate measurement. One can use a negative feedback to optimize/adjust the relative position, using a motor or similar mechanism, mentioned elsewhere in this disclosure. Thus, one can optimize with minimum movement of the planes with respect to each other, to save time and money.

FIG. 12e shows an embodiment of the invention, with the following components or descriptions. Using same numbers as before:
1208, 1212, 1210, 1214 for series of sensors
1202 Fixed location (e.g., frame)
1203, 1205, 1207 are the detectors (e.g., PV) for the corresponding optical sensors, 1210, 1212, 1214, but misaligned with respect to their optics. For example, the pitch (separation) of the optics for sensors ($P_O$) is less than the pitch for the detectors ($P_D$).

Output of the sensors (center—no misalignment, and off-center—misaligned) are fed into a logic system, e.g., a comparator, which drives the stepper motor controller or drive.

Given the profile (e.g., the maximum) of the sensor outputs, the incident ray angle may be determined.

FIG. 13a-c show embodiments of the invention, with the following components or descriptions. This shows the light shifting by a glass slab, held in an angle. This refers to the thickness of slab, times a function, which is dependent on n, incident angle, and pivot angle, for the slab rotation:

Shift~thickness·Function(n, incident angle, pivot angle)

- 1302: Optics (e.g., top optics)
- 1303: PV
- 1304: PV plane
- 1330: pivot point for the refractor slab
- 1332: refractor slab (e.g., glass)
- 1310, 1312, 1314: Sun rays incident on the optics at various angles during the day for a given Sun path and relative direction to the strands.
- Shifting the rays (1320, 1322) by refractor slab (1332) by pivoting (1330) the slab in an angle with respect to the incident light. The shift helps to compensate for the angle of the incident light in order to increase PV output.

For example, the light shifting by the glass slab held in an angle is:

Shift~thickness·Function(n, incident angle, pivot angle)

$$Q = T \cdot \sin(a+p-b)/(\cos(a)\cdot\cos(b))$$

where Q is the shift, and T is thickness.

a: incident ray angle (relative to normal to PV plane, assume positive in FIG. 13(b)).

p: pivot angle (assume positive in FIG. 13(b)).

b: refracted angle, with respect to the normal to the surface of the slab, inside the slab.

$$b = \sin^{-1}(\sin(a+p)/n).$$

In some embodiments, the major angle deviation in Sun path (azimuth angle) is compensated along the strand (e.g., when sun moves from east to west across the sky). (While the shift by the refractor slab helps to compensate for variation in inclination of Sun rays during the day.) This type of shift can be combined with shifting of the PV plane movement, relative to the optics. Similar stepper motor (or shared motor) and gears may be used to control pivoting of the refractor slabs. (One refractor per strand (of multiple of strands).) (An example is a transparent plate (e.g., glass slab).)

FIG. 14a-d show embodiments of the invention, with the following components or descriptions. Similar light bending via prism refraction (14(a) and 14(c)) may be implemented by series (1422, 1423) of slabs of varying refraction index. (For example, slabs 1430 to 1432 having their index of refraction decreasing in that order. While, slabs 1431 to 1433 have their index of refraction increasing in that order.) Increased index means lower speed of light in the medium, and it causes the rays travelling at the lower index materials to bend toward the rays with the higher index.

1425, 1426 are concentrator lenses/optics, to focus the rays onto PV (1403).

With material having variable index of refraction, the varying incident light angle may be compensated by varying the index of the material throughout the day as the sun travels across the sky.

For example, LC can be used in the slabs, and by applying electric fields, the index of individual slab changes, and light bending that compensates for the incident ray angle is achieved.

The electrodes may be placed on the ends of the slabs, so not to interfere with the Sun rays along the middle of the strands. The electrodes may be connected in series, so that the same circuit may control a series of the electrodes for multiple strands. Various resistors may be placed at the connection between electrodes to achieve the appropriate voltage drop to adjust for varying index along the slab series. Or, a controller can adjust the voltage across each slab, independently.

Note that $n_{Low} < n_{High}$, in this example, for n values. (using different materials or LCs or voltages)

Figures 14A, 14B:
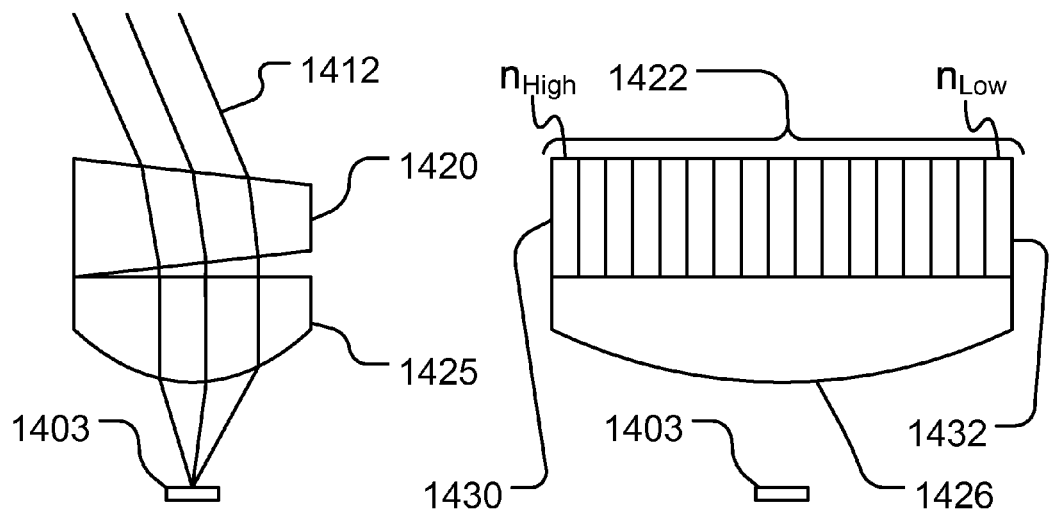
FIG. 14*a-d* shows variable n and thickness.
Figures 14C, 14D:
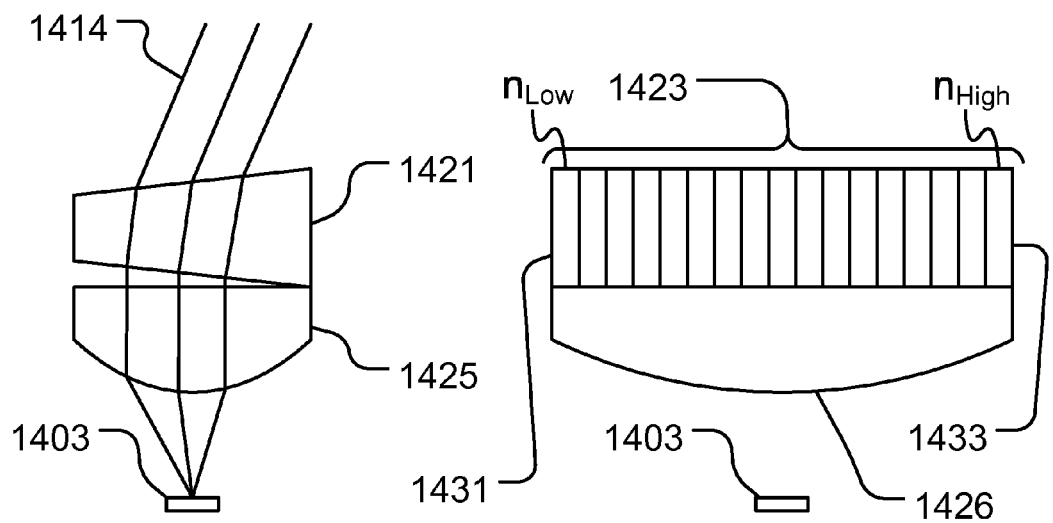

Thus, we have FIGS. 14a and 14b with similar behaviors for light bending, and similarly, FIGS. 14c and 14d with similar behaviors for light bending (as shown in FIGS. 14a and 14c). Therefore, we can bend and focus the light, accordingly.

Figure 15A:
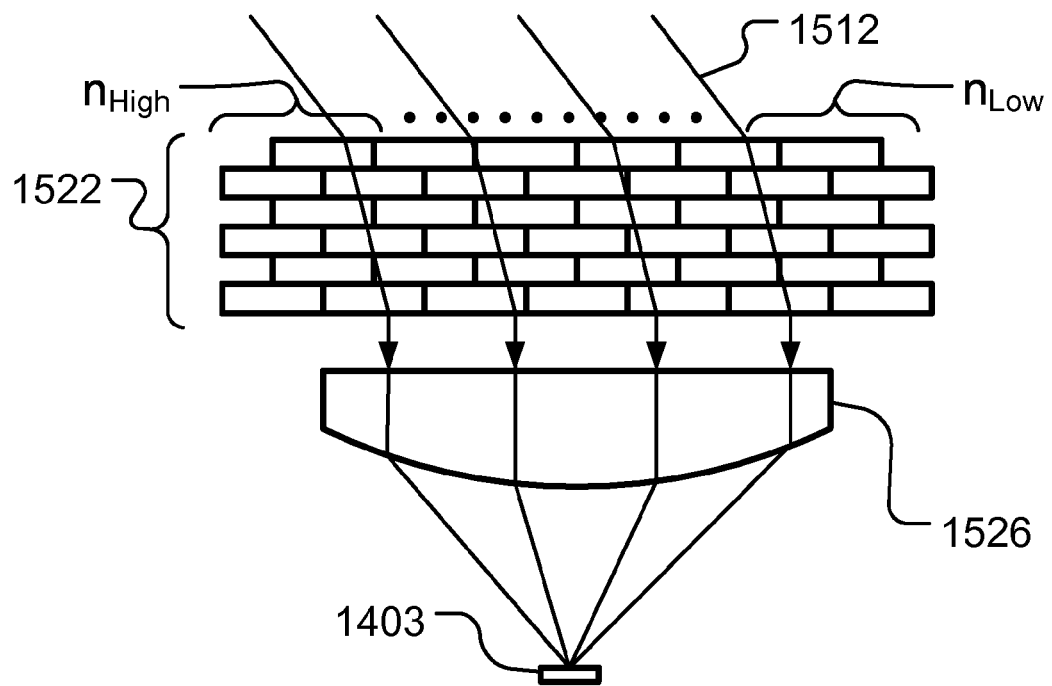
FIG. 15*a-b* shows variable n and thickness.
Figure 15B:
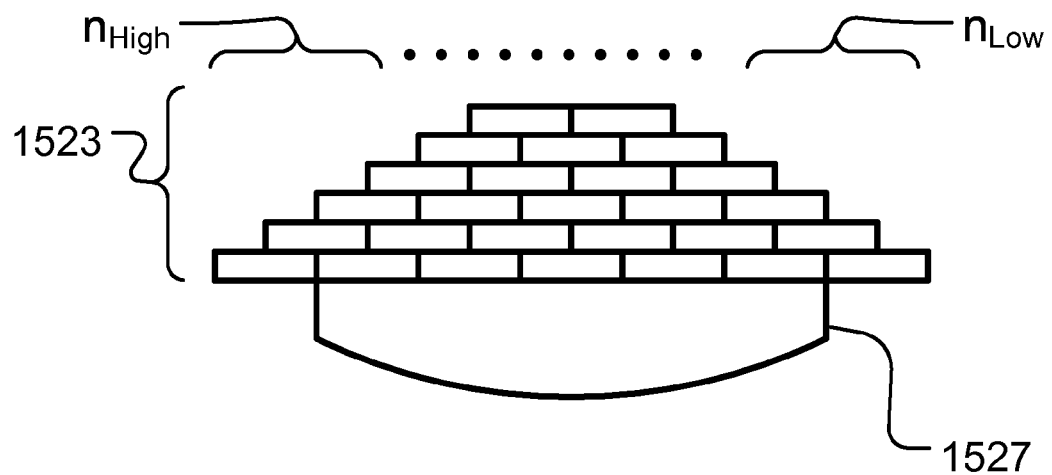

Similar concepts are shown in FIGS. 15a-b. FIG. 15a-b show embodiments of the invention, with the following components or descriptions.

- 15a: Different shapes for each "brick" (small optical piece or lens), or size of the brick. Bricks are separated by medium.
- 1512: light ray incident at an angle.
- 1522: stacked slabs with varying index, bending the right rays, similar to a prism.
- 1526: concentrator focuses the rays on a PV (1403)
- 15b: Overall structure for collection, covering bricks.
- 1523 the stackable slabs may have an overall shape to help shape and focus the light rays.

The slabs may be directly connected to the concentrator 1527, to reduce lateral shift, due to the angle of incident light rays.

FIG. 20 shows an embodiment of the invention, with the following components or descriptions. This is the general structure for a lot of the embodiments in this invention, with some layers as optional, and some layers may have multiple components, stacked on each other: The light first hits the top optics layer (2010) or plane, which may be lens or LC layer, or lens containing an LC layer. Then, there is an optional LC layer (2020), in addition to the above. Then, there is an optional bottom optics layer/plane/lens/waveguide/concentrator plus a lens/concentrator (2030), in addition to the above. Then, at the bottom, we have the cells, devices, or PV plane or rows or arrays, receiving the light/rays (2040).

Figure 26:
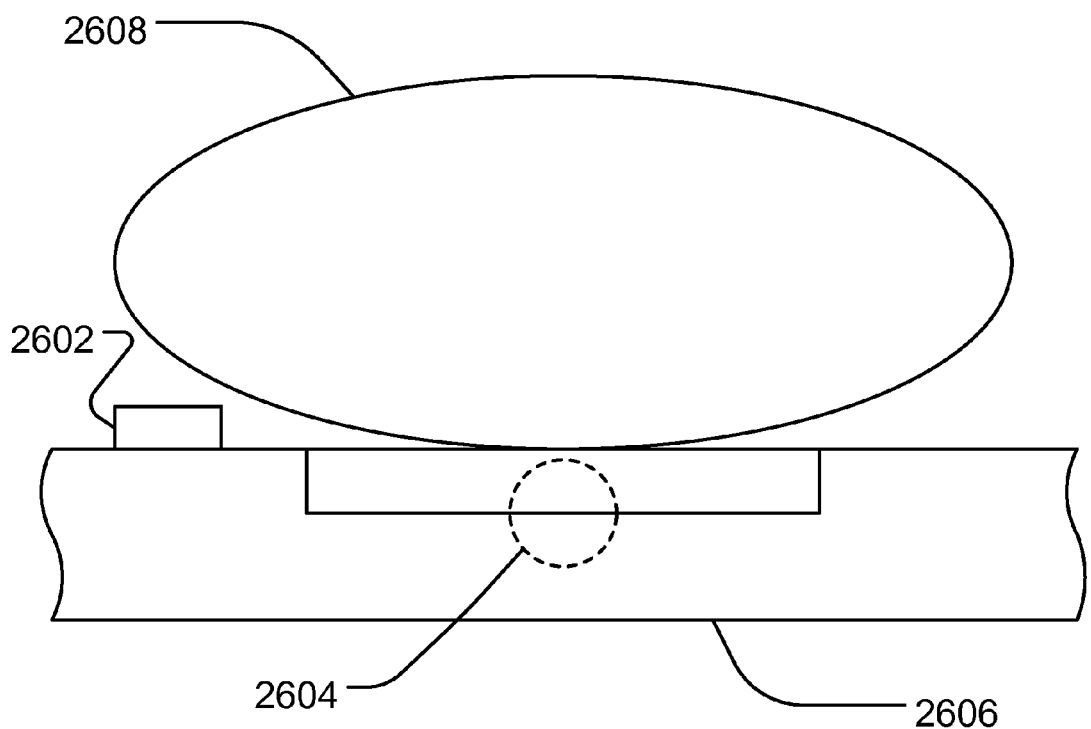
FIG. 26 shows micro-lens.

FIG. 26 shows an embodiment of the invention, with the following components or descriptions. Micro-lens 2608 on top of the PV (PN junction, 2604) concentrated the light onto the PV and increases the efficiency of the cell, by directing the incident light onto PV, which would have otherwise fallen onto the connectors (e.g., 2602), which are located on the surface of the substrate (2606). With more surface area available for conductors (e.g., 2602), the intrinsic resistance of the cell may be reduced, as well as resulting in a better heat conduction.

Figure 29A:
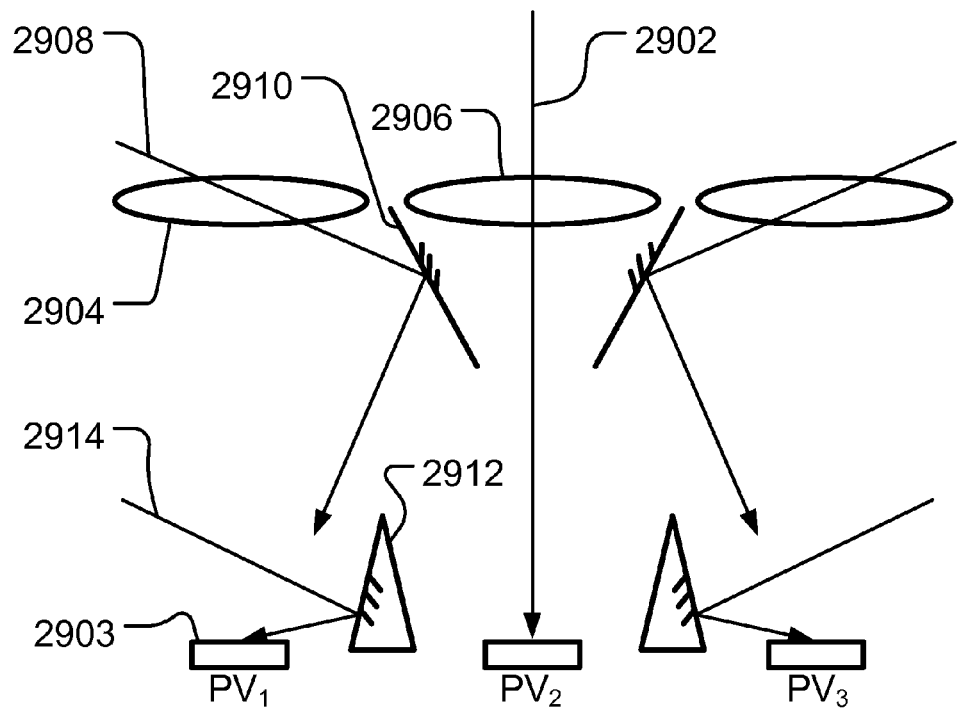
FIG. 29*a-b* shows optical setup.
Figure 29B:
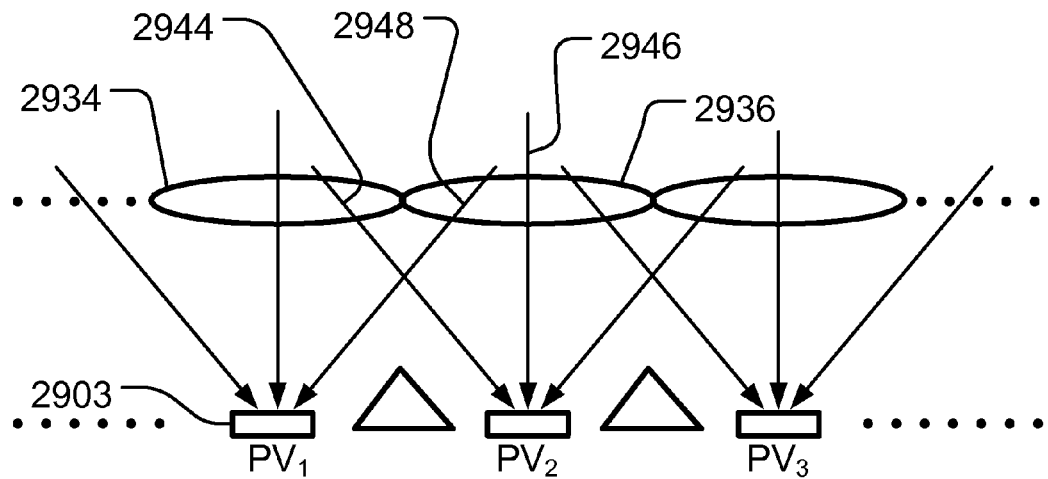

FIG. 29a-b show embodiments of the invention, with the following components or descriptions. The light passes through some lenses and reflects on some mirrors (regular, or concave, or convex), before hitting/collecting at the PV plane/devices.

FIG. 30a-b show embodiments of the invention, with the following components or descriptions. We are pumping in/out LC in/from the void in the optics plane, e.g. hollow lens. LC Reservoir is controlled by pressure generated from an evaporator (30a). Evaporator is used to pressurize the line, to push out LC into its reservoir (30b). With enough/adjusting the concentration of LC, we can adjust the n value for the optics plane/lens assembly, better focusing the light on PV plane.

Figure 35A:
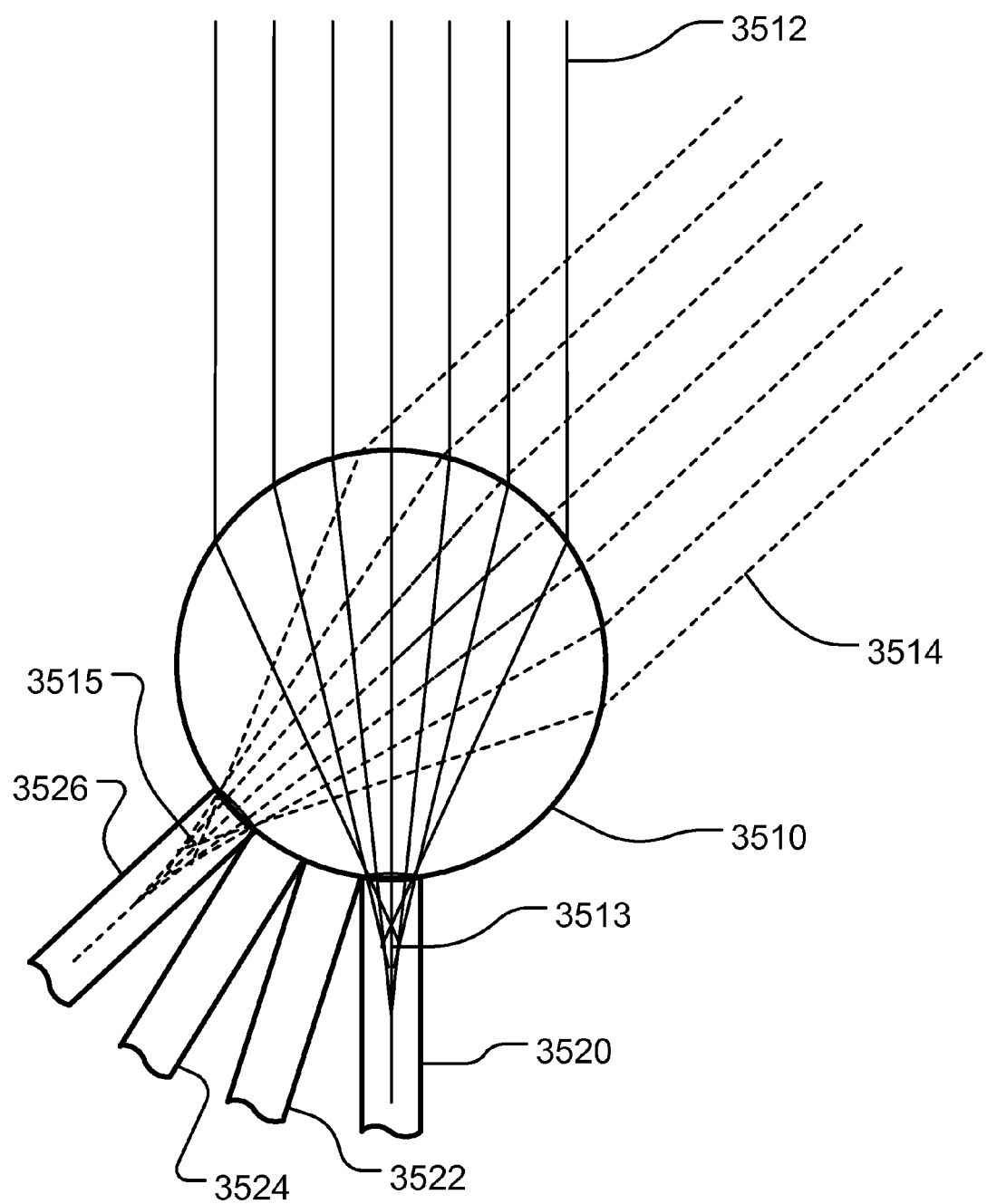
FIG. 35*a-b* shows an optical assembly.

In an embodiment of this invention, the light collection is performed at one or more cylindrical (or spherical) surfaces (3510), as for example, depicted in FIG. 35(a). For a cylindrical (or spherical) diffracting element, there is no single convergence point for incoming parallel light (e.g., 3512 or 3514), as the rays converge together at a region (not a point). Per small angle deviation approximation (about the center line), the convergence location is about (R n/(n−1)) below the diffracting surface (where n is the relative index of refraction of the refracting medium, and R is the radius of the diffracting surface). In one embodiment, this convergence location is about 2.5 to 3 times R below the incident surface (assuming n is about 1.5). In this example, the convergence region is beyond a full diameter below the incident surface. For off-center-line incident rays (i.e., rays that experience more diffraction at the surface), the convergence region appears closer to the incident surface (about 2 to 2.5 times R). In one embodiment, rays 3512 and 3514 depict incident sun rays at different angles (e.g., due to different sun elevation during the day). For example, for rays 3512 and 3514, the convergence regions are located around 3513 and 3515.

In one embodiment, the top optical diffracting element (3510) is attached to one or more light guide slabs (or rod) (e.g., 3520, 3522, 2524, and 3526) where the refracted lights are collected and guided toward the PV, at various incident angles.

Figure 35B:
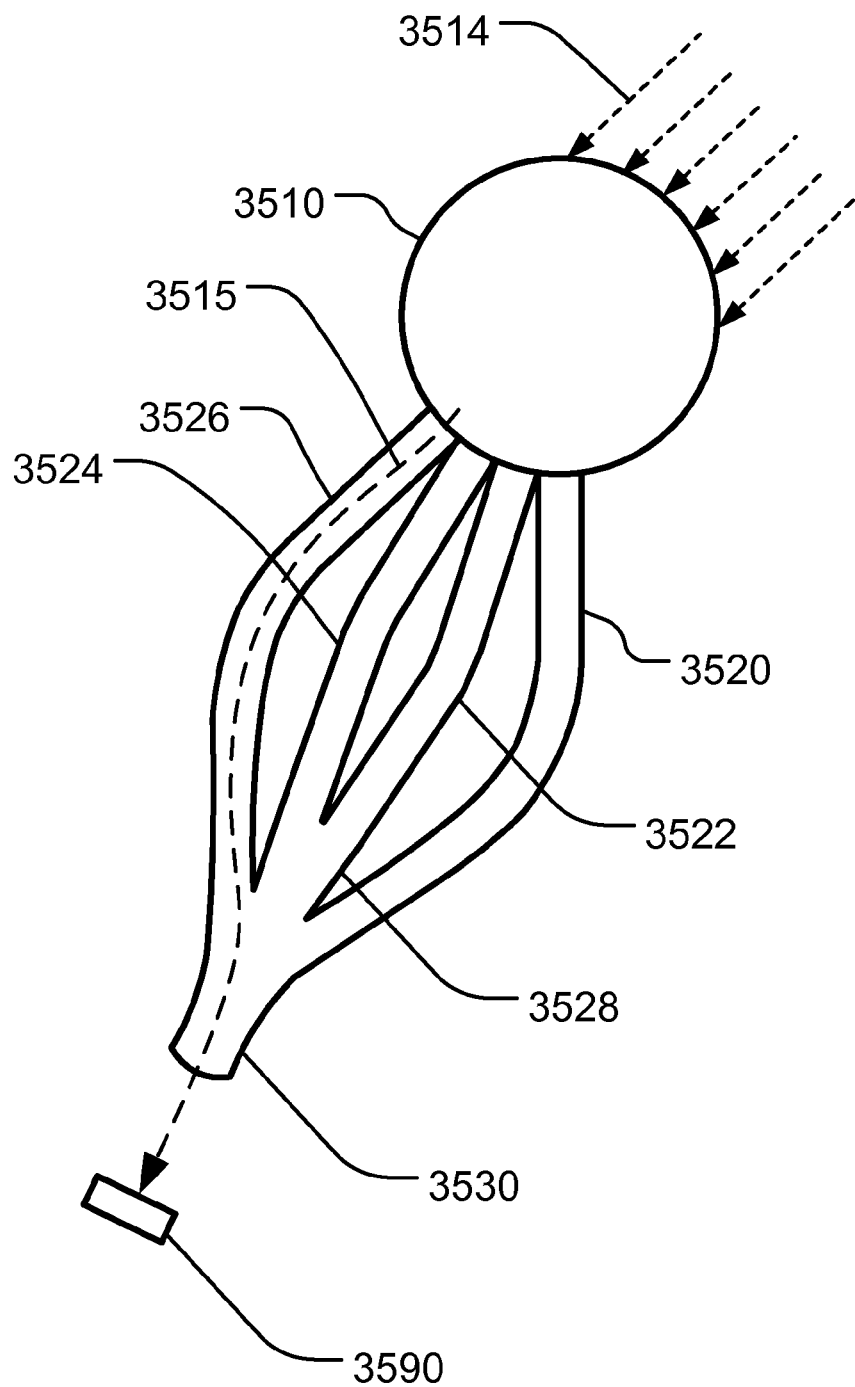

In one embodiment, as for example depicted in FIG. 35(b), the light guides merge together to bring the collected light onto the PV. For example, light guides 3522 and 3524 merge into light guide 3528, which merges with light guides 3526 and 3520 (directly or indirectly) into light guide 3530. The PV (3590) is placed at the output of 3530. The curved surface at the output of 3520 further focuses the light onto PV, in one embodiment. For example, when incident light 3514 is collected at the top optical diffracting element (3510), the diffracted light is collected at one or more light guides (e.g., 3526) which collects the diffracted lights (3515) and transmits it onto the PV (3590).

Figure 36:
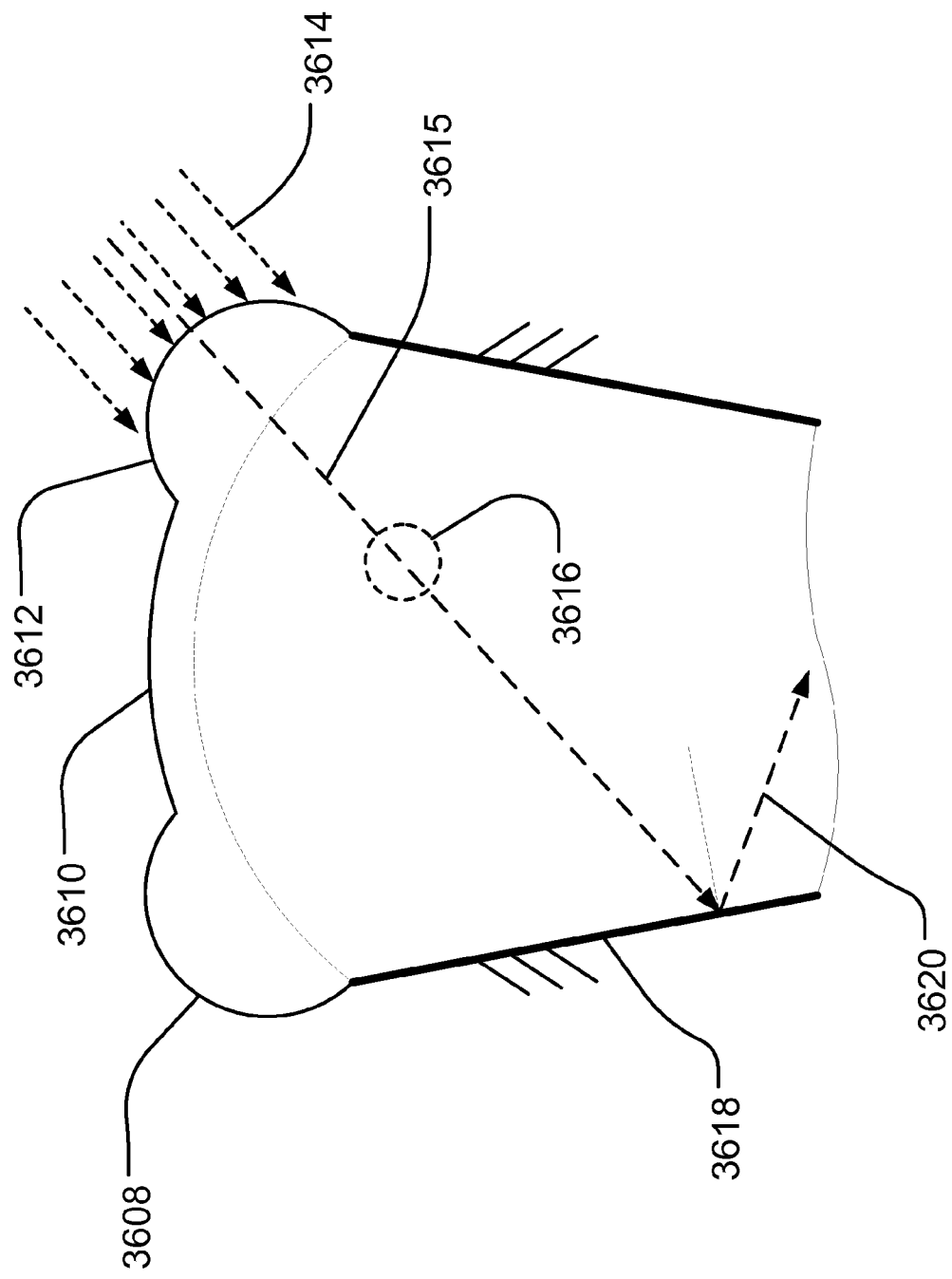
FIG. 36 shows an optical assembly.

In one embodiment, as for example depicted in FIG. 36, the top refracting optical element has one or more curved surfaces (e.g., 3608, 3610, and 3612), with the same or different curvatures.

In one embodiment, the optical surfaces (3608, 3612) at the sides of the top optical diffracting element, which are used for collecting large angle incident light, have smaller radius (larger curvature) compared to that of a middle surface (3610). In one embodiment, the incident light (e.g., 3614) roughly converges in a region (at about 3616) about (2.5 R) below the incident surface. In one embodiment, the diffracted rays are guided toward the PV. In one embodiment, the diffracted rays (e.g., 3615) make one or more reflections (e.g., 3620) at the side of the light guide (which is coated with reflecting material 3618, in one embodiment).

In one embodiment, multiple cylindrical surfaces provide multiple convergence regions corresponding to the curved surfaces and incident angles below the incident surfaces. At a given incident angle, the refracted rays are converged around the center ray (e.g., 3615, passing through the center of a given circle), and the center ray maintains the general direction of the incident rays, as it does not significantly refract upon hitting the top surface perpendicularly. One embodiment reduces the impact of variation of incident angle by bending the light off of a non-perpendicular surface or by using a reflecting surface to change direction of the incident light.

In one embodiment, the surface of the light guide is coated with a reflecting material (e.g., Aluminum) to prevent the light from escaping the waveguide, especially when the direction of the light is beyond the limit of total internal reflection.

Any embodiment described here (e.g. waveguides) can work together with any other embodiment described here, as a combination or system. This patent disclosure is intended to protect/cover all variations of the features taught here.

The invention claimed is:

1. A solar cell concentrator, said solar cell concentrator comprising:
   a plurality of monolithic transparent optical members;
   a void or chamber located inside each of said plurality of monolithic transparent optical members;
   wherein said void or chamber is completely enclosed by said each of said plurality of monolithic transparent optical members in all directions;
   wherein said each of said plurality of monolithic transparent optical members is disposed directly over a solar cell, having one solar cell corresponding to said each of said plurality of monolithic transparent optical members;
   wherein a portion of incident light or electromagnetic radiation on said solar cell concentrator goes through said each of said plurality of monolithic transparent optical members, and then goes through said void or chamber, and then goes through said each of said plurality of monolithic transparent optical members, before reaching to said solar cell wherein said void or chamber has more than one containers; wherein each of said more than one containers is attached to a separate voltage or current source; an adjustment module; wherein said adjustment module adjusts the position of said each of said plurality of monolithic transparent optical members with respect to said solar cell.

2. The solar cell concentrator as recited in claim 1, wherein said void or chamber is filled with liquid crystal.

3. The solar cell concentrator as recited in claim 1, wherein said void or chamber is filled with air.

4. The solar cell concentrator as recited in claim 1, wherein said void or chamber is filled with liquid, solid, powder, gas, mixture, gel, or fluid.

5. The solar cell concentrator as recited in claim 1, wherein said void or chamber is attached to a pump or a reservoir.

6. The solar cell concentrator as recited in claim 1, further comprising one or more reflecting surfaces or mirrors.

7. The solar cell concentrator as recited in claim 1, further comprising a mechanical device to adjust tilt or height of plane of said strand of transparent optical material.

8. The solar cell concentrator as recited in claim 1, further comprising a mechanical device to adjust tilt or height of plane of said solar cell or array of solar cells.

9. The solar cell concentrator as recited in claim 1, further comprising a mechanical device to track Sun movement in the sky.

10. The solar cell concentrator as recited in claim 1, further comprising a controller or processor to control mechanical or electrical functions or parameters.

11. The solar cell concentrator as recited in claim 1, further comprising a frame for attachment to a roof or a wall.

12. The solar cell concentrator as recited in claim 1, further comprising one or more detectors or sensors, to determine an optimum position of said solar cell concentrator.

13. The solar cell concentrator as recited in claim 1, further comprising one or more lenses.

14. The solar cell concentrator as recited in claim 1, further comprising chain, pulley, gear, railing, spring, lock, lock-and-release, motor, step motor, cable, or string.

15. The solar cell concentrator as recited in claim 1, further comprising one or more light funnels, light guides, waveguides, or fiber optics.

16. The solar cell concentrator as recited in claim 1, further comprising an array of detectors with a periodicity distance different from periodicity distance of array of solar cell concentrators.

17. The solar cell concentrator as recited in claim 1, further comprising an array of materials with graded index of refraction.

18. The solar cell concentrator as recited in claim 1, further comprising an array of materials with variable index of refraction, based on temperature, pressure, voltage, current, electric field, on magnetic field.

* * * * *